United States Patent
Kurokawa et al.

(10) Patent No.: US 9,674,470 B2
(45) Date of Patent: Jun. 6, 2017

(54) SEMICONDUCTOR DEVICE, METHOD FOR DRIVING SEMICONDUCTOR DEVICE, AND METHOD FOR DRIVING ELECTRONIC DEVICE

(71) Applicant: Semiconductor Energy Laboratory Co., Ltd., Atsugi-shi, Kanagawa-ken (JP)

(72) Inventors: Yoshiyuki Kurokawa, Kanagawa (JP); Hideki Uochi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 71 days.

(21) Appl. No.: 14/679,172

(22) Filed: Apr. 6, 2015

(65) Prior Publication Data
US 2015/0296162 A1    Oct. 15, 2015

(30) Foreign Application Priority Data

Apr. 11, 2014 (JP) ................................ 2014-082063
Apr. 30, 2014 (JP) ................................ 2014-093786
(Continued)

(51) Int. Cl.
*H01L 27/00* (2006.01)
*H04N 5/374* (2011.01)
(Continued)

(52) U.S. Cl.
CPC ....... *H04N 5/3741* (2013.01); *H01L 27/1225* (2013.01); *H01L 27/1464* (2013.01);
(Continued)

(58) Field of Classification Search
CPC ......... H01L 27/14609; H01L 27/14612; H01L 27/14625; H04N 5/374; H04N 5/378
(Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP  1737044 A  12/2006
EP  2226847 A   9/2010
(Continued)

OTHER PUBLICATIONS

International Search Report (Application No. PCT/IB2015/052530) Dated Jul. 21, 2015.
(Continued)

*Primary Examiner* — Kevin Pyo
(74) *Attorney, Agent, or Firm* — Fish & Richardson P.C.

(57) ABSTRACT

To provide a solid-state imaging device with short image-capturing duration. A first photodiode in a pixel in an n-th row and an m-th column is connected to a second photodiode in a pixel in an (n+1)-th row and the m-th column through a transistor. The first photodiode and the second photodiode receive light concurrently, the potential in accordance with the amount of received light is held in a pixel in the n-th row and the m-th column, and the potential in accordance with the amount of received light is held in a pixel in the (n+1)-th row and the m-th column without performing a reset operation. Then, each potential is read out. Under a large amount of light, either the first photodiode or the second photodiode is used.

14 Claims, 67 Drawing Sheets

US 9,674,470 B2

Page 2

(30) Foreign Application Priority Data

May 15, 2014 (JP) .................................. 2014-101672
Sep. 5, 2014 (JP) .................................. 2014-181468
Oct. 16, 2014 (JP) .................................. 2014-211511
Jan. 23, 2015 (JP) .................................. 2015-010893

(51) Int. Cl.
*H01L 29/786* (2006.01)
*H01L 27/146* (2006.01)
*H01L 31/105* (2006.01)
*H01L 27/12* (2006.01)

(52) U.S. Cl.
CPC .. *H01L 27/14632* (2013.01); *H01L 27/14641* (2013.01); *H01L 27/14643* (2013.01); *H01L 27/14645* (2013.01); *H01L 27/14687* (2013.01); *H01L 29/7869* (2013.01); *H01L 31/105* (2013.01); *H01L 27/14621* (2013.01)

(58) Field of Classification Search
USPC ........... 250/208.1, 214 R, 214 SW; 348/294, 348/300, 308
See application file for complete search history.

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,378,391 B2 * | 2/2013 | Koyama ............. H01L 27/1225 257/223 |
| 8,502,772 B2 | 8/2013 | Kozuma et al. |
| 8,633,051 B2 | 1/2014 | Kurokawa et al. |
| 8,872,120 B2 | 10/2014 | Kurokawa et al. |
| 8,928,053 B2 | 1/2015 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0108706 A1 | 5/2011 | Koyama |
| 2011/0215323 A1 | 9/2011 | Kurokawa et al. |
| 2013/0015326 A1 | 1/2013 | Tamura |
| 2014/0056405 A1 | 2/2014 | Kurokawa et al. |
| 2014/0340363 A1 | 11/2014 | Ikeda et al. |
| 2015/0002635 A1 | 1/2015 | Kawai et al. |
| 2015/0060675 A1 | 3/2015 | Akimoto et al. |

FOREIGN PATENT DOCUMENTS

| | | |
|---|---|---|
| EP | 2833624 A | 2/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-141717 A | 6/2009 |
| JP | 2011-211699 A | 10/2011 |
| JP | 2013-042481 A | 2/2013 |
| WO | WO-2004/114391 | 12/2004 |
| WO | WO-2013/011844 | 1/2013 |
| WO | WO-2013/145888 | 10/2013 |

OTHER PUBLICATIONS

Written Opinion (Application No. PCT/IB2015/052530) Dated Jul. 21, 2015.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUs on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Furuta.M et al., "A High-Speed, High-Sensitivity Digital CMOS Image Sensor With a Global Shutter and 12-bit Column-Parallel Cyclic A/D Converters", IEEE Journal of Solid-State Circuits, Apr. 1, 2007, vol. 42, No. 4, pp. 766-774.

\* cited by examiner

FIG. 30A1
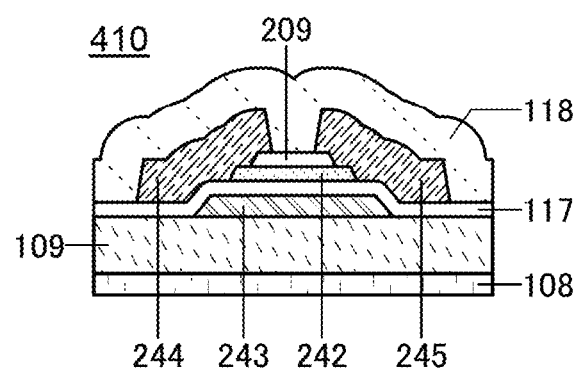
FIG. 30A2
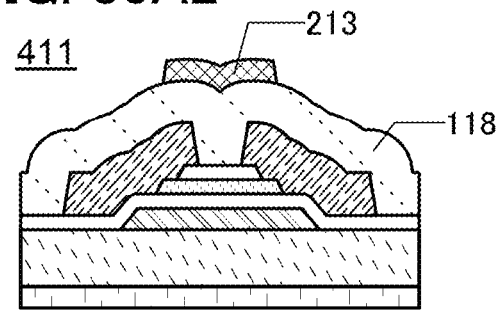
FIG. 30B1
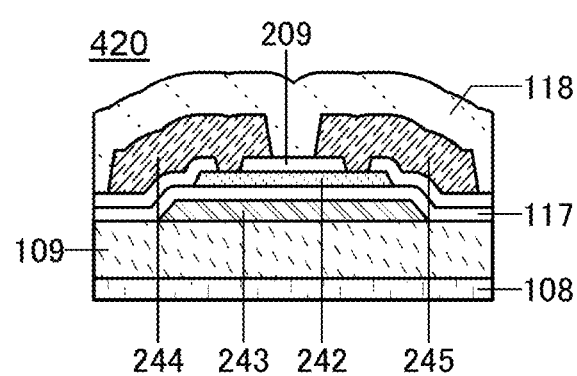
FIG. 30B2
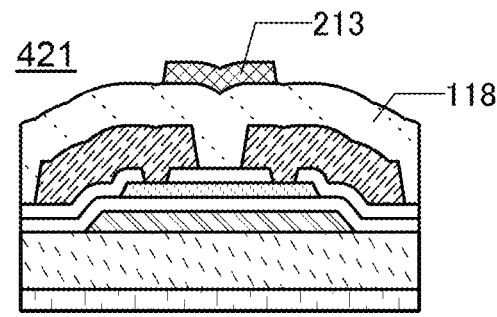

FIG. 31A1
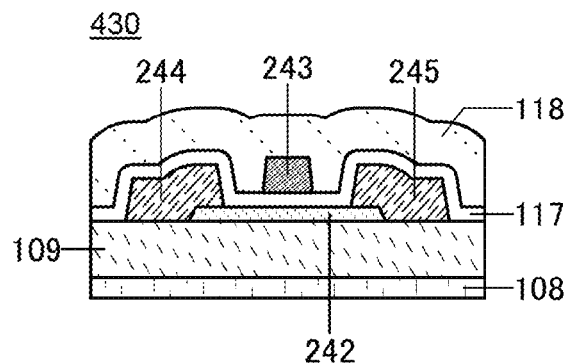
FIG. 31A2
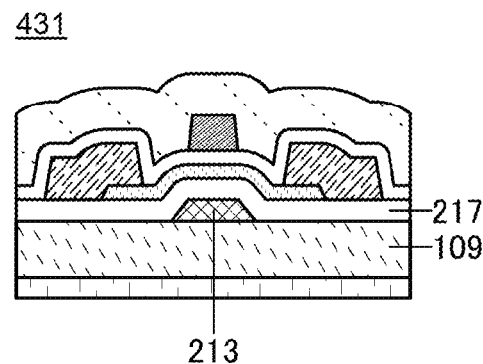
FIG. 31A3
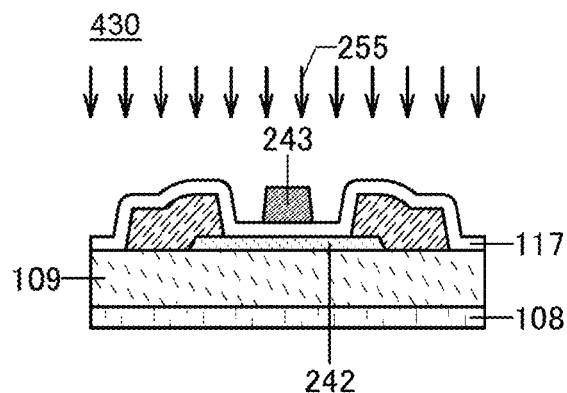
FIG. 31B1
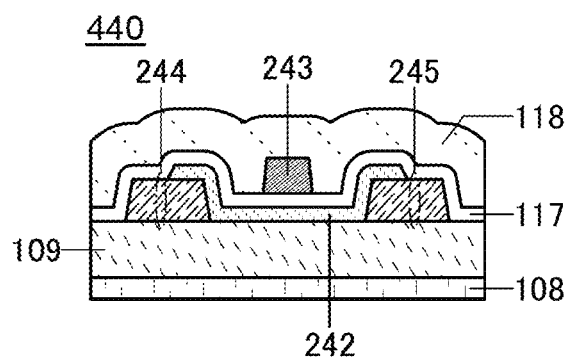
FIG. 31B2
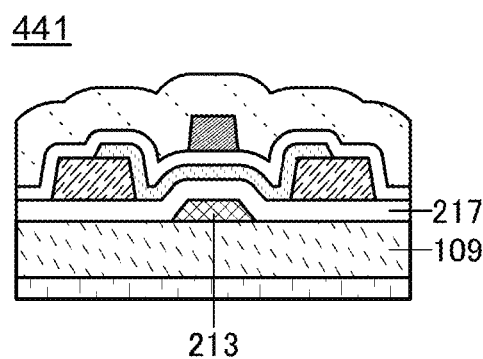

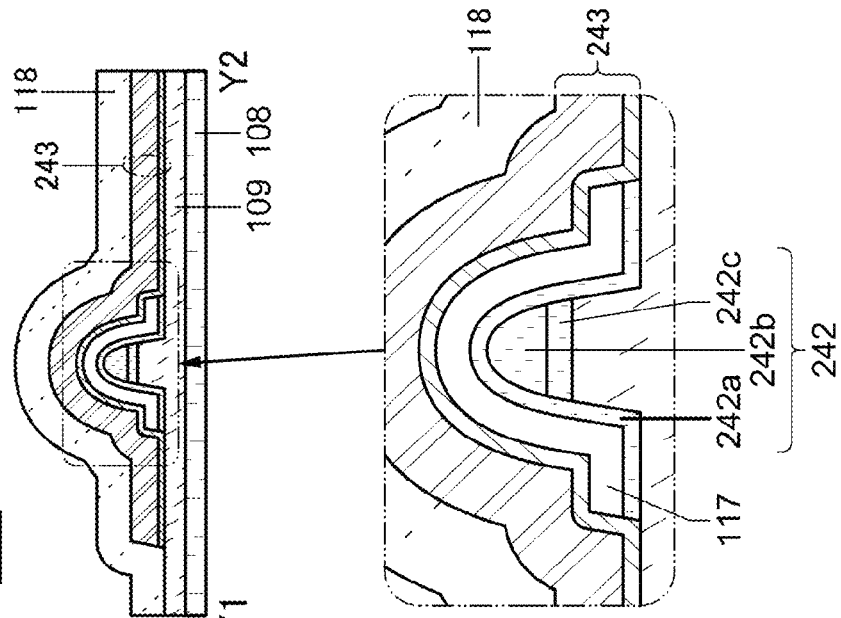
FIG. 32C
450
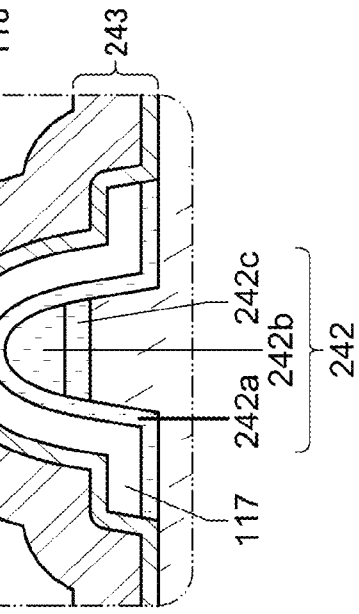
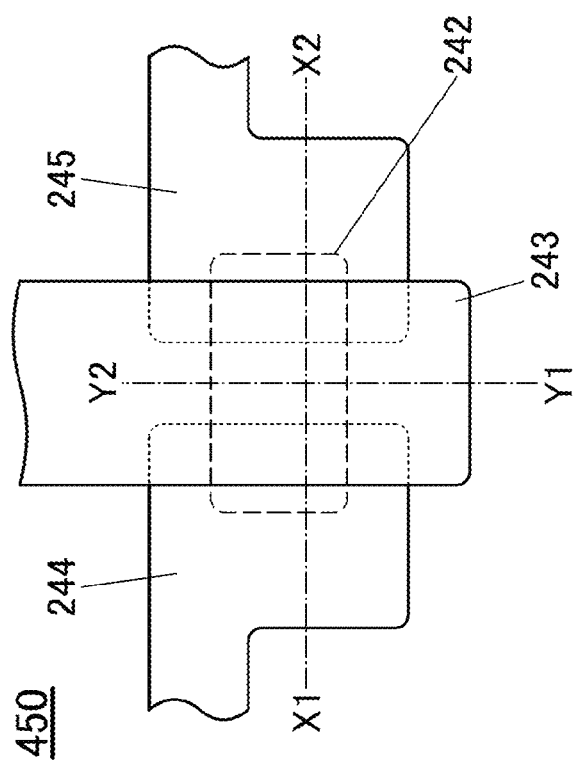
FIG. 32A
450
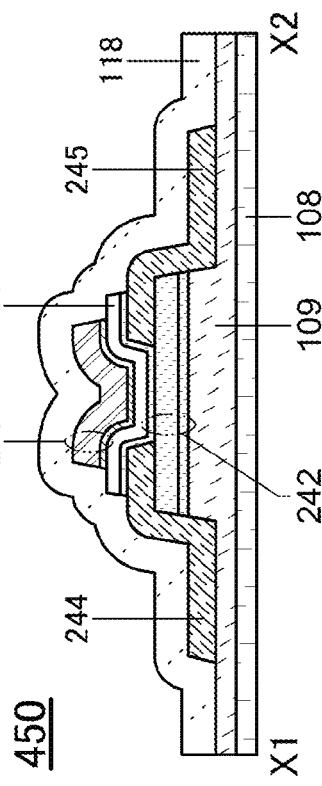
FIG. 32B
450

| Technology Size | CMOS | Hybrid CMOS |
|---|---|---|
| CAAC-IGZO FET | 0.80 μm | 0.35 μm |
| Nch-Si FET / Pch-Si FET | 0.80 μm | 0.18 μm |
| Die | CMOS | Hybrid CMOS |
| Size | 10.0 mm × 9.0 mm | 6.5 mm × 6.0 mm |
| Pixel | CMOS | Hybrid CMOS |
| Resolution | 200 × 150 | 240 × 160 |
| Size (1 pixel) | 40 μm × 40 μm | 20 μm × 20 μm |
| Fill Factor | 15% | 31 % |
| Exposure Division Number | 2 | 2 |
| A/D Converter | CMOS | Hybrid CMOS |
| Type | Single Slope Integrating | Single Slope Integrating |
| Resolution | 8bit | 8bit |
| Voltage | 3.3 V | 1.8 V |
| Frequency (ACK) | 528 kHz | 3.53 MHz |
| Row Driver | CMOS | Hybrid CMOS |
| Voltage | 3.3 V | 3.3 V |
| Frequency (RCK) | 2.40 kHz | 5.52 kHz |
| Column Driver | CMOS | Hybrid CMOS |
| Voltage | 3.3 V | 3.3 V / 1.8 V |
| Frequency (CCK) | 528 kHz | 1.44 MHz |

FIG. 46

| Technology Size | | |
|---|---|---|
| | CAAC-IGZO FET | 0.35 μm |
| | Pch-Si FET | 0.18 μm |
| Die | | |
| | Size | 6.5 mm × 6.0 mm |
| Pixel | | |
| | Capturing Method | Continuous Capturing Sharing / Continuous Capturing non-Sharing / Normal Capturing |
| | Resolution — Continuous Capturing | 240 × 80 monochrome |
| | Resolution — Normal Capturing | 240 × 160 monochrome |
| | Size (Sub-Pixel) | 20 μm × 20 μm |
| | Fill Factor | 31% |
| | Number of Sub Pixels per Pixel (n) | 2 |
| | Sensitivity — Continuous Capturing Sharing | 0.224 V/(lx·s) |
| | Sensitivity — Continuous Capturing non-Sharing | 0.196 V/(lx·s) |
| A/D Converter | | |
| | Type | Single slope |
| | Resolution | 8bit |
| | Voltage | 1.8 V |
| | Frequency (PLLCLK) | 1.77 MHz |
| Row Driver | | |
| | Voltage | 3.3 V |
| | Frequency (RCK) | 2.76 kHz |
| Column Driver | | |
| | Voltage | 3.3 V / 1.8 V |
| | Frequency (CCK) | 718 kHz |

FIG. 48

| | A | B | C |
|---|---|---|---|
| | continuous | TX1 | TX2 |
| | sharing | sharing | sharing |
| TX1 | | | |
| TX2 | | | |

| | D | E | F | G |
|---|---|---|---|---|
| | continuous | TX1 | TX2 | normal |
| | non-sharing | non-sharing | non-sharing | non-sharing |
| TX1 | | | | |
| TX2 | | | | |

FIG. 52

|  | Compared frame number ||||| 
|---|---|---|---|---|---|
|  | #1 / #2 | #2 / #3 | #3 / #4 | #4 / #5 | #5 / #1 |
| Method A TX1 | 6.35 | 6.12 | 5.42 | 5.19 | 5.46 |
| Method A TX2 | 6.71 | 6.35 | 5.50 | 6.97 | 5.99 |
| Method B TX1 | 7.20 | 6.81 | 6.98 | 6.31 | 8.35 |
| Method C TX2 | 5.76 | 8.08 | 5.79 | 7.32 | 7.75 |
| Method D TX1 | 3.04 | 2.89 | 3.25 | 3.55 | 3.03 |
| Method D TX2 | 3.70 | 3.45 | 3.74 | 3.47 | 3.22 |
| Method E TX1 | 3.68 | 3.20 | 3.29 | 2.75 | 3.42 |
| Method F TX2 | 3.89 | 3.43 | 3.72 | 3.34 | 3.33 |
| Method G TX1 | 3.84 | 3.80 | 3.81 | 4.86 | 4.36 |
| Method G TX2 | 3.46 | 3.75 | 3.95 | 3.84 | 2.93 |

FIG. 54A

| Block | Power [μW] |
|---|---|
| Comparator | 346.40 |
| Counter | 319.68 |
| Buffer | 81.36 |
| Column driver | 54.78 |
| Row driver | 0.09 |
| Pixels | 6.27 |
| Total | 808.57 |

FIG. 54B

1: conventional solid-state imaging device
2: solid-state imaging device 810

| | 1 | 2 |
|---|---|---|
| Image Resolution | 514 × 530 | 240 × 80 |
| A/D Converter resolution | 12 bit | 8 bit |
| frame rate | 3500 fps | 3333 fps |
| power | 1 W | 808.57 μW |
| FOM | 87.40 pW/(pixel· fps· bit) | 1.58 pW/(pixel· fps· bit) |

FIG. 56

| Technology Size (Channel length) | |
|---|---|
| CAAC-IGZO FET | 0.35 μm |
| Pch-Si FET | 0.18 μm |
| Die | |
| Size | 6.5 mm × 6.0 mm |
| Pixel | |
| Resolution | 240 × 160 |
| Size (1 Pixel) | 20 μm × 20 μm |
| Fill Factor | 30% |
| A/D Converter | |
| Type | Single slope Integrating |
| Resolution | 8bit |
| Voltage | 1.8 V |
| Frequency (ACK) | 3.53 MHz |
| Row Driver | |
| Voltage | 3.3 V |
| Frequency (RCK) | 5.52 kHz |
| Column Driver | |
| Voltage | 3.3 V / 1.8 V |
| Frequency (CCK) | 1.44 kHz |

FIG. 57A1 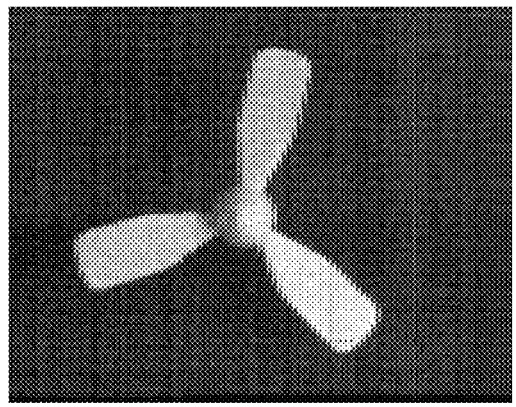
FIG. 57A2 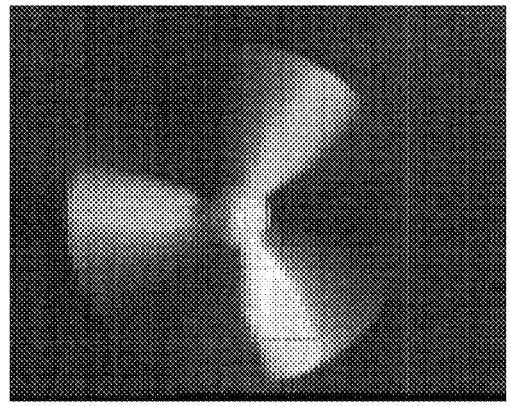
FIG. 57B1 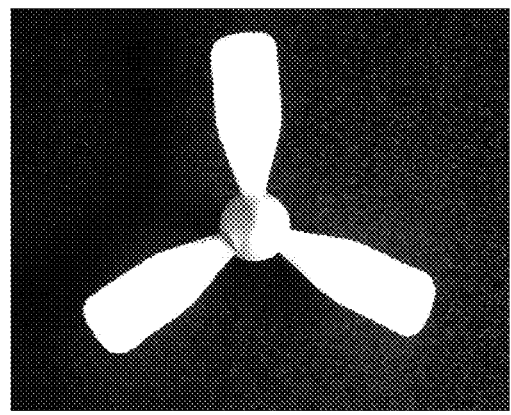
FIG. 57B2 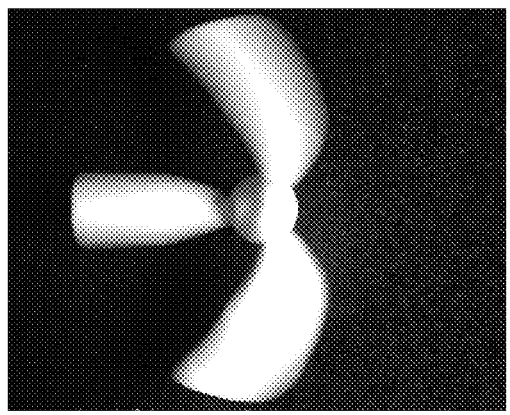

FIG. 60

| Technology Size | | |
|---|---|---|
| CAAC-IGZO FET | | 0.35 μm |
| Si FET | | 0.18 μm |
| Die | | |
| Size | | 6.5 mm × 6.0 mm |
| Pixel | | |
| Resolution | | 240 × 80 monochrome |
| Size (Subpixel) | | 20 μm × 20 μm |
| Fill Factor | | 31% |
| A/D Converter | | |
| Type | | Single slope |
| Resolution | | 8 bit |
| Voltage (Comparator/Counter) | 1 fps | 2.5 V/1.8 V |
| | 60 fps | 3.3 V/1.8 V |
| Bias | 1 fps | −0.8 V |
| | 60 fps | −0.07 V |
| Frequency (PLLCLK) | 1 fps | 29.5 kHz |
| | 60 fps | 1.77 MHz |
| Row Driver | | |
| Voltage | 1 fps | 2.5 V |
| | 60 fps | 3.3 V |
| Frequency (RCK) | 1 fps | 46.0 Hz |
| | 60 fps | 2.76 kHz |
| Column Driver | | |
| Voltage | 1 fps | 2.5 V |
| | 60 fps | 3.3 V |
| Frequency (CCK) | 1 fps | 12.0 kHz |
| | 60 fps | 718 kHz |

\* Low voltage of the comparator is −1.0 V, that of the others are 0.0 V.

|  |  | 1st cond. | 2nd cond. | 3rd cond. |
|---|---|---|---|---|
| Voltage | A/D Converter | 3.3 V/1.8 V | 3.3 V/1.8 V | 2.5 V/1.8 V |
|  | Row Driver | 3.3 V | 3.3 V | 2.5 V |
|  | Column Driver | 3.3 V/1.8 V | 3.3 V/1.8 V | 2.5 V/1.8 V |
| Frequency | A/D Converter | 1.77 MHz | 29.5 kHz | 29.5 kHz |
|  | Row Driver | 2.76 kHz | 46.0 Hz | 46.0 Hz |
|  | Column Driver | 718 kHz | 12.0 kHz | 12.0 kHz |

Frame Rate: 60 fps / 1 fps / 1 fps

SEMICONDUCTOR DEVICE, METHOD FOR DRIVING SEMICONDUCTOR DEVICE, AND METHOD FOR DRIVING ELECTRONIC DEVICE

TECHNICAL FIELD

One embodiment of the present invention relates to a semiconductor device and a driving method thereof. Specifically, the present invention relates to a solid-state imaging device including a plurality of pixels provided with photosensors and to a method for driving the solid-state imaging device. Further, the present invention relates to an electronic device including the solid-state imaging device.

Note that one embodiment of the present invention is not limited to the above technical field. For example, one embodiment of the present invention relates to an object, a method, or a manufacturing method. The present invention relates to a process, a machine, manufacture, or a composition of matter. For example, one embodiment of the present invention relates to a memory device, a processor, a driving method thereof, or a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, a solid-state imaging device, an electronic device, and the like may include a semiconductor element or a semiconductor circuit. Therefore, a display device, a light-emitting device, a lighting device, an electro-optical device, a solid-state imaging device, an electronic device, and the like include a semiconductor device in some cases.

BACKGROUND ART

A photosensor utilizing an amplifying function of a MOS transistor, called a CMOS sensor, can be manufactured by a general CMOS process. Thus, manufacturing cost of a solid-state imaging device including a CMOS sensor in each pixel can be low, and a semiconductor device having a photosensor and a display element formed over one substrate can be realized. In addition, a CMOS sensor requires lower driving voltage than a CCD sensor and thus leads to low power consumption of a solid-state imaging device.

A solid-state imaging device including a CMOS sensor generally employs, for imaging, a rolling shutter method in which an operation to accumulate charge in a photodiode and an operation to read the charge are sequentially performed row by row (see Patent Document 1). In some cases, such a solid-state imaging device employs a global shutter method in which all the pixels are subjected to an operation to accumulate charge at a time, instead of the rolling shutter method (see Non-Patent Document 1).

REFERENCE

Patent Document

[Patent Document 1] Japanese Published Patent Application No. 2009-141717

Non-Patent Document

[Non-Patent Document 1] M. Furuta et al, "A High-Speed, High-Sensitivity Digital CMOS Image Sensor With a Global Shutter and 12-bit Column-Parallel Cyclic A/D Converters", IEEE Journal of Solid-State Circuits, April 2007, Vol. 42, No. 4, pp. 766-774

Disclosure of Invention

When using either the rolling shutter method or global shutter method, a solid-state imaging device including a CMOS sensor requires improved dynamic range to perform image capturing in various environments or a reduction in duration of image capturing in continuous shooting.

For example, in imaging under an environment where the illuminance of external light is low (during the night or in a dark room), light entering a photodiode is weak (the amount of the light is small); therefore, exposure time needs to be extended. Moreover, during the exposure time, data of a distorted image of an object is generated when the object moves or the solid-state imaging device is moved. Thus, extended exposure time may lead to generation of data of a distorted image of the object.

As the size of the solid-state imaging device is reduced, a region of the photodiode which is irradiated with light is reduced, which further precludes imaging under an environment where the illuminance of external light is low.

When images of an object moving at high speed are taken in succession, the duration of image capturing is needed to be shortened.

Low power consumption is one of the important performances for evaluation of the performance of a solid-state imaging device. In particular, in a portable electronic device such as a mobile phone, high power consumption of a solid-state imaging device leads to a disadvantage of short continuous operation time.

An object of one embodiment of the present invention is to provide a solid-state imaging device that enables improvement in dynamic range, or the like. Another object of one embodiment of the present invention is to provide a solid-state imaging device that enables improvement in the quality of a captured image, or the like. Another object of one embodiment of the present invention is to provide a solid-state imaging device with a short duration of image capturing, or the like. Another object of one embodiment of the present invention is to provide a low-power-consumption solid-state imaging device, or the like. Another object of one embodiment of the present invention is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Means for Solving the Problems

One embodiment of the present invention is a method for driving a semiconductor device including a first circuit, a second circuit, and a sixth transistor, which includes a first step, a second step, a third step, and a fourth step. The first circuit includes a first photoelectric conversion element, a first transistor, a second transistor, and a third transistor. The second circuit includes a second photoelectric conversion element, a fourth transistor, and a fifth transistor. The first photoelectric conversion element is electrically connected to one of a source and a drain of the first transistor. The other of the source and the drain of the first transistor is electrically connected to one of a source and a drain of the second transistor. The other of the source and the drain of the second transistor is electrically connected to a first node. A gate of the third transistor is electrically connected to the first node. The second photoelectric conversion element is electrically connected to one of a source and a drain of the fourth transistor. The other of the source and the drain of the fourth transistor is electrically connected to a second node. The gate of the fifth transistor is electrically connected to the second node. One of a source and a drain of the sixth transistor is electrically connected to the one of the source and the drain of the second transistor. The other of the source and the drain of the sixth transistor is electrically connected to the one of the source and the drain of the fourth transistor. In the first step, the first transistor and the fourth transistor are each in an off state. In the first step, the second transistor and the sixth transistor are each in an on state. In the first step, a first potential corresponding to the amount of light received by the second photoelectric conversion element is written to the first node. In the second step, the first transistor and the second transistor are each in an off state. In the second step, the fourth transistor and the sixth transistor are each in an on state. In the second step, a second potential corresponding to the amount of light received by the second photoelectric conversion element is written to the second node. In the third step, data corresponding to the first potential is read out through the third transistor. In the fourth step, data corresponding to the second potential is read out through the fifth transistor. The third step and the fourth step are conducted after completion of the first step and the second step.

It is preferable that a transistor including an oxide semiconductor be used as the first transistor. It is preferable that a transistor including an oxide semiconductor be used for each of the second transistor and the fourth transistor. It is preferable that a transistor including an oxide semiconductor be used as the sixth transistor.

For each of the first photoelectric conversion element and the second photoelectric conversion element, a photoelectric conversion element with a pin junction can be used.

According to one embodiment of the present invention, a solid-state imaging device with improved dynamic range, or the like can be provided. Alternatively, a solid-state imaging device with which quality of taken image is improved, or the like can be provided. Alternatively, a solid-state imaging device with short duration of image capturing, or the like can be provided. Alternatively, a solid-state imaging device with low power consumption can be provided. Alternatively, a novel semiconductor device or the like can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 30A1 and 30A2 and 30B1 and 30B2 each illustrate one embodiment of a transistor.

FIGS. 31A1, 31A2, and 31A3 and 31B1 and 31B2 each illustrate one embodiment of a transistor.

FIGS. 32A to 32C illustrate one embodiment of a transistor.

FIG. 36 shows an usage of a solid-state image sensor according to examples.

FIG. 46 shows specifications of a solid-state imaging device.

FIG. 48 shows images captured with a solid-state imaging device.

FIG. 52 shows standard deviations of a difference in gray scale between two frames in five frames, obtained by capturing methods.

FIGS. 54A and 54B show measurement results of power consumption.

FIG. 56 shows specifications of a solid-state imaging device.

FIGS. 57A1 and 57A2, and 57B1 and 57B2 are photographs captured with a solid-state imaging device.

FIG. 60 shows specifications of a solid-state imaging device.

BEST MODE FOR CARRYING OUT THE INVENTION

Figure 1A:
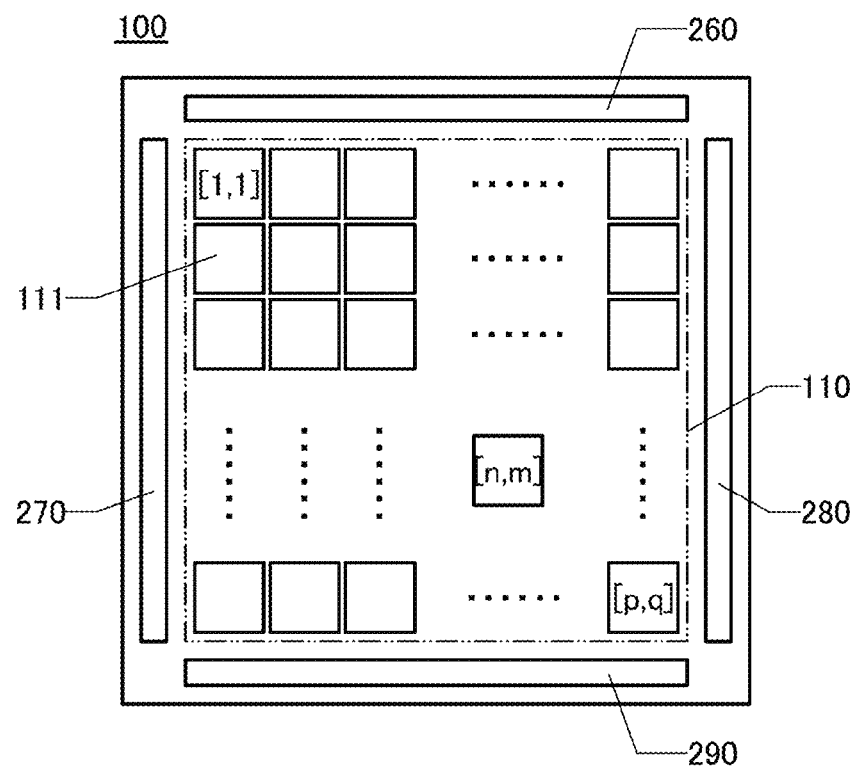
FIGS. 1A and 1B each illustrate a structure example of a solid-state imaging device according to one embodiment of the present invention.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments and the examples. Note that in all drawings used to illustrate the embodiments, portions that are identical or portion having similar functions are denoted by the same reference numerals, and their repetitive description may be omitted.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up de-de converter, or a step-down de-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, when a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of the material for an attachment film include vinyl such as polyvinyl fluoride or vinyl chloride, polypropylene and polyester. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with use of such a transistor, power consumption of the circuit can be reduced or the circuit can be highly integrated.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability can be formed, heat resistance can be provided, or reduction in weight or thickness can be achieved.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding. There is a case where an illustration of a hidden line or the like is partly omitted.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of the source and the drain might be switched depending on operation conditions, e.g., when a transistor having a different polarity is employed or a direction of current flow is changed in circuit operation. Therefore, it is difficult to define which is the source (or the drain). Thus, the terms "source" and "drain" can be switched in this specification.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly also includes the case where the angle is greater than or equal to 85° and less than or equal to 95°.

A voltage usually refers to a potential difference between a given potential and a reference potential (e.g., a source potential or a ground potential (a GND potential)). A voltage can be referred to as a potential and vice versa.

Note that a "semiconductor" includes characteristics of an "insulator" in some cases when the conductivity is sufficiently low, for example. Thus, a "semiconductor" and an "insulator" can be replaced with each other. Furthermore, a "semiconductor" and an "insulator" cannot be strictly distinguished from each other because a border between the "semiconductor" and the "insulator" is not clear. Accordingly, a "semiconductor" in this specification can be replaced with an "insulator" in some cases.

Further, a "semiconductor" includes characteristics of a "conductor" in some cases when the conductivity is sufficiently high, for example. Thus, a "semiconductor" and a "conductor" can be replaced with each other. Furthermore, a "semiconductor" and a "conductor" cannot be strictly distinguished from each other because a border between the "semiconductor" and the "conductor" is not clear. Accordingly, a "semiconductor" in this specification can be replaced with a "conductor" in some cases.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is a silicon film, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The high power supply potential $V_{DD}$ (hereinafter also simply referred to as $V_{DD}$ or H potential) is a power supply potential higher than the low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Embodiment 1

In this embodiment, an imaging device of one embodiment of the present invention will be described with reference to drawings.

[Structure Example of Imaging Device 100]

FIG. 1A is a plan view illustrating a structure example of an imaging device 100 of one embodiment of the present invention. The imaging device 100 includes a pixel portion 110, and peripheral circuits (a first peripheral circuit 260, a second peripheral circuit 270, a third peripheral circuit 280, and a fourth peripheral circuit 290) for driving the pixel portion 110. The pixel portion 110 includes a plurality of pixels 111 arranged in matrix with p rows and q columns (p and q are each a natural number greater than or equal to 2). The first peripheral circuit 260 to the fourth peripheral circuit 290 are connected to the plurality of pixels 111 and each have a function of supplying a signal for driving the plurality of pixels 111. In this specification and the like, the first peripheral circuit 260 to the fourth peripheral circuit 290 and the like are referred to as "peripheral circuit" or "driving circuit" in some cases. For example, the first peripheral circuit 260 can be regarded as part of the peripheral circuit.

The peripheral circuit includes at least one of a logic circuit, a switch, a buffer, an amplifier circuit, and a converter circuit. The peripheral circuit may be formed over a substrate over which the pixel portion 110 is formed. Alternatively, part or whole of the peripheral circuit may be mounted with a semiconductor device such as an IC. Note that in the peripheral circuit, at least one of the first peripheral circuit 260 to the fourth peripheral circuit 290 may be omitted. For example, when one of the first peripheral circuit 260 and the fourth peripheral circuit 290 additionally has a function of the other of the first peripheral circuit 260 and the fourth peripheral circuit 290, the other of the first peripheral circuit 260 and the fourth peripheral circuit 290 may be omitted. For another example, when one of the second peripheral circuit 270 and the third peripheral circuit 280 additionally has a function of the other of the second peripheral circuit 270 and the third peripheral circuit 280, the other of the second peripheral circuit 270 and the third peripheral circuit 280 may be omitted. For another example, when one of the first peripheral circuit 260 to the fourth peripheral circuit 290 additionally has functions of the other circuits, the other circuits may be omitted.

Figure 1B:
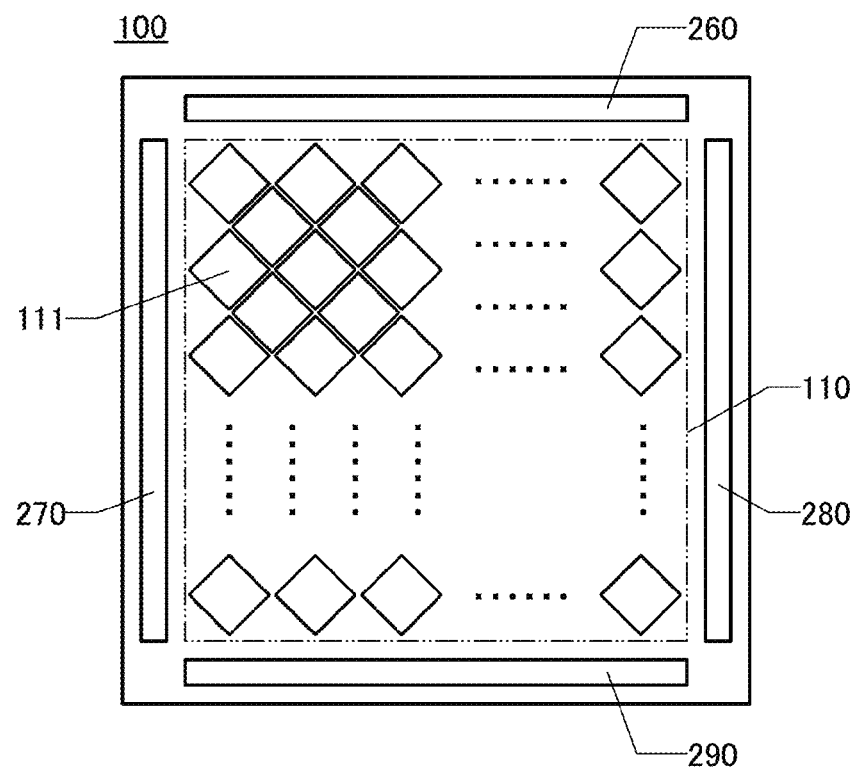

As illustrated in FIG. 1B, the pixels 111 may be provided to be inclined in the pixel portion 110 included in the imaging device 100. When the pixels 111 are inclined, the space between the pixels in the row direction and the column direction (pitch) can be decreased. Thus, the quality of image captured with the imaging device 100 can be further enhanced.

[Structure Example of Pixel 111]

The pixel 111 included in the imaging device 100 is formed with a plurality of subpixels 112, and each subpixel 112 is combined with a filter which transmits light with a specific wavelength band (color filter), whereby data for achieving color image display can be obtained.

Figure 2A:
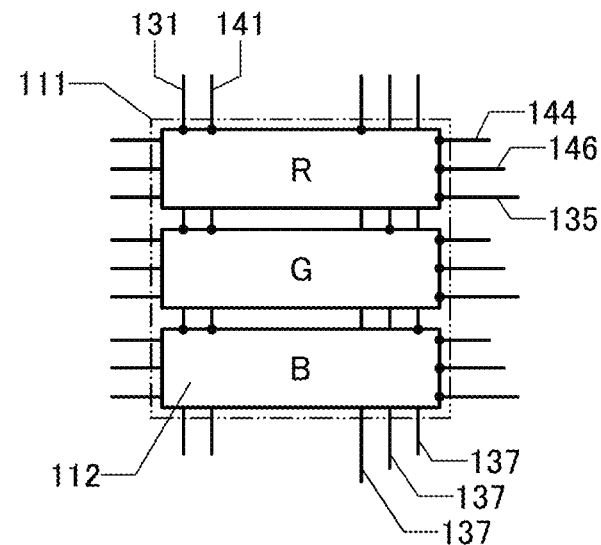
FIGS. 2A and 2B each illustrate a structure example of a pixel.

FIG. 2A is a plan view showing an example of the pixel 111 with which a color image is obtained. The pixel 111 illustrated in FIG. 2A includes a subpixel 112 provided with a color filter transmitting light with a red (R) wavelength band (also referred to "subpixel 112R"), a subpixel 112 provided with a color filter transmitting light with a green (G) wavelength band (also referred to "subpixel 112G"), and a subpixel 112 provided with a color filter transmitting light with a blue (B) wavelength band (also referred to "subpixel 112B"). The subpixel 112 can function as a photosensor.

The subpixels 112 (the subpixel 112R, the subpixel 112G, and the subpixel 112B) are electrically connected to a wiring 131, a wiring 141, a wiring 144, a wiring 146, and a wiring 135. In addition, the subpixel 112R, the subpixel 112G, and the subpixel 112B are connected to respective wirings 137 which are independently provided. In this specification and the like, for example, the wiring 144 and the wiring 146 that are connected to the pixel 111 in the n-th row are referred to as a wiring 144[n] and a wiring 146[n]. For example, the wiring 137 connected to the pixel 111 in the m-th column is referred to as a wiring 137[m]. Note that in FIG. 2A, the wirings 137 connected to the subpixel 112R, the subpixel 112G, and the subpixel 112B in the pixel 111 in the m-th column are referred to as a wiring 137[m]R, a wiring 137[m]G, and a wiring 137[m]B. The subpixels 112 are electrically connected to the peripheral circuit through the above wirings.

Figure 2B:
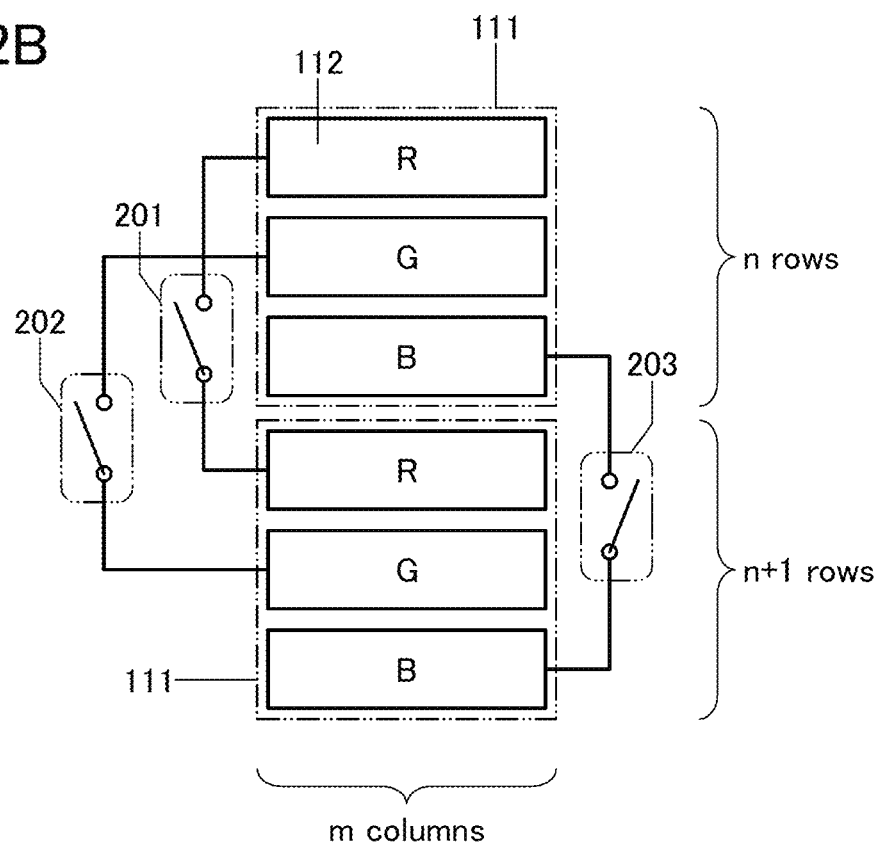

The imaging device 100 in this embodiment has a structure in which the subpixel 112 is connected to the subpixel 112 in an adjacent pixel 111, via a switch. In the structure, the color filters provided for the subpixels 112 transmit light with the same wavelength band. FIG. 2B shows a connection example of the subpixels 112: the subpixel 112 in the pixel 111 arranged in an n-th (n is a natural number greater than or equal to 1 and less than or equal to p) row and an m-th (m is a natural number greater than or equal to 1 and less than or equal to q) column and the subpixel 112 in the adjacent pixel 111 arranged in an (n+1)-th row and the m-th column. In FIG. 2B, the subpixel 112R arranged in the n-th row and the nm-th column and the subpixel 112R arranged in the (n+1)-th row and the m-th column are connected to each other via a switch 201. The subpixel 112G arranged in the n-th row and the n-th column and the subpixel 112G arranged in the (n+1)-th row and the m-th column are connected to each other via a switch 202. The subpixel 112B arranged in the n-th row and the m-th column and the subpixel 112B arranged in the (n+1)-th row and the m-th column are connected to each other via a switch 203.

Figure 3A:
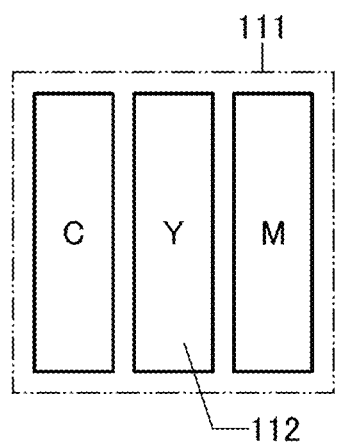
FIGS. 3A to 3D each illustrate a configuration example of a pixel.

The color filter used in the subpixel 112 is not limited to red (R), green (G), and blue (B) color filters, and as illustrated in FIG. 3A, color filters that transmit light of cyan (C), yellow (Y), and magenta (M) may be used. The subpixels 112 that sense light with three different wavelength bands are provided in one pixel 111, whereby a full-color image can be obtained.

Figure 3B:
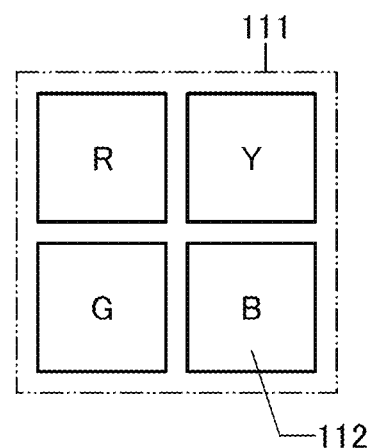
Figure 3C:
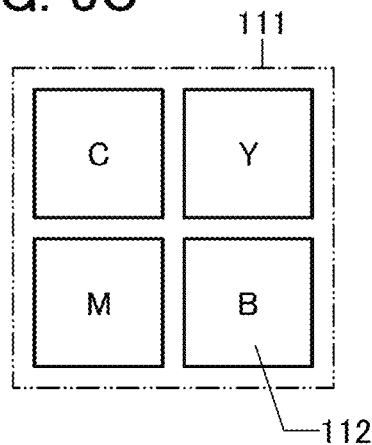

FIG. 3B shows the pixel 111 including the subpixel 112 provided with a color filter transmitting yellow (Y) light, in addition to the subpixels 112 provided with the color filters transmitting red (R), green (G), and blue (B) light. FIG. 3C illustrates the pixel 111 including the subpixel 112 provided with a color filter transmitting blue (B) light, in addition to the subpixels 112 provided with the color filters transmitting cyan (C), yellow (Y), and magenta (M) light. When the subpixels 112 sensing light with four different wavelength bands are provided in one pixel 111, the reproducibility of colors of an obtained image can be increased.

Figure 3D:
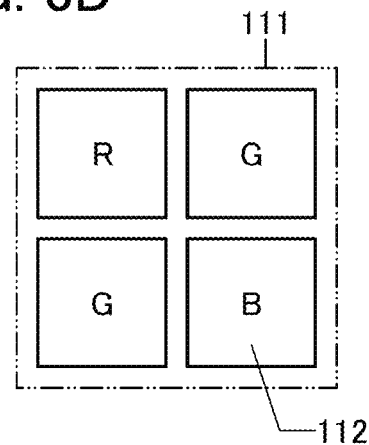

For example, in FIG. 2A, in regard to the subpixel 112 sensing a red wavelength band, the subpixel 112 sensing a green wavelength band, and the subpixel 112 sensing a blue wavelength band, the pixel number ratio (or the ratio of light receiving area) thereof is not necessarily 1:1:1. The pixel number ratio (the ratio of light receiving area) of red and green to blue may be 1:2:1 (Bayer arrangement), as illustrated in FIG. 3D. Alternatively, the pixel number ratio (the ratio of light receiving area) of red and green to blue may be 1:6:1.

Although the number of subpixels 112 provided in the pixel 111 may be one, two or more subpixels are preferably provided. For example, when two or more subpixels 112 sensing the same wavelength band are provided, the redundancy is increased, and the reliability of the imaging device 100 can be increased.

When an infrared (IR) filter that transmits infrared light and absorbs or reflects light with wavelength shorter than or equal to that of visible light is used as the filter, the imaging device 100 that senses infrared light can be achieved. Alternatively, when an ultra violet (UV) filter that transmits ultraviolet light and absorbs or reflects light with a wavelength longer than or equal to ultraviolet light is used as the filter, the imaging device 100 that senses ultraviolet light can be achieved. Alternatively, when a scintillator that turns a radiant ray into ultraviolet light or visible light is used as the filter, the imaging device 100 can be used as a radiation detector that detects an X-ray or a Y-ray.

When a neutral density (ND) filter (dimming filter) is used as a filter, a phenomenon of output saturation, which is caused when an excessive amount of light enters a photoelectric conversion element (light-receiving element), can be prevented. With a combination of ND filters with different dimming capabilities, the dynamic range of the imaging device can be increased.

Figure 4A:
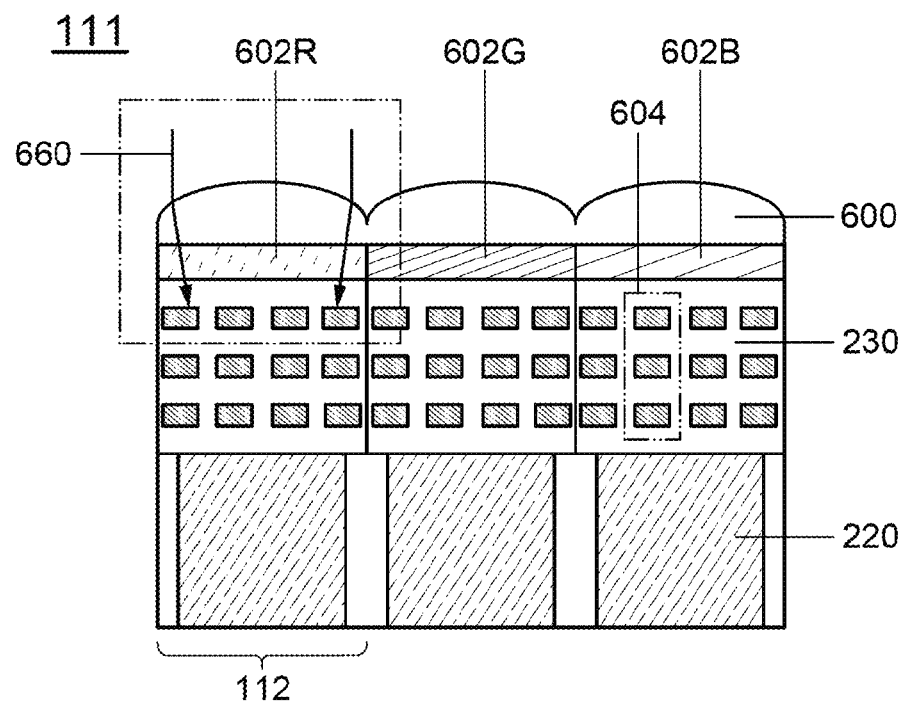
FIGS. 4A and 4B each illustrate a structure example of a pixel.

Besides the above-described filter, the pixel 111 may be provided with a lens. An arrangement example of the pixel 111, a filter 602, and a lens 600 is described with cross-sectional views in FIGS. 4A and 4B. With the lens 600, the incident light can be efficiently received by a photoelectric conversion element. Specifically, as illustrated in FIG. 4A, light 660 enters a photoelectric conversion element 220 through the lens 600, the filter 602 (a filter 602R, a filter 602G, and a filter 602B), a pixel circuit 230, and the like.

Figure 4B:
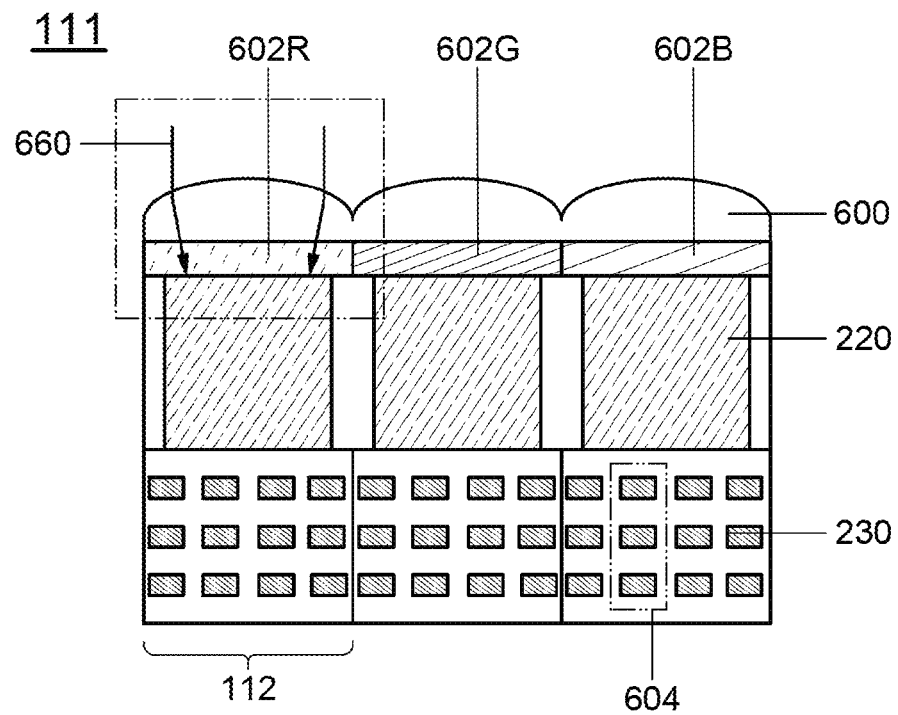

However, as illustrated in a region surrounded by a two-dot chain line, part of light 660 indicated by arrows may be blocked by part of a wiring layer 604. Thus, a preferred structure is such that the lens 600 and the filter 602 are provided on the photoelectric conversion element 220 side, as illustrated in FIG. 4B, whereby the incident light is efficiently received by the photoelectric conversion element 220. When the light 660 is incident on the photoelectric conversion element 220 side, the imaging device 100 with high sensitivity can be provided.

[Circuit Configuration Example of Subpixel 112]

Figure 5:
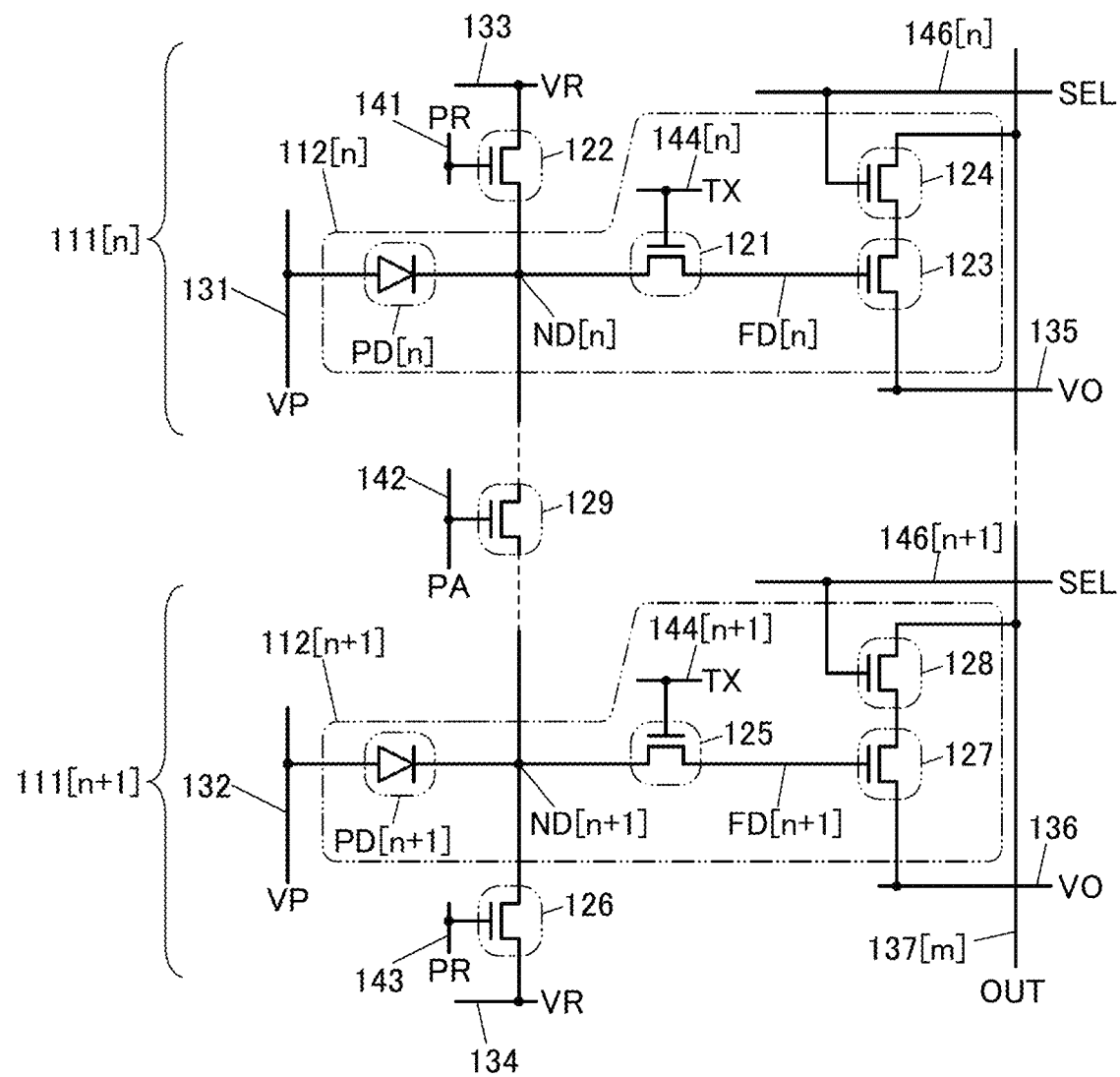
FIG. 5 illustrates a circuit configuration example of a pixel.

Next, a specific circuit configuration example of the subpixel 112 is described with reference to a circuit diagram in FIG. 5. FIG. 5 shows a circuit configuration example in which a subpixel 112[n] in the pixel 111 in an n-th row is electrically connected to a subpixel 112[n+1] in the pixel 111 in an (n+1)-th row through a transistor 129. The transistor 129 can function as the switch 201, the switch 202, or the switch 203.

Specifically, the subpixel 112[n] in the pixel 111 in the n-th row includes a photodiode PD[n] (photoelectric conversion element), a transistor 121, a transistor 123, and a transistor 124. The subpixel 112[n+1] in the pixel 111 in the (n+1)-th row includes a photodiode PD[n+1], a transistor 125, a transistor 127, and a transistor 128.

In this embodiment, the case where n-channel transistors are used as the transistors 121 to 129. Thus, each of the transistors 121 to 129 has electrical conduction (in an on state) between a source and a drain when a signal supplied to a gate is at H potential and the transistors 121 to 129 have no electrical conduction (in an off state) when the signal is at L potential.

However, one embodiment of the present invention is not limited to the above, and p-channel transistors can be used as the transistors 121 to 129. Alternatively, an n-channel transistor and a p-channel transistor may be used in combination as appropriate.

In the circuit configuration in FIG. 5, one of an anode and a cathode of the photodiode PD[n] is electrically connected to a wiring 131 from which a potential VP can be supplied. The other of the anode and the cathode of the photodiode PD[n], one of the source and drain of the transistor 121, and one of a source and a drain of the transistor 122 are electrically connected to a node ND[n]. The other of the source and the drain of the transistor 122 is electrically connected to a wiring 133 from which a potential VR is supplied. A gate of the transistor 122 is electrically connected to a wiring 141 from which a potential PR is supplied. The other of the source and the drain of the transistor 121 and a gate of the transistor 123 are electrically connected to a node FD[n]. A gate of the transistor 121 is electrically connected to a wiring 144[n] from which a potential TX can be supplied. One of the source and the drain of the transistor 123 is electrically connected to a wiring 135 from which a potential VO can be supplied, and the other of the source and the drain of the transistor 123 is electrically connected to one of the source and the drain of the transistor 124. The other of the source and the drain of the transistor 124 is electrically connected to a wiring 137[m], and a gate of the transistor 124 is electrically connected to a wiring 146[n] from which a potential SEL can be supplied. One of the source and the drain of the transistor 129 is electrically connected to the node ND[n], a gate of the transistor 129 is electrically connected to a wiring 142 from which a potential PA can be supplied.

One of an anode and a cathode of the photodiode PD[n+1] is electrically connected to a wiring 132 from which the potential VP can be supplied. The other of the anode and the cathode of the photodiode PD[n+1], one of the source and the drain of the transistor 125, and one of a source and a drain of a transistor 126 are electrically connected to a node ND[n+1]. The other of the source and the drain of the transistor 126 is electrically connected to a wiring 134 from which the potential VR can be supplied. A gate of the transistor 126 is electrically connected to a wiring 143 from which the potential PR can be supplied. The other of the source and the drain of the transistor 125 and a gate of the transistor 127 are electrically connected to a node FD[n+1]. A gate of the transistor 125 is electrically connected to a wiring 144[n+1] from which the potential TX can be supplied. One of the source and the drain of the transistor 127 is electrically connected to a wiring 136 from which the potential VO can be supplied. The other of the source and the drain of the transistor 127 is electrically connected to one of the source and the drain of the transistor 128. The other of the source and the drain of the transistor 128 is electrically connected to the wiring 137[m]. A gate of the transistor 128 is electrically connected to a wiring 146[n+1] from which the potential SEL can be supplied. The other of the source and the drain of the transistor 129 is electrically connected to a node ND[n+1].

The wiring 131 and the wiring 132 may be one common wiring although they are separately illustrated in FIG. 5. The wiring 141 and the wiring 143 may be one common wiring although they are separately illustrated in FIG. 5. The wiring 135 and the wiring 136 may be one common wiring although they are separately illustrated in FIG. 5.

Operation Example 1

Next, an example of capturing operation of the imaging device 100 with a global shutter system is described with reference to FIG. 6, FIGS. 7A and 7B, FIGS. 8A and 8B, and FIGS. 9A and 9B. The image capturing with a global shutter system can be performed in the following manner: reset operation and accumulation operation are concurrently performed in all of the subpixels 112, and reading operation is sequentially performed. As an operation example of the subpixels 112, description is made with reference to the subpixel 112[n] and the subpixel 112[n+1].

Figure 6:
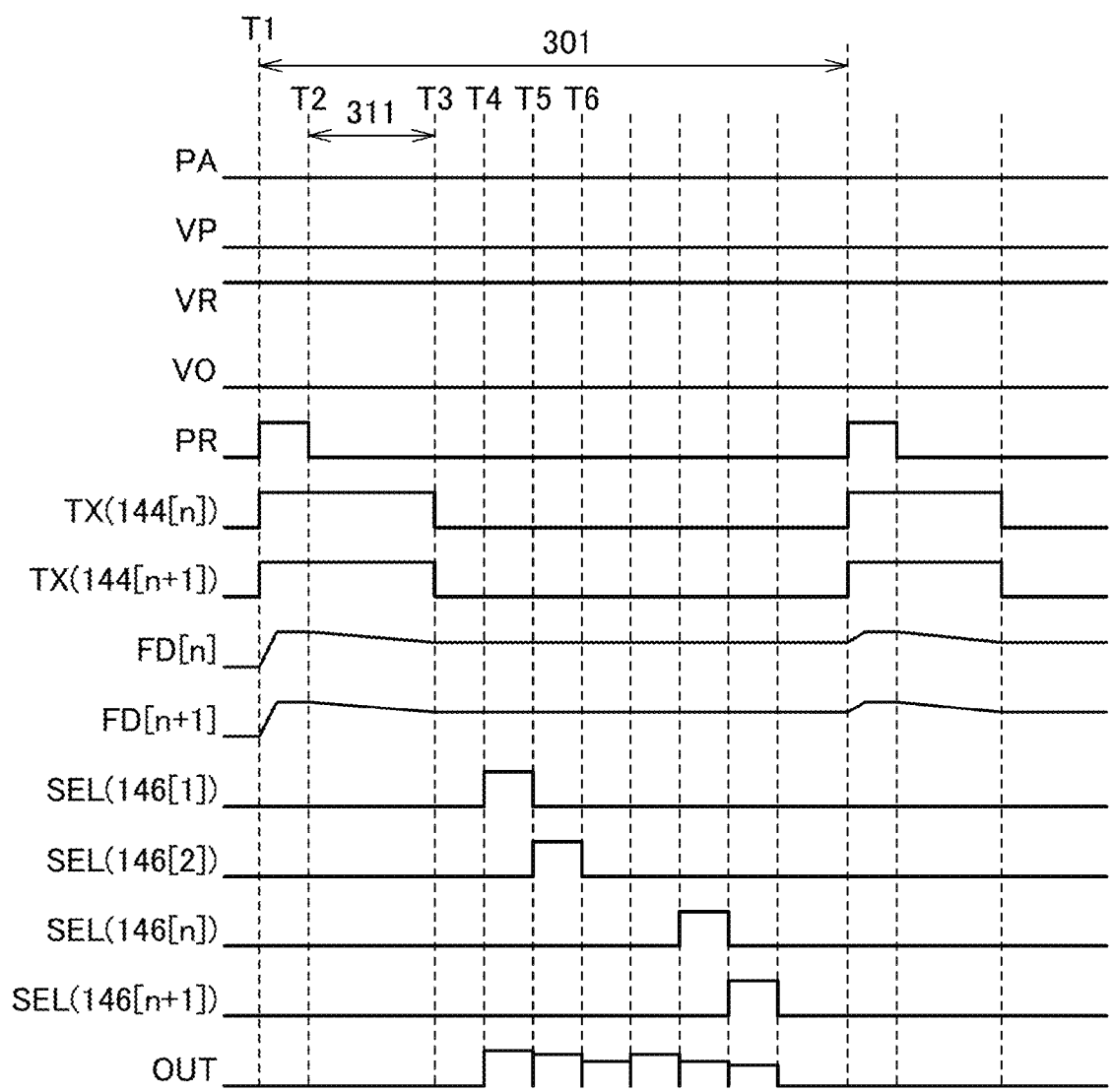
FIG. 6 is a timing chart showing an example of capturing operation.
Figure 7A:
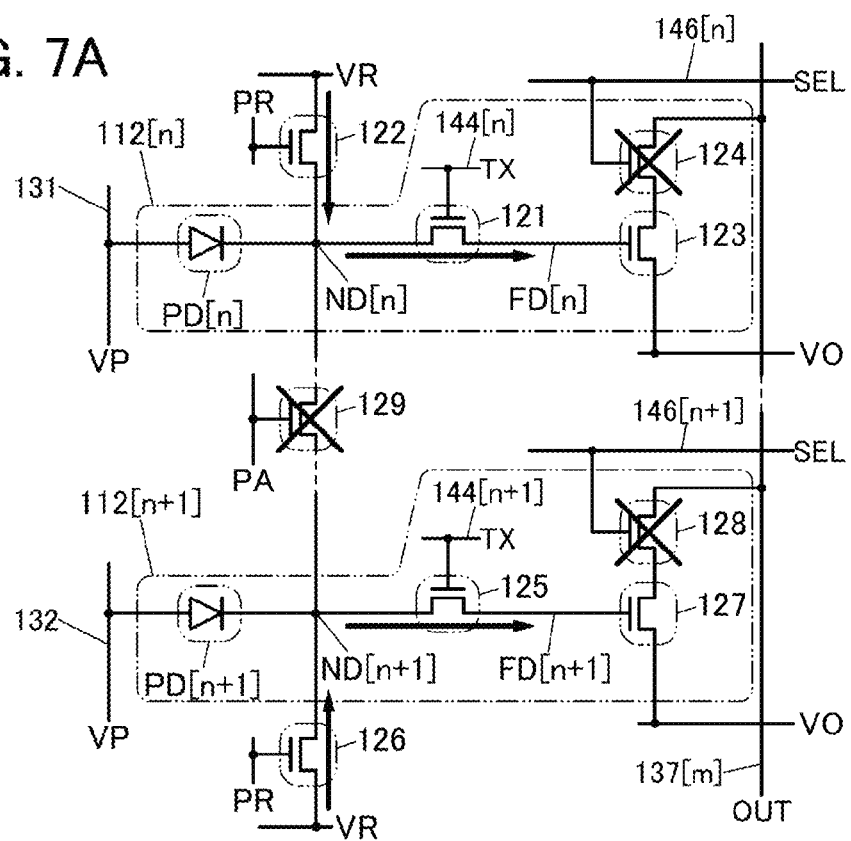
FIGS. 7A and 7B are each a circuit diagram showing an example of image-capturing operation.
Figure 7B:
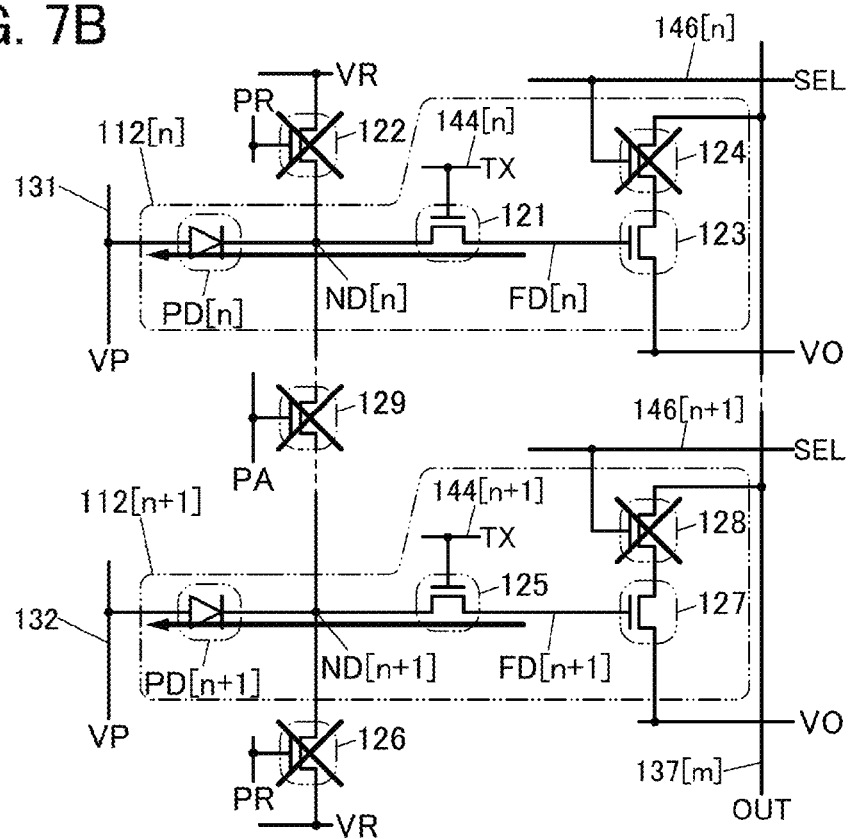
Figure 8A:
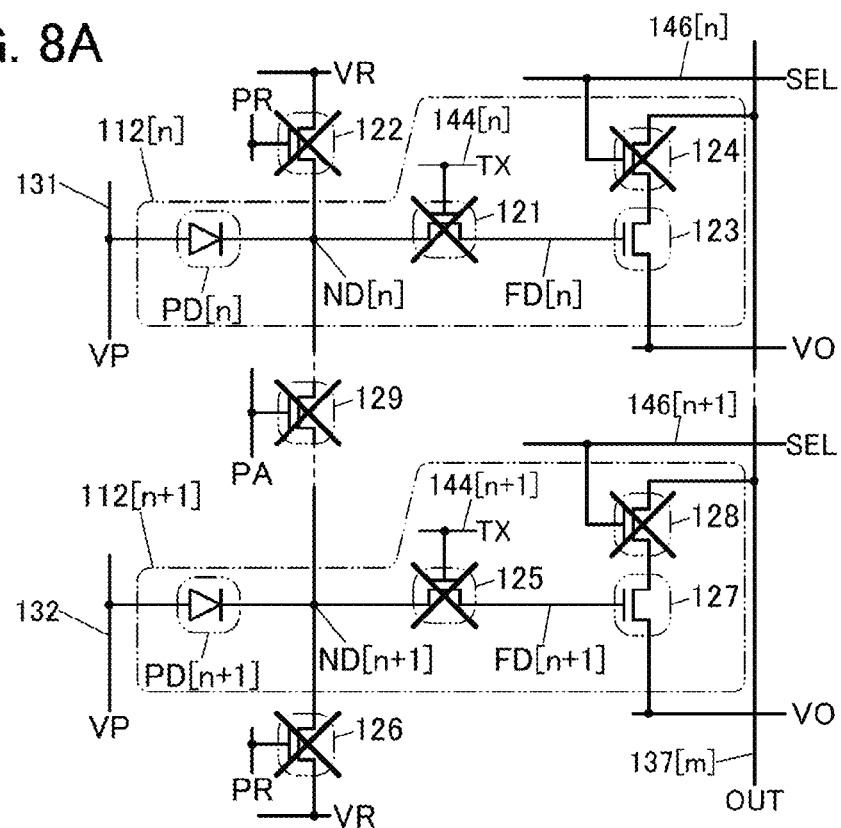
FIGS. 8A and 8B are each a circuit diagram showing an example of image-capturing operation.
Figure 8B:
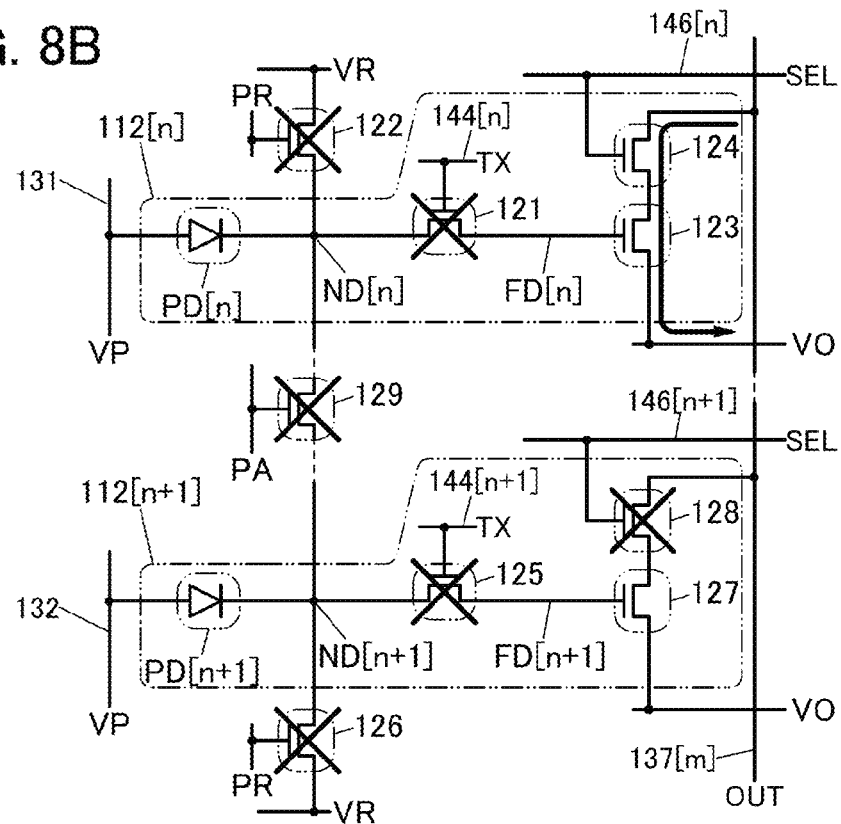
Figure 9A:
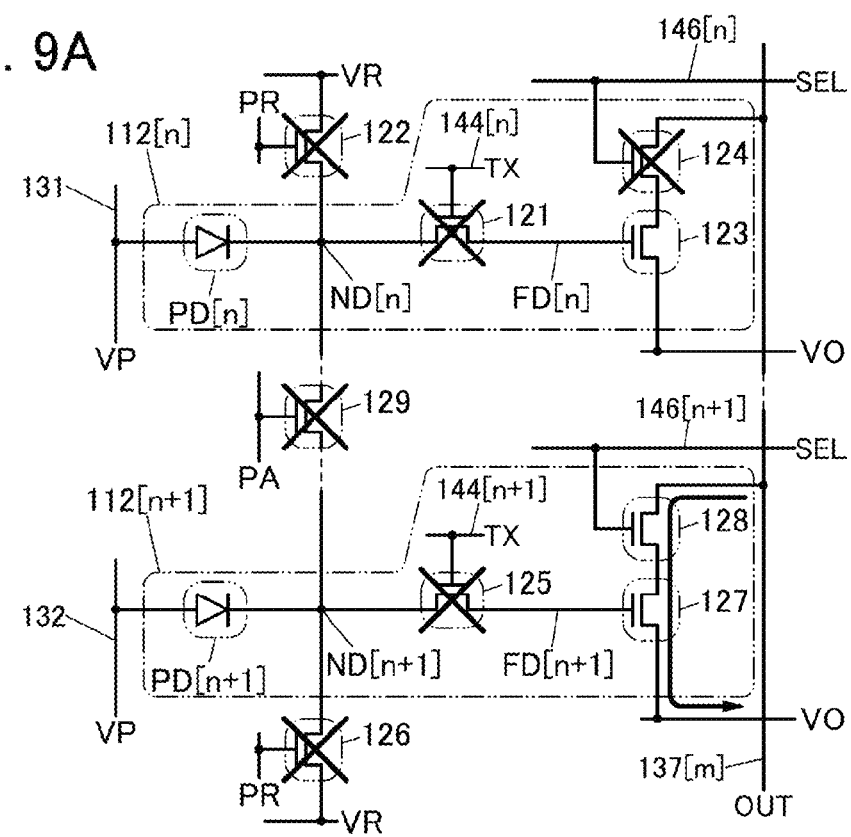
FIGS. 9A and 9B are each a circuit diagram showing an example of image-capturing operation.
Figure 9B:
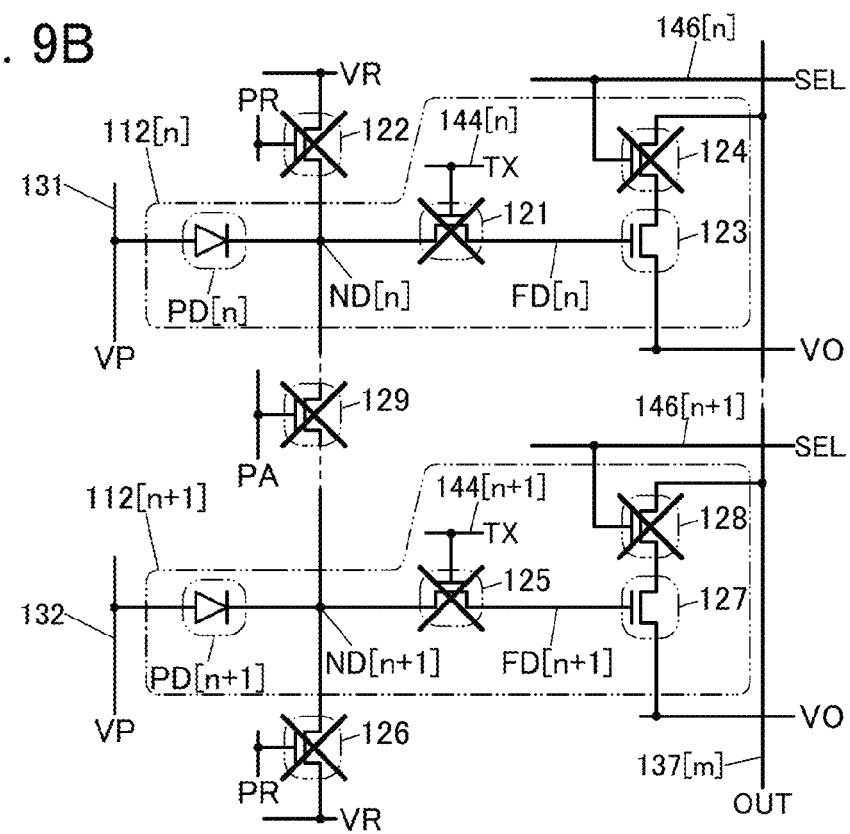

FIG. 6 is a timing chart showing operation of the subpixels 112, and FIGS. 7A and 7B, FIGS. 8A and 8B, and FIGS. 9A and 9B are circuit diagrams showing operation states of the subpixels 112. For easy understanding of the driving method, either the H potential or the L potential is supplied to the above wirings and nodes unless otherwise specified, in the timing chart shown in this embodiment.

With a global shutter system, the accumulation operations of all pixels 111 can be conducted during one period. Thus, unlike the case of using a rolling shutter system, distortion of a captured image, which is caused by the accumulation operations conducted in different periods, is not generated. Note that a frame period in the case of using the global shutter system is referred to as a period 301 in FIG. 6. The period 301 corresponds to the sum of times required for the reset operation, the accumulation operation, and the operation of reading data from pixels in all rows.

In Operation Example 1, the capturing operation in the case where the potential PA is set at L potential and the transistor 129 is in an off state is described. When the potential PA is set at L potential, the subpixel 112[n] and the subpixel 112[n+1] can be made to operate independently. Furthermore, the potential VR is set at H potential, and the potential VP and the potential VO are set at L potentials. The potential SEL[n] and the potential SEL[n+1] are set at L potentials.

[Reset Operation]

First, at a time T1, the potential PR and the potential TX are set at H potentials, whereby the transistor 121 and the transistor 122 are turned on, and the node ND[n] and the node FD[n] are at H potentials. In addition, the transistor 125 and the transistor 126 are turned on, and the node ND[n+1] and the node FD[n+1] are at H potentials. By this operation, the amount of charges accumulated at the node FD[n] and the node FD[n+1] are reset (see FIG. 7A). A period between the time T1 and a time T2 is referred to as a "reset period". The operation during the reset period is referred to as a "reset operation".

Although not illustrated, in the reset period, all the node FD[n] and node FD[n+1] in the imaging device 100 are reset.

[Accumulation Operation]

Next, at the time T2, the potential PR is set at L potential. The potential TX is kept at H potential. Furthermore, at the time T2, the photodiode PD[n] and the photodiode PD[n+1] are supplied with a reverse bias. When light enters the photodiode PD[n] and the photodiode PD[n+1] in a state where the reverse bias is applied to the photodiode PD[n] and the photodiode PD[n+1], current flows through the photodiode PD[n] and the photodiode PD[n+1] from one of electrodes to the other electrode of each photodiode (see FIG. 7B). The amount of current varies depending on the intensity of light in this state. In other words, as the intensity of light entering the photodiode PD[n] and the photodiode PD[n+1] is increased, the amount of current is increased, and the amount of charges flowing out from the node FD[n] and the node FD[n+1] is increased. In contrast, as the intensity of light entering the photodiode PD[n] and the photodiode PD[n+1] is low, the amount of current is reduced, and the amount of charges flowing out from the node FD[n] and the node FD[n+1] is reduced. Thus, the higher the intensity of light becomes, the larger the amount of change in the potential of the node FD[n] and the node FD[n+1] becomes; the lower the intensity of light becomes, the smaller the amount of change becomes.

Next, at a time T3, the potential TX is set at L potential, whereby the transistor 121 and the transistor 125 are turned off. When the transistor 121 and the transistor 125 are turned off, the transfer of charge from the node FD[n] and the node FD[n+1] to the photodiode PD[n] and the photodiode PD[n+1] is stopped, and the potentials of the node FD[n] and the node FD[n+1] are determined (see FIG. 8A). A period between the time T2 and the time T3 is referred to as an "exposure period". The exposure period in Operation Example 1 is referred to as a period 311 in FIG. 6. The operation during the exposure period is referred to as an "accumulation operation".

[Reading Operation]

Next, at a time T4, the potential SEL supplied to the wiring 146[n] is set at H potential. Here, the case where n=1 (first row) is described. Immediately before the H potential is supplied to the wiring 146[n], the wiring 137[m] is pre-charged so that the potential becomes H potential. When the potential SEL supplied to the wiring 146[n] is at H potential, the transistor 124 is turned on, and the potential of the wiring 137[m] is lowered at a rate corresponding to the potential of the node FD[n](see FIG. 8B). At a time T5, the potential SEL supplied to the wiring 146[n] is set at L potential, whereby the transistor 124 is turned off, and the potential of the wiring 137[m] is determined. The potential of the wiring 137[m] at this time is measured, so that the amount of light received by the subpixel 112[n] can be calculated.

Next, at the time T5, the potential SEL supplied to the wiring 146[n+1](the wiring 146 in the second row in this case) is set at H potential. Immediately before the potential supplied to the wiring 146[n+1] is set at H potential, the wiring 137[m] is pre-charged so that the potential becomes H potential. When the potential SEL supplied to the wiring 146[n+1] is set at H potential, the transistor 128 is turned on, and the potential of the wiring 137[m] is lowered at a rate corresponding to the potential of the node FD[n+1](see FIG. 9A). At a time T6, the potential SEL supplied to the wiring 146[n+1] is set at L potential, whereby the transistor 128 is turned off, and the potential of the wiring 137[m] is determined (see FIG. 9B). The potential of the wiring 137[m] at this time is measured, so that the amount of light received by the subpixel 112[n+1] can be calculated.

After the time T6, the potential of the wiring 137[m] is measured in order from the third row, whereby the potentials of the wirings 137[m] in the n-th row and the (n+1)-th row can be obtained. The potentials of the wirings 137[m] in first to p-th rows are measured, whereby the amount of light received by the pixels 11 in the imaging device 100 can be obtained. Thus, an image data of the object captured with the imaging device 100 can be obtained. For example, a period during which the amount of received light in each row is calculated, such as a period from the time T4 to the time T5, is referred to as a "reading period". The operation during the reading period is referred to as a "reading operation". Note that the timing of performing the reading operation can be determined as appropriate. The potentials of wirings 137 in first to q-th columns, connected to the n-th row, may be measured in order from first column, measured concurrently from first to q-th columns, or measured per unit of plural columns.

In the global shutter system, the reset operations are concurrently conducted in all pixels, and the accumulation operations are concurrently conducted in all pixels. Thus, the potential TX and the potential PR of pixels in all columns may be changed all at once.

A period between the end of the accumulation operation and the start of the reading operation, during which charge is held at the nodes FD in the pixels in each row, is called "charge holding period". In the global shutter system, the reset operation and the accumulation operation are performed on all pixels concurrently, and therefore, the exposure period ends in all pixels at substantially the same timing. However, the reading operation is sequentially performed on the pixels per row, and thus the charge holding period differs between rows. For example, the charge holding period in the first row lies between the time T3 and the time T4, and the charge holding period in the second row lies between the time T3 and the time T5. The reading operation is performed row by row; therefore, the timing of when the reading period starts varies from one row to another. Thus, the length of the charge holding period in the last row is the longest.

When an image with a uniform grayscale level is obtained, output signals in all the pixels ideally have potentials of the same level. However, in the case where the length of the charge holding period varies from one pixel row to another, if charge accumulated at the nodes FD in the pixels in each row leaks out over time, the potential of an output signal varies from one row to another, and image data varies in grayscale level from one row to another.

Thus, it is preferable for the transistor 121 and the transistor 125 to use a transistor with extremely low off-state current. With use of a transistor with extremely low off-state current for the transistor 121 and the transistor 125, the amount of change in potentials of the node FD[n] and the node FD[n+1] due to a difference in the length of charge holding period can be small, even when the image is captured with the global shutter system. In that case, even when an image is captured with the global shutter system, it is possible to suppress variation in grayscale level of image data due to a difference in the length of the charge holding period, and it is possible to enhance the quality of captured image.

The driving method described in Operation Example 1 in this specification and the like is called a normal GS driving method.

In the case where the normal GS driving method is performed with use of the circuit configuration in FIG. 5, there is a possibility that an image data of the pixels in the n-th row is mixed with an image data of the pixels in the (n+1)-th row. Thus, it is preferable for the transistor 129 to use a transistor with extremely low off-state current. With use of the transistor with extremely low off-state current for the transistor 129, a mixture of the image data can be suppressed.

According to one embodiment of the present invention, the quality of captured image can be enhanced.

Operation Example 2

Figure 10:
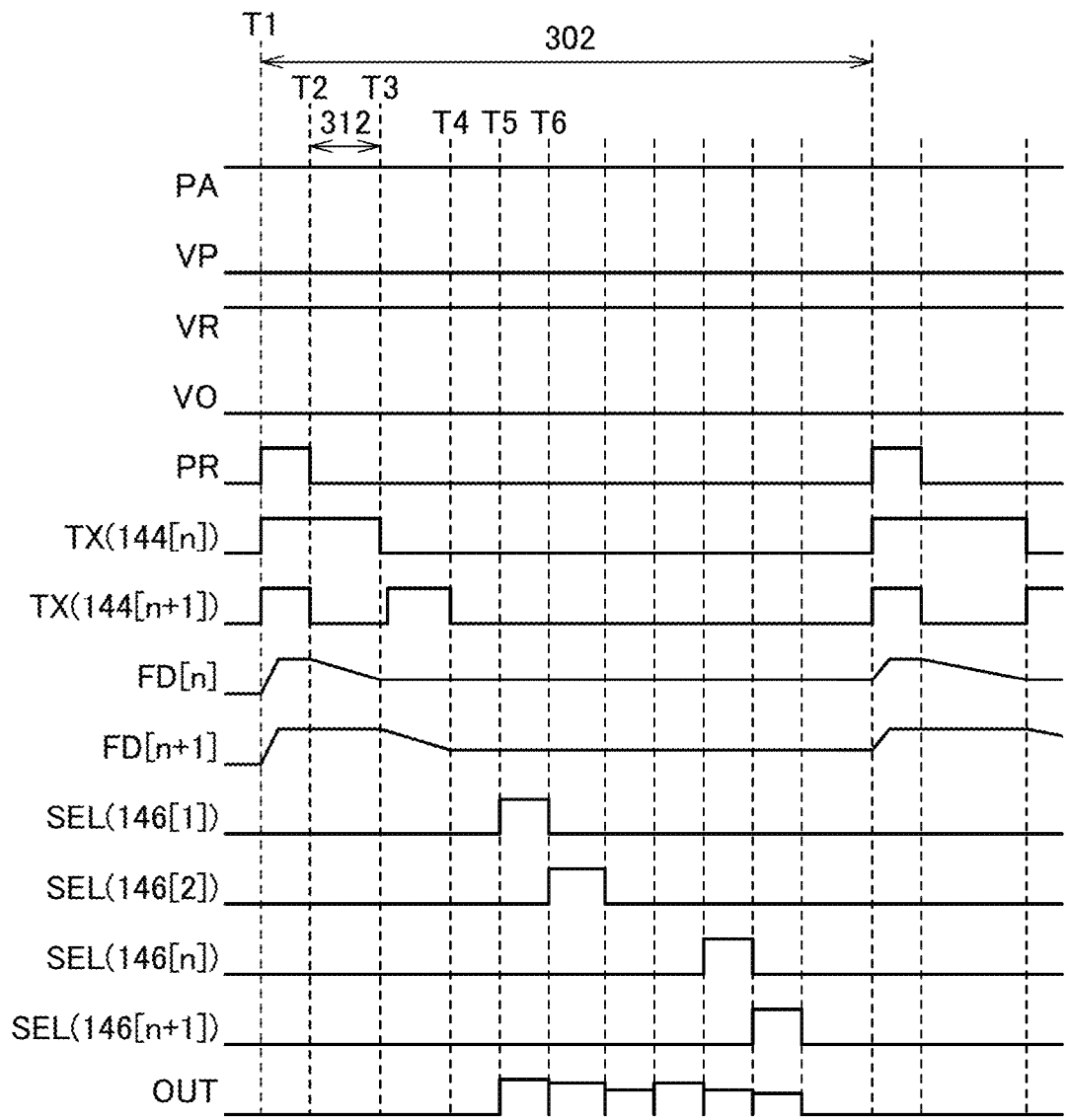
FIG. 10 is a timing chart showing an example of image-capturing operation.
Figure 11A:
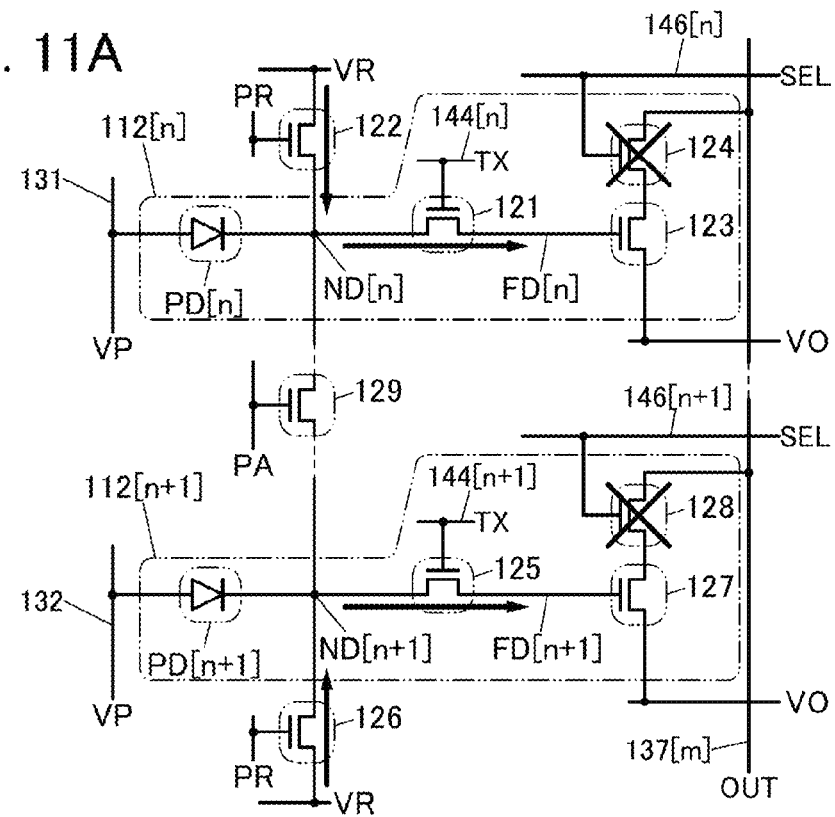
FIGS. 11A and 11B are each a circuit diagram showing an example of image-capturing operation.
Figure 11B:
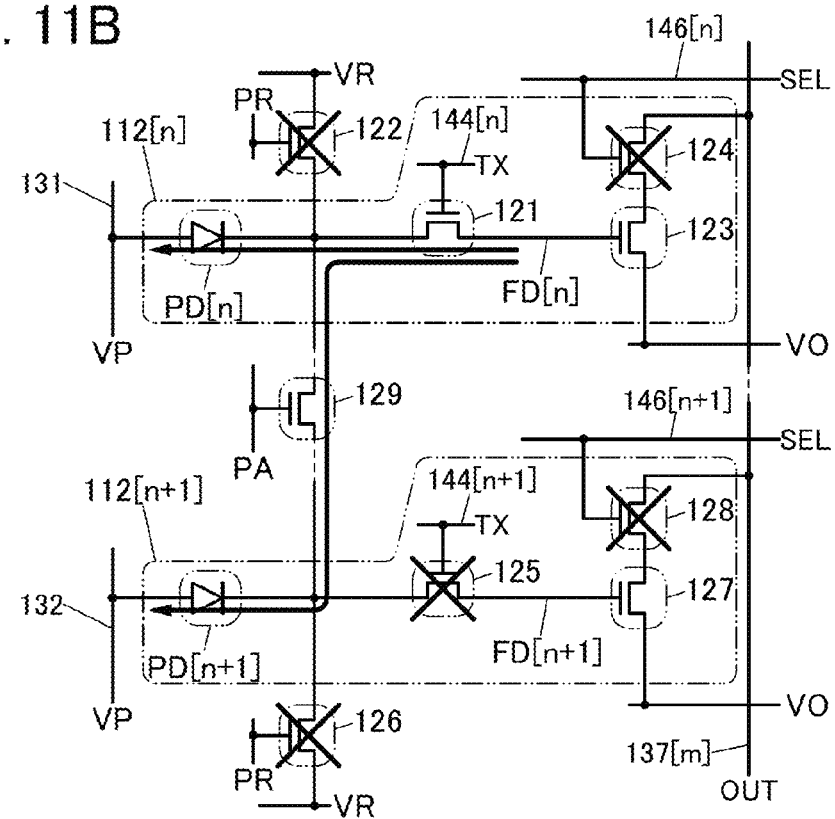

Next, an operation example of the imaging device 100 capable of high-speed image capturing is described with reference to FIG. 10, FIGS. 11A and 11B, and FIGS. 12A and 12B. FIG. 10 is a timing chart showing an operation of the subpixels 112, and FIGS. 11A and 11B and FIGS. 12A and 12B are each a circuit diagram showing an operation condition of the subpixels 112.

Note that a frame period in Operation Example 2 is referred to as a period 302 in FIG. 10. The period 302 corresponds to the sum of times required for the reset operation, the accumulation operation, and the operation of reading data from pixels in all rows.

In Operation Example 2, the capturing operation in the case where the potential PA is set at H potential to turn the transistor 129 on is described. The potential PA is set at H potential, whereby the photodiode PD[n] in the subpixel 112[*n*] and the photodiode PD[n+1] in the subpixel 112[*n*+1] can be connected in parallel and used concurrently. In other words, the light-receiving area can be substantially increased. Like Operation Example 1, the potential VR is set at H potential, and the potential VP and the potential VO are set at L potentials. The potential SEL[n] and the potential SEL[n+1] are set at L potentials.

[Reset Operation]

First, at a time T1, the potential PR and the potential TX are set at H potentials, whereby the transistor 121 and the transistor 122 are turned on, and the node ND[n] and the node FD[n] are set at H potentials. In addition, the transistor 125 and the transistor 126 are tinned on, and the node ND[n+1] and the node FD[n+1] are set at H potentials. Through this operation, the amount of charges accumulated in the node FD[n] and the node FD[n+1] are reset (see FIG. 11A).

Since the transistor 129 is in an on state in Operation Example 2, either the transistor 122 or the transistor 126 may be in an off state during the reset period. Although not illustrated, all of the nodes FD[n] and the nodes FD[n+1] in the imaging device 100 are reset in the reset period.

[Accumulation Operation]

Next, at a time T2, the potential PR is set at L potential. The potential TX supplied to the wiring 144[*n*+1] is set at potential TX. The potential TX supplied to the wiring 144[*n*] remains at H potential. In addition, at the time T2, the reverse bias is applied to the photodiode PD[n] and the photodiode PD[n+1]. When light enters the photodiode PD[n] and the photodiode PD[n+1] in an state where the reverse bias is applied to the photodiode PD[n] and the photodiode PD[n+1], current flows from one of electrodes to the other electrode in each of the photodiode PD[n] and the photodiode PD[n+1](see FIG. 11B). As described above, the amount of current at this time changes depending on the light intensity. Thus, as the intensity of light is higher, the amount of change in potential of the node FD[n] increases, and as the intensity of light is lower, the amount of change decreases.

Figure 12A:
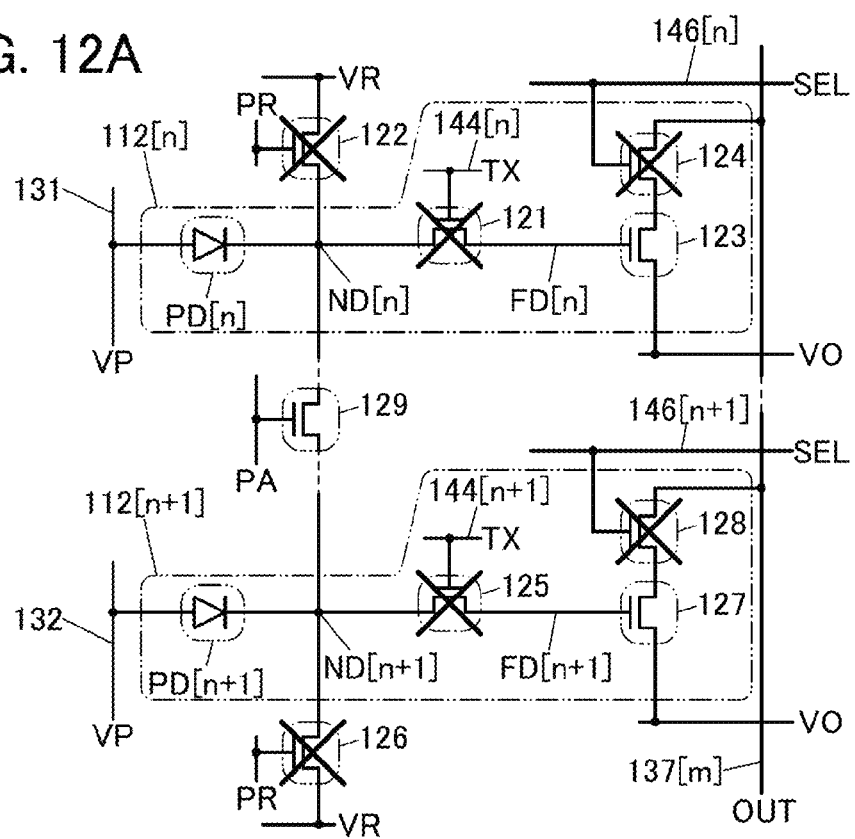
FIGS. 12A and 12B are each a circuit diagram showing an example of image-capturing operation.

Next, at a time T3, the potential TX supplied to the wiring 144[*n*] is set at L potential, whereby the transistor 121 is turned off, and the potential of the node FD[n] is determined (see FIG. 12A).

Figure 12B:
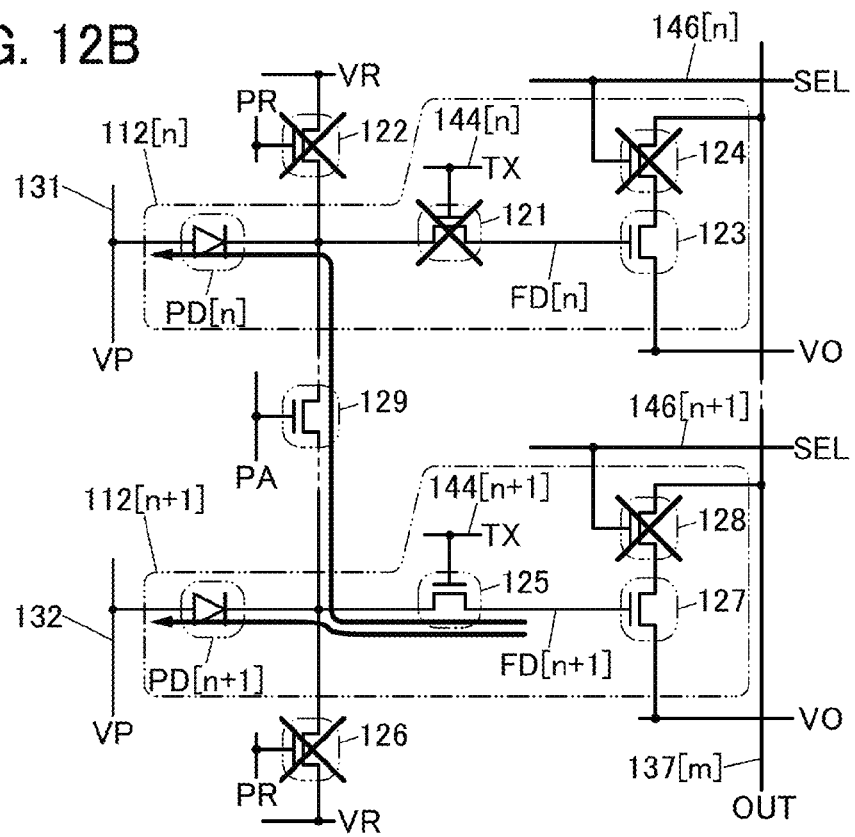

At the time T3, the potential TX supplied to the wiring 144[*n*+1] is set at H potential, whereby the potential of the node FD[n+1] changes depending on the amount of light received by the photodiode PD[n] and the photodiode PD[n+1](see FIG. 12B).

Next, at a time T4, the potential TX supplied to the wiring 144[*n*+1] is set at L potential, whereby the transistor 125 is turned off, and the potential of the node FD[n+1] is determined. Note that an exposure period in Operation Example 2 is referred to as a period 312 in FIG. 10.

After the accumulation operation in the n-th row, the reset operation is skipped and the accumulation operation in the (n+1)-th row is conducted, so that the frame period can be shortened.

[Reading Operation]

The reading operation can be performed in a manner similar to that of Operation Example 1.

In Operation Example 2, the photodiode PD[n] and the photodiode PD[n+1] are connected in parallel; when they received the same amount of light, the potentials of the node FD[n] and the node FD[n+1] can be determined in a smaller amount of time than the case of Operation Example 1. Thus, the exposure period can be shortened, and the frame period can be shortened.

When the reset operation after the accumulation operation in the n-th row is skipped and the accumulation operation in the (n+1)-th row is conducted, the frame period can be shortened. Thus, a solid-state imaging device capable of high-speed capturing image with short duration can be provided.

For example, the reset operation and the accumulation operation may be performed in a condition where the wirings 144[*n*] are in the odd-numbered row and the wirings 144[*n*+1] are in the even-numbered row. The number of pixels in which the other electrodes of the photodiodes PD are shared is increased, whereby the frequency of continuous accumulation operations can be increased. In other words, image data of continuous frames can be obtained with m short intervals in the following manner; in A pixels, the other electrodes of the photodiodes are shared with each other; the charge is sequentially accumulated in charge accumulation regions in the pixels through the continuous accumulation operations performed A times; and the captured image data in the pixels is sequentially read out. According to one embodiment of the present invention, a solid-state imaging device with a short duration of image capturing can be provided.

Note that the driving method described in Operation Example 2 in this specification and the like is called a high-speed GS driving method.

This embodiment can be implemented in an appropriate combination with any of the structures described in the other embodiments.

Embodiment 2

In this embodiment, another example of circuit configuration of the subpixel 112 will be described with reference to drawings.

Figure 13A:
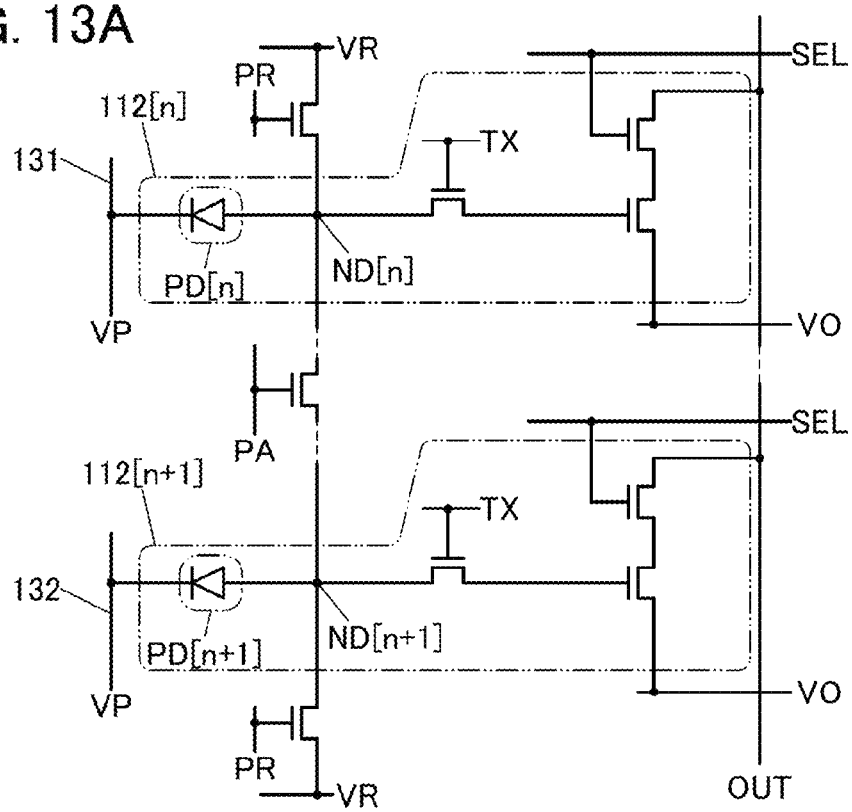
FIGS. 13A and 13B each illustrate a circuit configuration example of a pixel.

One of an anode and a cathode of the photodiode PD in the subpixel 112 may be electrically connected to the node ND, and the other of the anode and the cathode may be electrically connected to the wiring 131 (or the wiring 132) (see FIG. 13A). In this case, the potential VR is set at L potential, and the potential VP is set at H potential, whereby the imaging device 100 can be made to operate as in the above operation example.

Figure 13B:
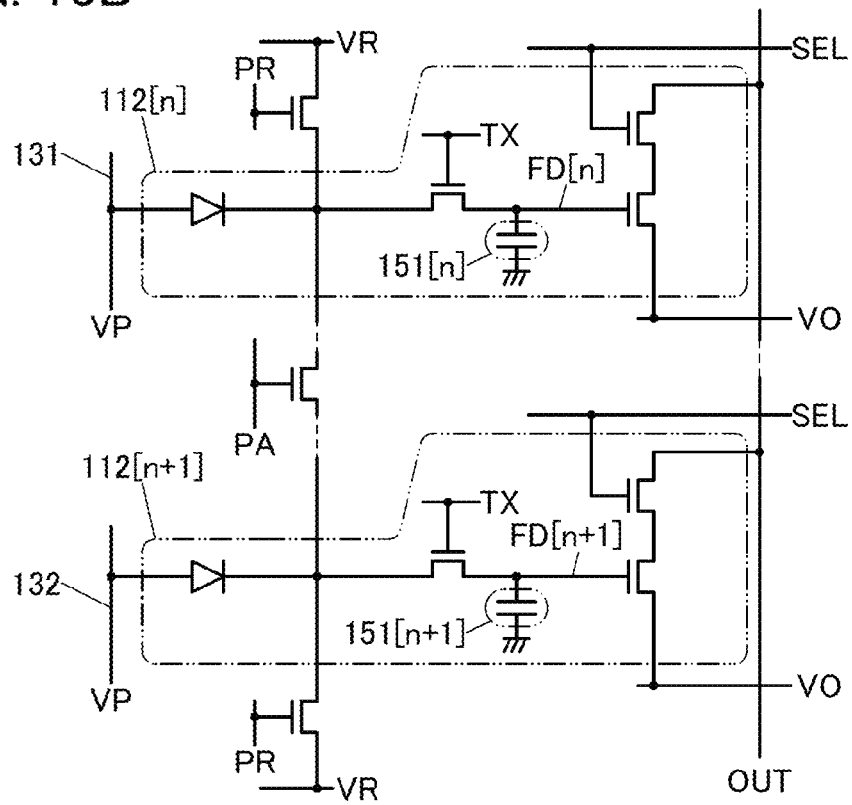

In addition, a capacitor 151 may be provided at the node FD in the subpixel 112 (see FIG. 13B). With the capacitor 151, the data retention time of image data at the node FD can be increased. Furthermore, the dynamic range of the imaging device 100 can be increased.

Figure 14A:
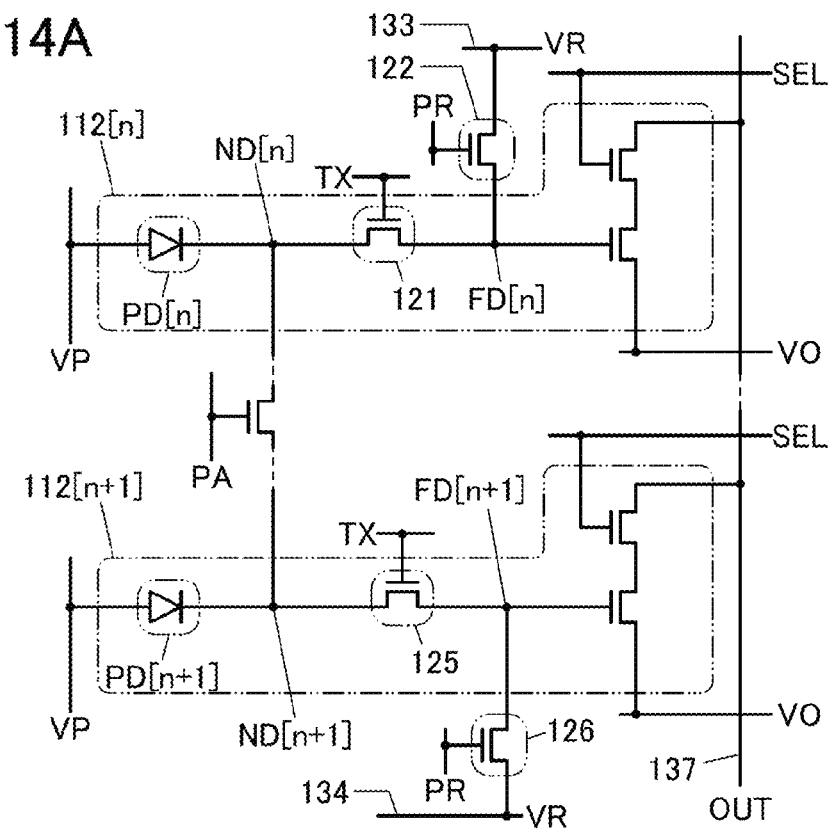
FIGS. 14A and 14B each illustrate a circuit configuration example of a pixel.

One of the source and the drain of the transistor 122 may be electrically connected to the node FD[n]. One of the source and the drain of the transistor 126 may be electrically connected to the node FD[n+1](see FIG. 14A).

Figure 14B:
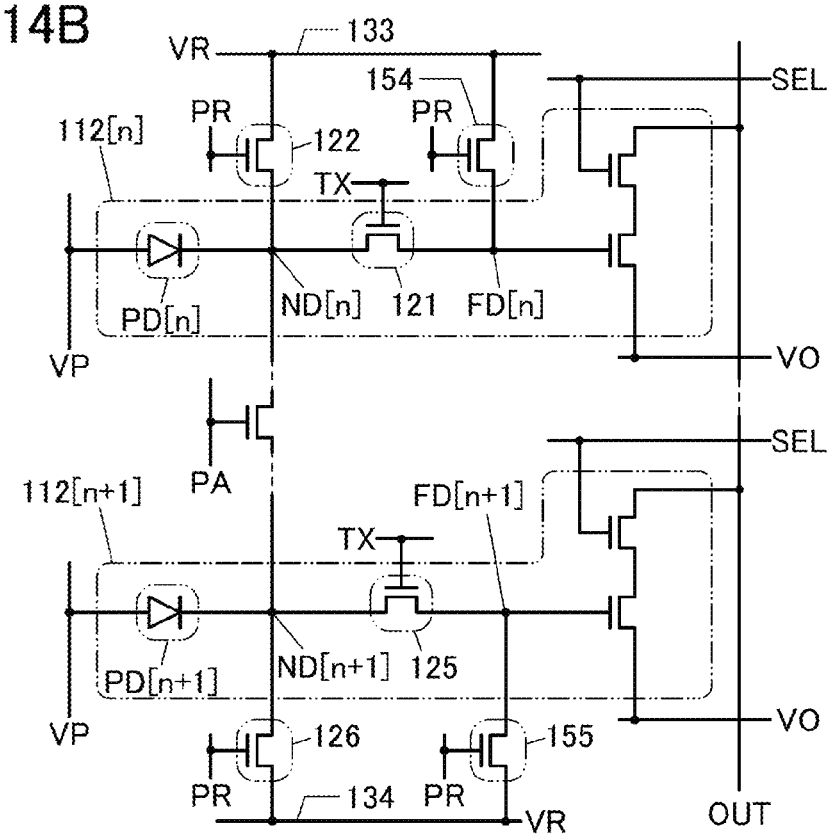

A transistor 154 that can have a function similar to that of the transistor 122 may be provided. A transistor 155 that can have a function similar to that of the transistor 126 may be provided (see FIG. 14B). One of a source and a drain of the transistor 154 is electrically connected to the node FD[n], the other of the source and the drain is electrically connected to the wiring 133, and a gate is electrically connected to a wiring from which the potential PR is supplied. One of a source and a drain of the transistor 155 is electrically connected to the node FD[n+1], the other of the source and the drain is electrically connected to the wiring 134, and a gate is electrically connected to a wiring from which the potential PR is supplied.

When the transistor 154 is provided besides the transistor 122, a time required for the reset operation can be shortened. Accordingly, the operation speed of the imaging device 100 can be increased. When at least one of the transistor 122, the transistor 126, the transistor 154, and the transistor 155 can operate, the reset operation can be performed. In this manner, the reliability of the imaging device 100 can be increased.

This embodiment can be implemented in an appropriate combination with any of the structures described in the other embodiments.

Embodiment 3

Figure 15:
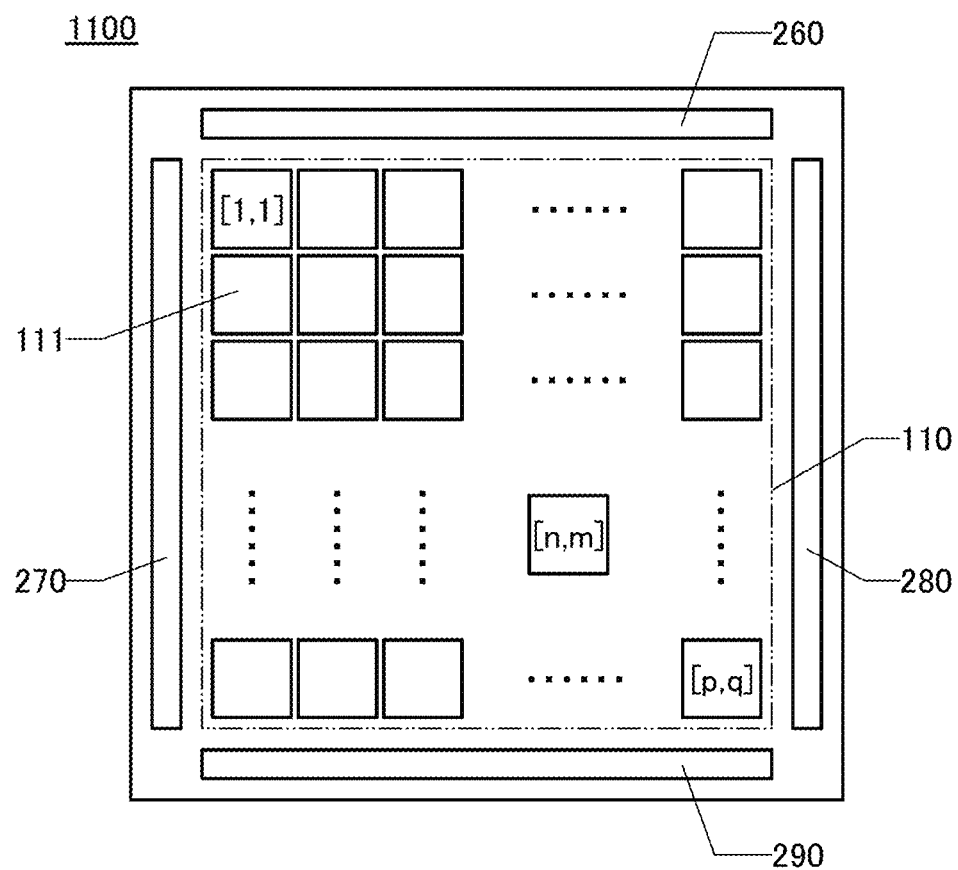
FIG. 15 illustrates a structure example of an imaging device of one embodiment of the present invention.

In this embodiment, an imaging device 1100 of one embodiment of the present invention will be described with reference to drawings. The imaging device 1100 in this embodiment can have a structure that enables the dynamic range to increase more than that of the imaging device 100 described in the above embodiment. FIG. 15 is a plane view illustrating a structure example of the imaging device 1100 of one embodiment of the present invention. The imaging device 1100 can have a structure similar to that of the imaging device 100 described in the above embodiment; however, a subpixel in the pixel 111 has a different structure. In this embodiment, a difference of the imaging device 1100 from the imaging device 100 (a structure of the subpixel) is described. Note that for the structure of the imaging device 1100 that is not specifically described in this embodiment, the description of the imaging device 100 in the above embodiment is referred to.

[Circuit Configuration Example of Subpixel 1112]

A specific circuit configuration example of a subpixel 1112 in the imaging device 1100 is described. In the imaging device 1100, the subpixels 1112 are provided in the pixels 111 in either of the odd-numbered rows or the even-numbered rows, and the subpixels 112 are provided in the pixels in the other of the odd-numbered rows and the even-numbered rows. In this embodiment, the subpixels 1112 are used in the pixels 111I in the odd-numbered rows, and the subpixels 112 are used in the pixels 111 in the even-numbered rows. Thus, n is an odd number greater than or equal to 1 and less than or equal to p in this embodiment.

Figure 16:
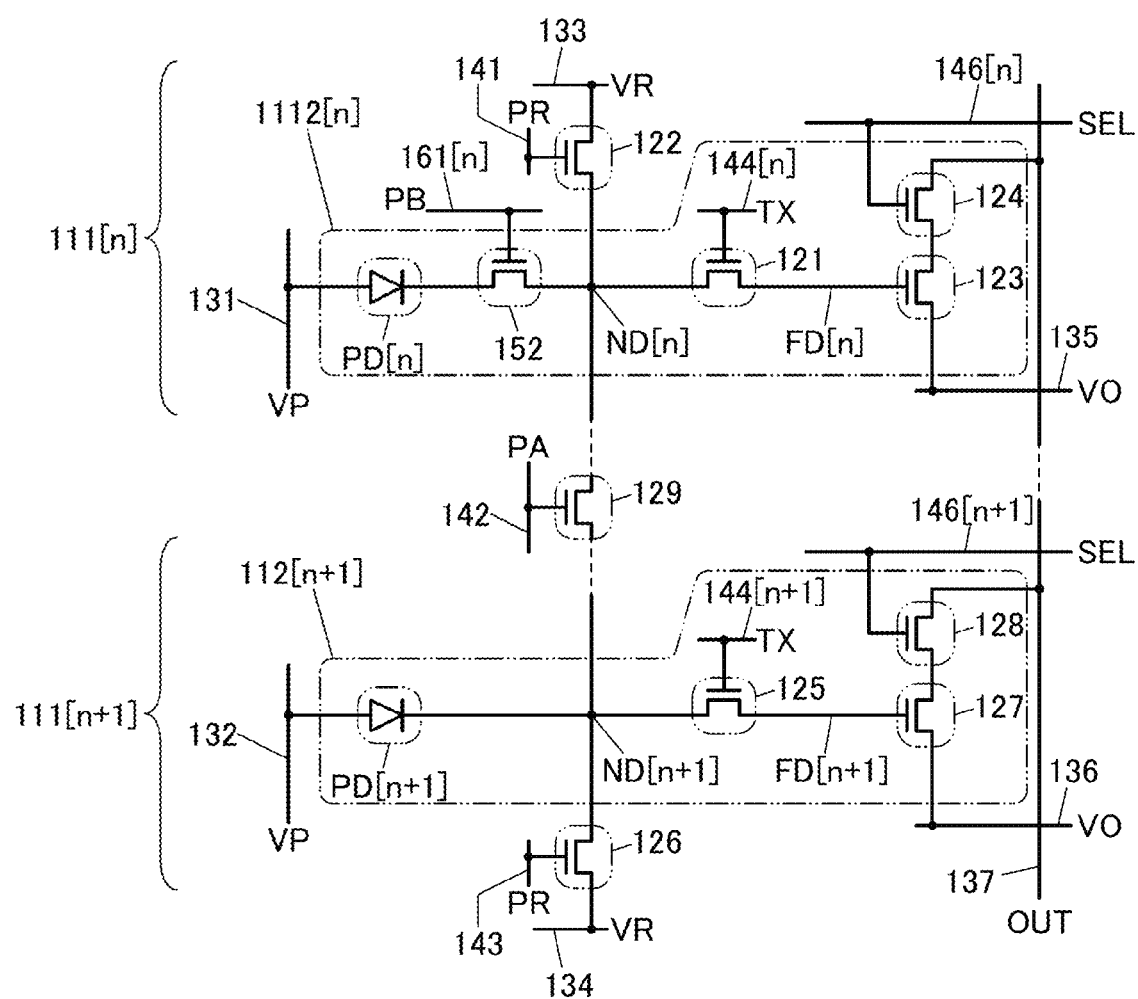
FIG. 16 illustrates a circuit configuration example of a pixel.

The subpixel 1112 has a structure in which a transistor 152 is provided in the subpixel 112 in the above embodiment. FIG. 16 shows a circuit configuration example in which the subpixel 1112[n] in the pixel 111[n] is electrically connected to the subpixel 112[n+1] in the pixel 111[n+1] through the transistor 129.

The subpixel 1112[n] includes the photodiode PD[n] (photoelectric conversion element), the transistor 121, the transistor 123, the transistor 124, and the transistor 152. In the subpixel 1112[n] shown in FIG. 16, one of an anode and a cathode of the photodiode PD[n] is electrically connected to the wiring 131 from which the potential VP is supplied. The other of the anode and the cathode of the photodiode PD[n] is electrically connected to one of a source and a drain of the transistor 152. The other of the source and the drain of the transistor 152 is electrically connected to the node ND[n]. A gate of the transistor 152 is electrically connected to a wiring 161[n] from which a potential PB can be supplied.

Although an n-channel transistor is used as the transistor 152 in FIG. 16, a p-channel transistor can also be used. The other part of the structure is similar to that of the imaging device 100; thus, the detailed description in this embodiment is omitted.

The imaging device 1100 can capture an image with a normal GS driving method as in the case of the imaging device 100, under a condition where the transistor 129 is turned off and the transistor 152 is turned on. Furthermore, the imaging device 1100 can capture an image with a high-speed GS driving method as in the case of the imaging device 100, under a condition where the transistor 129 and the transistor 152 are turned on. Furthermore, under a condition where the transistor 129 is turned on and the transistor 152 is turned off, the imaging device 1100 can capture an image with a high-speed GS driving method in which output saturation is less likely to occur even when the amount of light incident on a light-receiving element is large. In other words, the imaging device 1100 is capable of capturing images accurately by a high-speed GS driving method even when the amount of light incident on a light-receiving element is large. The imaging device 1100 can enables the dynamic range to increase more than the imaging device 100.

Operation Example 3

Figure 17:
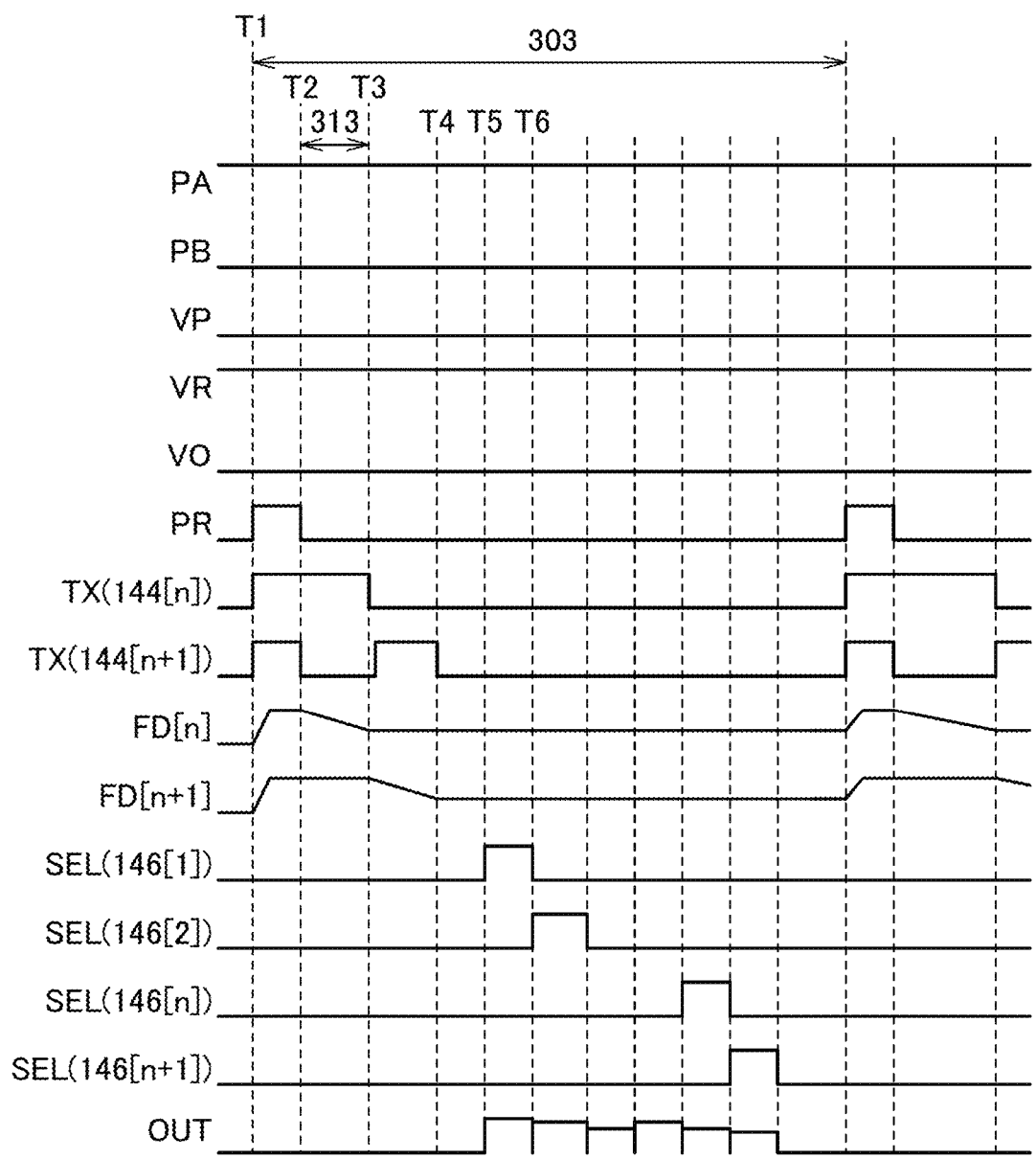
FIG. 17 is a timing chart showing an example of image-capturing operation.
Figure 18:
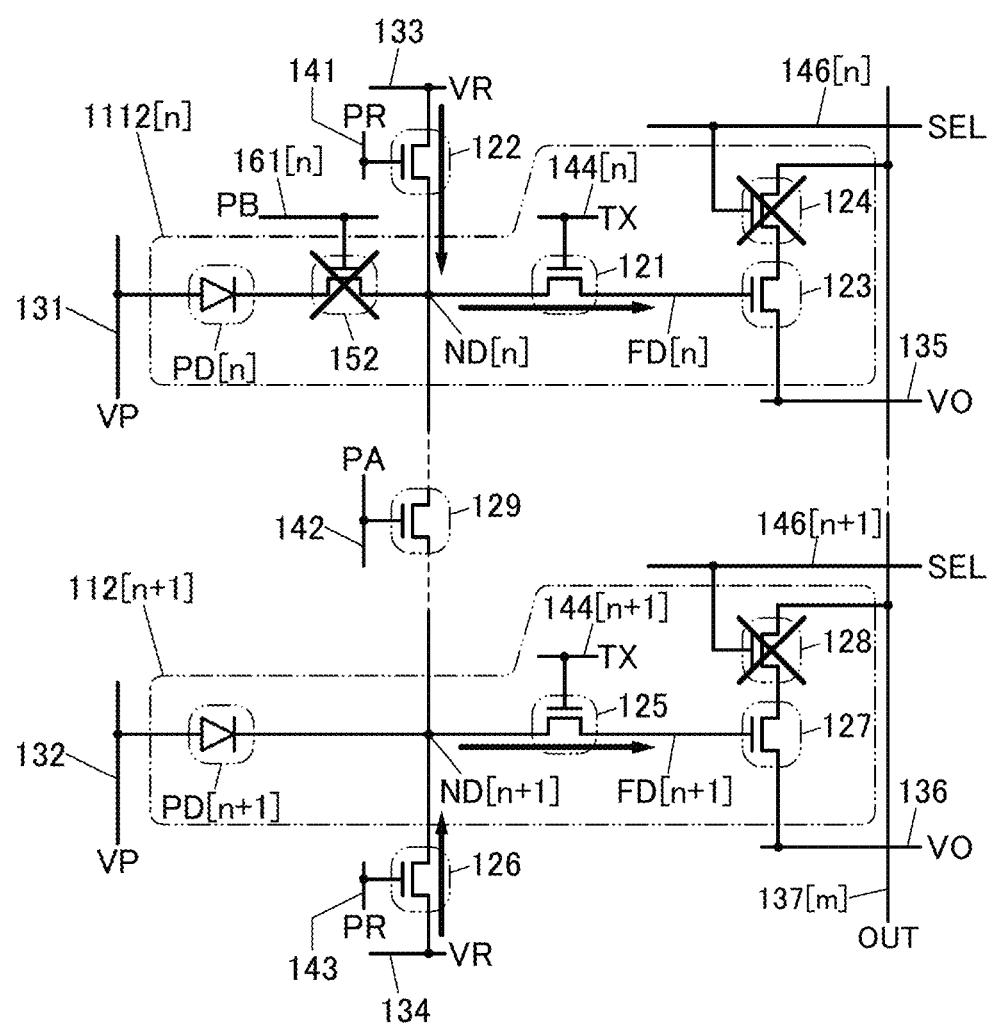
FIG. 18 is a circuit diagram showing an example of image-capturing operation.
Figure 19:
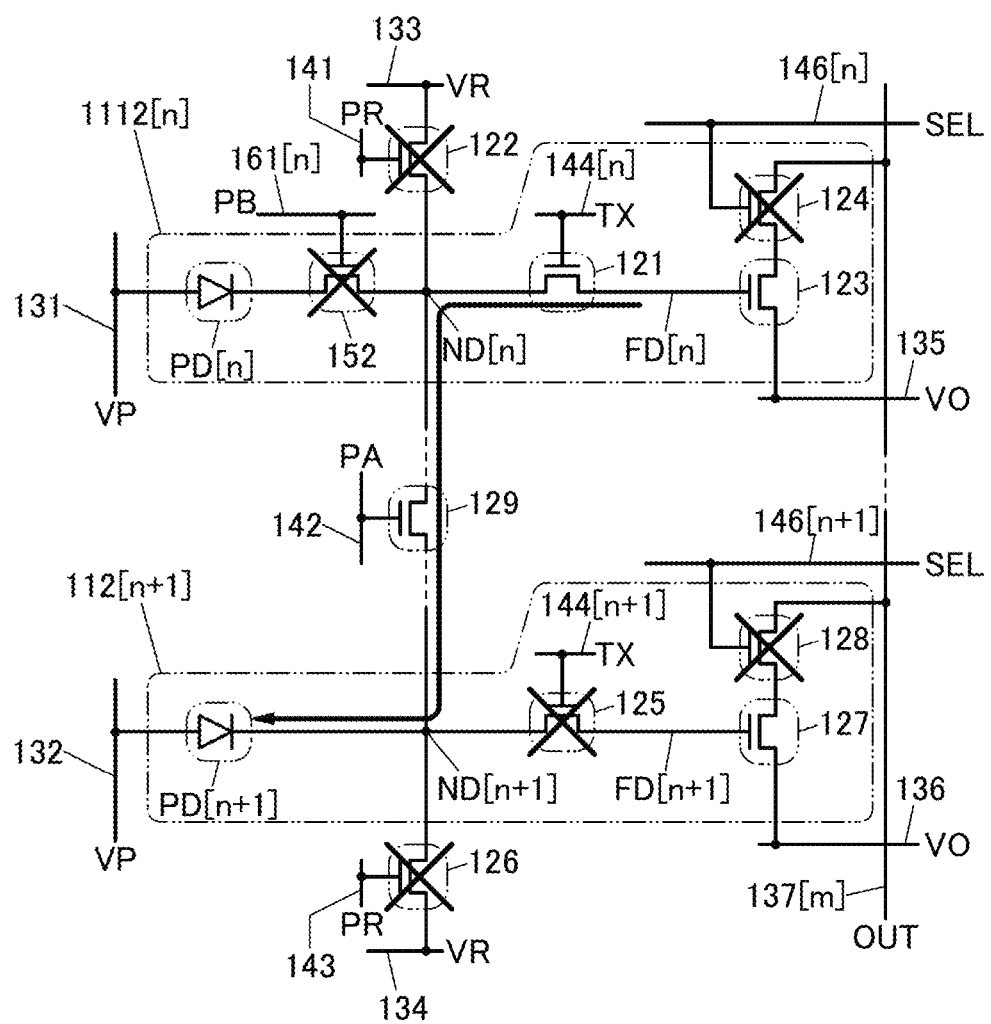
FIG. 19 is a circuit diagram showing an example of image-capturing operation.

Next, an operation example of the imaging device 1100 capable of high-speed image capturing in which output saturation is less likely to occur even under a large amount of light is described with reference to FIG. 17, FIG. 18, FIG. 19, FIG. 20, and FIG. 21. FIG. 17 is a timing chart showing an operation of the subpixel 1112, and FIG. 18, FIG. 19, FIG. 20, and FIG. 21 are each a circuit diagram showing an operation state of the subpixel 1112.

A frame period in Operation Example 3 is referred to as a period 303 in FIG. 17. The period 303 corresponds to the sum of times required for the reset operation, the accumulation operation, and the operation of reading data from pixels in all rows.

[Reset Operation]

First, at a time T1, the potential PB is set at L potential. The potential PR and the potential TX are each set at H potential. Thus, the transistor 152 is turned off, the transistor 121 and the transistor 122 are turned on, and the node ND[n] and the node FD[n] are each set at H potential. In addition, the transistor 125 and the transistor 126 are turned on, and the node ND[n+1] and the node FD[n+1] are each set at H potential. Through this operation, the amount of charges stored at the node FD[n] and the node FD[n+1] is reset (see FIG. 18).

Furthermore, since the transistor 129 is in an on state as in the case of Operation Example 2, either the transistor 122 or the transistor 126 may be in an off state during the reset period. Although not shown, all of the nodes FD[n] and the nodes FD[n+1] in the imaging device 1100 are reset in the reset period.

[Accumulation Operation]

Next, at a time T2, the potential PR is set at L potential. The potential TX supplied to the wiring 144[n+1] is set at L potential. The potential TX supplied to the wiring 144[n] remains at H potential. At the time T2, the reverse bias is applied to the photodiode PD[n+1]. When light enters the photodiode PD[n+1] to which the reverse bias is applied, current flows from one of electrodes to the other electrodes in the photodiode PD[n+1](see FIG. 19). The amount of current at this stage changes depending on the intensity of light, as described. Thus, as the intensity of light is higher, the amount of change in potential of the node FD[n] increases, and as the intensity of light is lower, the amount of change decreases.

Figure 20:
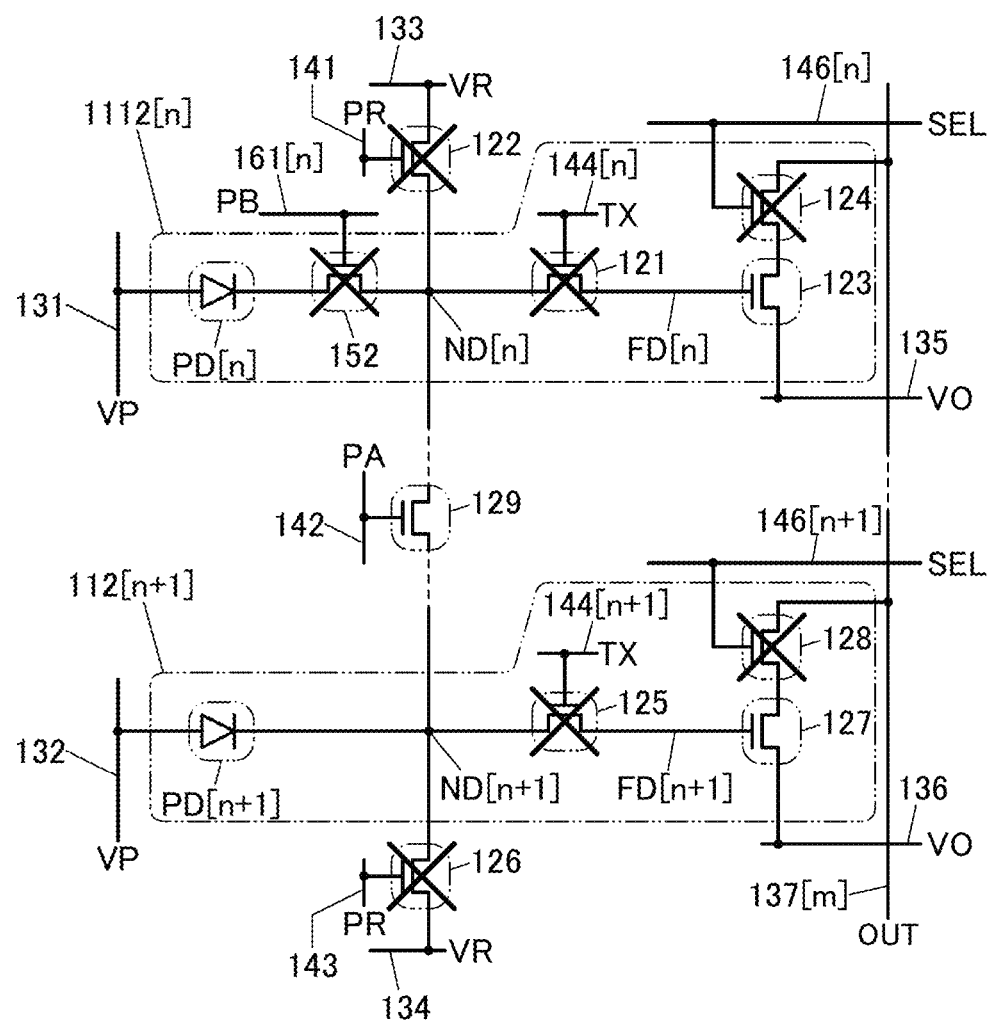
FIG. 20 is a circuit diagram showing an example of image-capturing operation.

Next, at a time T3, the potential TX supplied to the wiring 144[n] is set at L potential, whereby the transistor 121 is turned off and the potential of the node FD[n] is determined (see FIG. 20).

Figure 21:
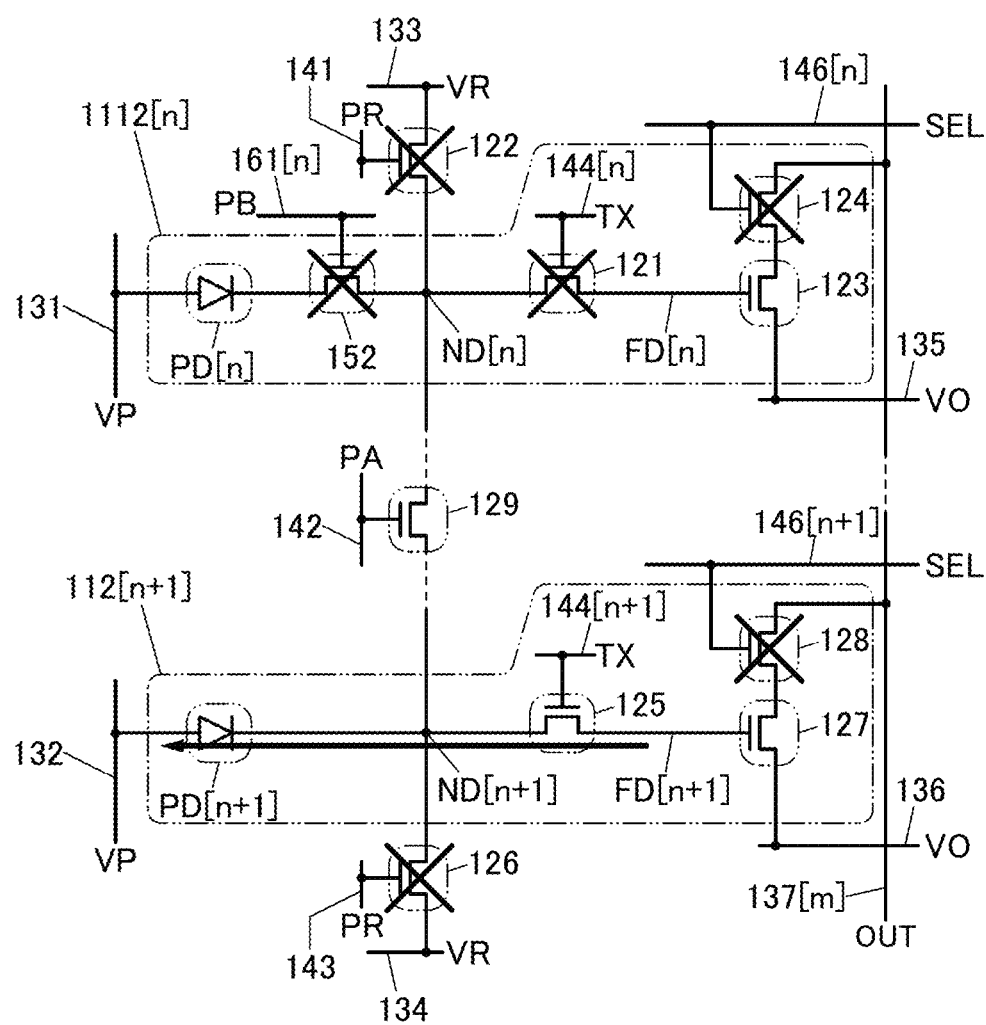
FIG. 21 is a circuit diagram showing an example of image-capturing operation.

At the time T3, the potential TX supplied to the wiring 144[n+1] is set at H potential, whereby the potential of the node FD[n+1] changes depending on the amount of light received by the photodiode PD[n+1](see FIG. 21).

Next, at a time T4, the potential TX supplied to the wiring 144[n+1] is set at L potential, whereby the transistor 121 is turned off, and the potential of the node FD[n+1] is determined. Note that the exposure period in Operation Example 3 is referred to as a period 313 in FIG. 17.

The accumulation operation in the (n+1)-th row is performed without performance of the reset operation after the accumulation operation in the n-th row, so that the frame period can be shortened.

[Reading Operation]

The reading operation can be conducted in a manner similar to that of Operation Example 1 in the above embodiment.

Unlike Operation example 2, only the photodiode PD[n+1] is used and the photodiode PD[n] is not used in Operation Example 3, which rarely causes output saturation that is likely to occur when the amount of light incident on the light-receiving element is large.

Note that the driving method shown in Operation Example 3 in this specification and the like is called high-illuminance high-speed operation GS driving method. The imaging device 1100 described in this embodiment can capture images with a normal GS driving method, a high-speed operation GS driving method, and a high-illumination high-speed operation GS driving method. According to one embodiment of the present invention, an imaging device capable of high-speed image capturing with a large dynamic range can be provided.

Figure 22:
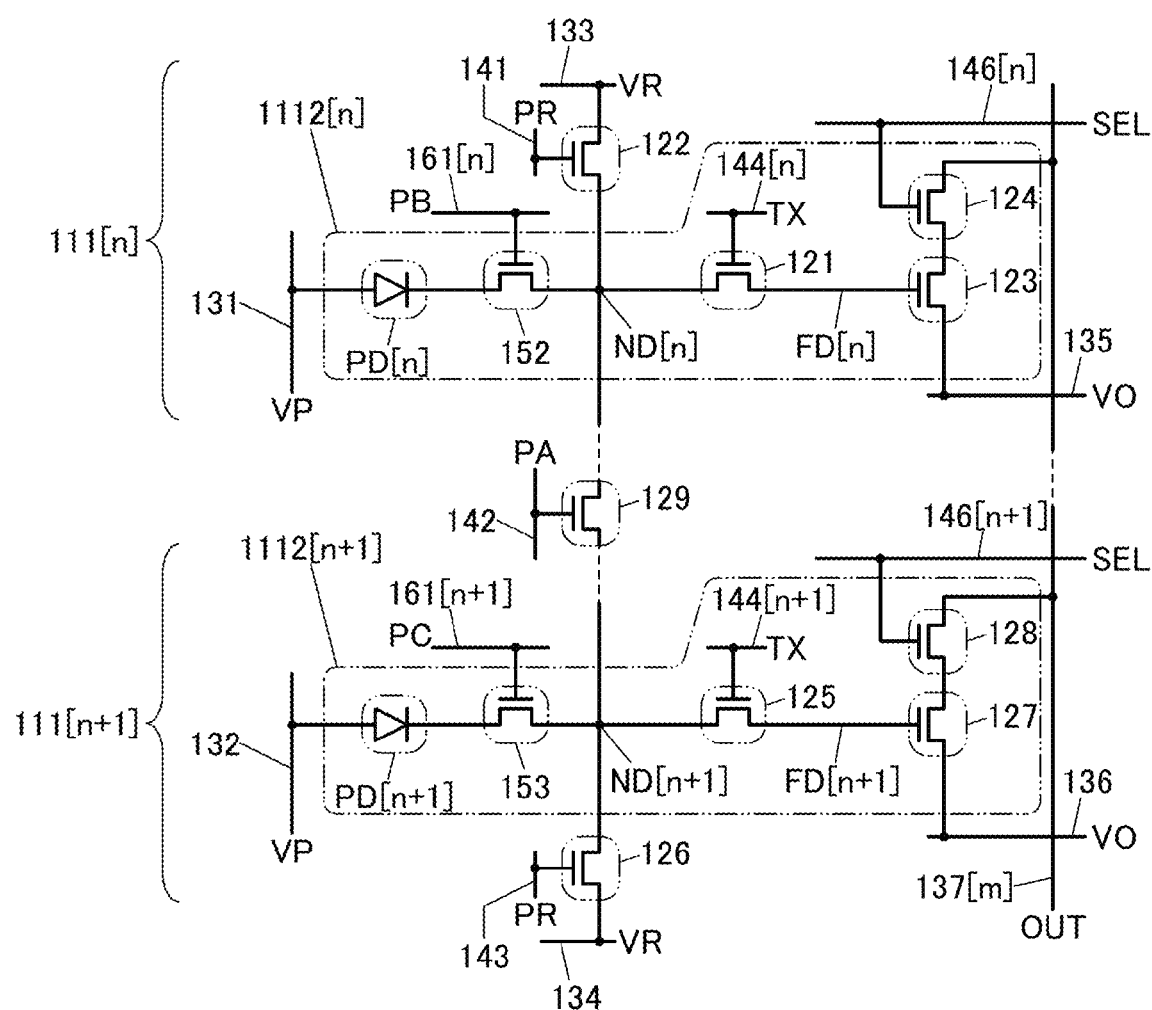
FIG. 22 illustrates a circuit configuration example of a pixel.

As shown in FIG. 22, as the subpixel in the pixel 111[n+1], the subpixel 112[n+1] may be provided. The subpixel 1112[n+1] shown in FIG. 22 has a structure in which a transistor 153 is provided in the subpixel 112 described in the above embodiment.

In the subpixel 1112[n+1] shown in FIG. 22, one of an anode and a cathode of the photodiode PD[n+1] is electrically connected to the wiring 132 from which the potential VP can be supplied. The other of the anode and the cathode of the photodiode PD[n+1] is electrically connected to one of a source and a drain of the transistor 153. The other of the source and the drain of the transistor 153 is electrically connected to the node ND[n+1]. A gate of the transistor 153 is electrically connected to the wiring 161[n+1] from which a potential PC can be supplied.

As shown in FIG. 22, the transistor 153 is provided in addition to the transistor 152, whereby the photodiode PD[n+1] can be used, instead of the photodiode PD[n], for the high-illumination high-speed operation GS driving method. The photodiode is switched as appropriate between the photodiode PD[n] and the photodiode PD[n+1] in the high-illumination high-speed operation GS driving method, so that a deterioration of the photodiode can be reduced, and the reliability of the imaging device can be improved.

Although an n-channel transistor is used as the transistor 152 in FIG. 22, a p-channel transistor can be used.

This embodiment can be implemented in an appropriate combination with any of the structures described in the other embodiments.

Embodiment 4

Figure 23:
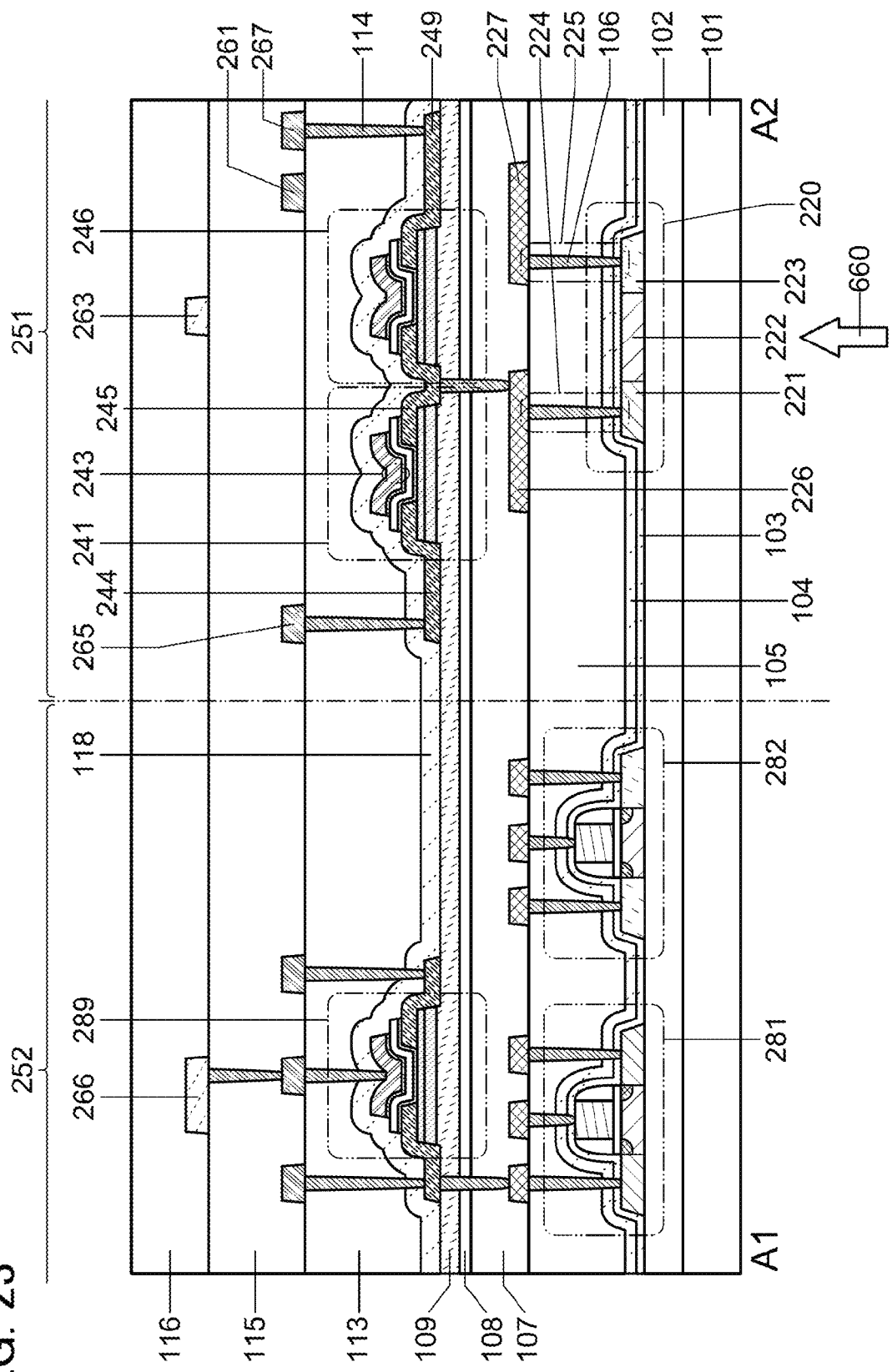
FIG. 23 illustrates a structure example of an imaging device.
Figure 24:
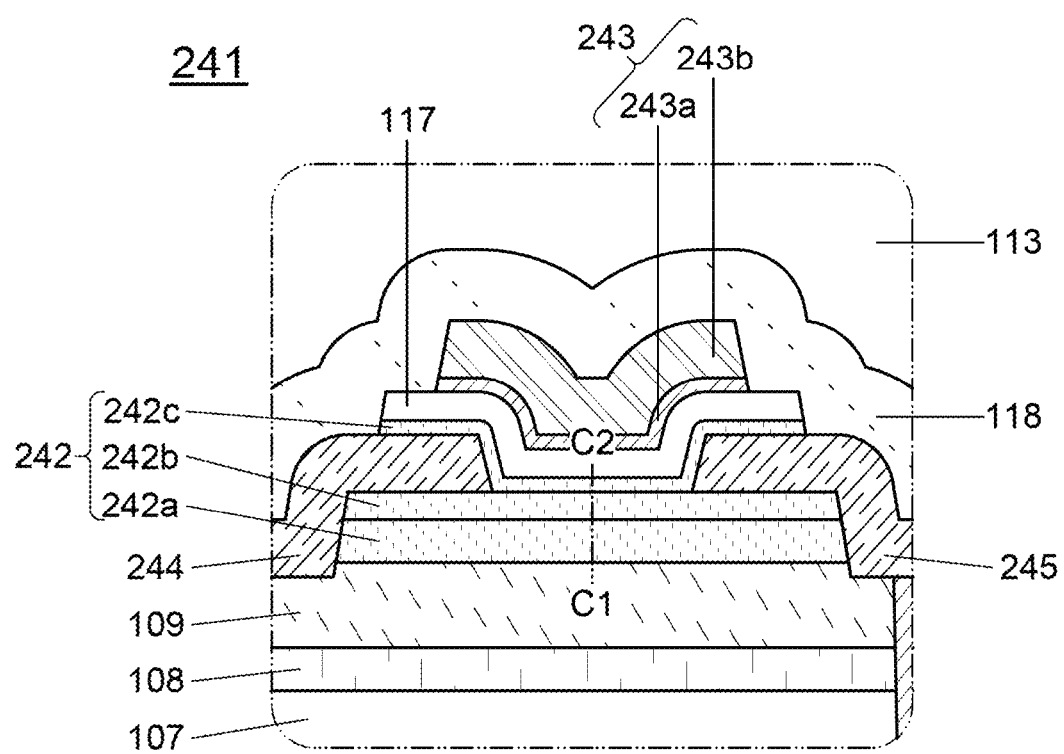
FIG. 24 illustrates an example of a transistor.

In this embodiment, an example in which the imaging device 100 includes a CMOS image sensor that is a type of solid-state image sensor is described with reference to FIG. 23, FIG. 24, FIG. 25, and FIGS. 26A and 26B. A pixel region 251 shown in FIG. 23 as a cross-sectional view corresponds to part of the pixel 111 in the imaging device 100. A peripheral circuit region 252 shown in FIG. 23 as a cross-sectional view corresponds to part of a peripheral circuit in the imaging device 100. FIG. 24 is an enlarged view of a transistor 241 in FIG. 23. FIG. 26A is an enlarged view of a transistor 281 in FIG. 23. FIG. 26B is an enlarged view of a transistor 282 in FIG. 23.

The imaging device 100 described in this embodiment includes an insulating layer 102 over a substrate 101, and a photoelectric conversion element 220 having a pin junction over the insulating layer 102. The photoelectric conversion element 220 includes a p-type semiconductor layer 221, an i-type semiconductor layer 222, and an n-type semiconductor layer 223. When seen in a plan view, the photoelectric conversion element 220 has a structure in which the i-type semiconductor layer 222 is sandwiched between the p-type semiconductor layer 221 and the n-type semiconductor layer 223. Note that the photoelectric conversion element 220 may be formed with the p-type semiconductor layer 221 and the n-type semiconductor layer 223 without the i-type semiconductor layer 222. When the i-type semiconductor layer 222 is provided in the photoelectric conversion element 220, the photosensitivity can be increased. The photoelectric conversion element 220 described in this embodiment can function as the photodiode PD described in the above embodiment.

Note that an intrinsic semiconductor (i-type semiconductor) is ideally a semiconductor which does not include impurities and whose Fermi level lies substantially in the middle of the forbidden band, but in this specification and the like, a semiconductor to which an impurity serving as a donor or an impurity serving as an acceptor is added and whose Fermi level lies substantially in the middle of the forbidden band is also included in the category of the intrinsic semiconductor. Even when a semiconductor includes an impurity serving as a donor or an impurity serving as an acceptor, the semiconductor is included in the category of intrinsic semiconductors as long as the semiconductor can function as an intrinsic semiconductor.

Note that the substrate 101 may be a glass substrate, a quartz substrate, a sapphire substrate, a ceramic substrate, a metal substrate, a semiconductor substrate, or the like. Alternatively, a plastic substrate having heat resistance to the processing temperature of this embodiment may be used. Examples of the substrate include a semiconductor substrate (e.g., a single crystal substrate or a silicon substrate), a silicon on insulator (SOI) substrate, a glass substrate, a quartz substrate, a plastic substrate, a metal substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, a soda lime glass substrate, or the like can be given.

After the photoelectric conversion element 220 and the pixel circuit 230 are formed, the substrate 101 may be removed by a mechanical polishing method, an etching method, or the like. In the case where the substrate 101 is left, a material that transmits light sensed by the photoelectric conversion element 220 may be used for the substrate 101.

The insulating layer 102 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 102 can be formed by a sputtering method, a CVD method, a thermal oxidation method, a coating method, a printing method, or the like.

Formation of the p-type semiconductor layer 221, the i-type semiconductor layer 222, and the n-type semiconductor layer 223 may be performed in the following manner: an island-shaped i-type semiconductor layer 222 is formed over the insulating layer 102, a mask is formed over the i-type semiconductor layer 222, and an impurity element is selectively introduced into part of the i-type semiconductor layer 222. The introduction of the impurity element may be performed by an ion implantation method with mass separation or an ion doping method without mass separation, for example. The mask is removed after the impurity element is added.

The p-type semiconductor layer 221, the i-type semiconductor layer 222, and the n-type semiconductor layer 223 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon, microcrystalline germanium, or the like can be used. Alternatively, a compound semiconductor such as silicon carbide or gallium arsenide can be used.

In the case where silicon is used as a material for formation of the p-type semiconductor layer 221, the i-type semiconductor layer 222, and the n-type semiconductor layer 223, Group 13 elements can be used, for example, as a p-type impurity element. As an n-type impurity element, Group 15 elements can be used for example.

In the case where the semiconductor layers are formed using an SOI, for example, the insulating layer 102 may be a buried oxide (BOX) layer.

The imaging device 100 in this embodiment includes an insulating layer 103 and an insulating layer 104 over the p-type semiconductor layer 221, the i-type semiconductor layer 222, and the n-type semiconductor layer 223. The insulating layer 103 and the insulating layer 104 can be formed using a material and a method similar to those of the insulating layer 102. Either the insulating layer 103 or the insulating layer 104 may not be provided, or an insulating layer in which three or more layers are stacked may be provided.

The imaging device 100 in this embodiment includes an insulating layer 105 with a flat surface over the insulating layer 104. The insulating layer 105 can be formed using a material and a method similar to those of the insulating layer 102. For the insulating layer 105, a low-dielectric constant material (a low-k material), a siloxane-based resin, PSG (phosphosilicate glass), BPSG (borophosphosilicate glass), or the like may be used. The surface of the insulating layer 105 may be subjected to chemical mechanical polishing (CMP) treatment (hereinafter, referred to as CMP treatment). By the CMP treatment, unevenness of the surfaces can be reduced, and coverage with an insulating layer or a conductive layer to be formed later can be increased.

In a region including the insulating layer 103 to the insulating layer 105 which overlaps with the p-type semiconductor layer 221, an opening 224 is formed, and in a region including the insulating layer 103 to the insulating layer 105 which overlaps with the n-type semiconductor layer 223, an opening 225 is formed. Contact plugs 106 are formed in the opening 224 and the opening 225. The contact plugs 106 are each formed by embedding a conductive material in an opening (via) provided in the insulating layer. As the conductive material, a conductive material with high embeddability such as tungsten or polysilicon can be used. Although not illustrated, a side surface and a bottom surface of the material can be covered with a barrier layer (a diffusion prevention layer) of a titanium layer, a titanium nitride layer, a stacked-layer layer of these layers, or the like. In this case, the barrier layer is regarded as part of the contact plug in some cases.

Over the insulating layer 105, an electrode 226 and an electrode 227 are formed. The electrode 226 is electrically connected to the p-type semiconductor layer 221 in the opening 224 via the contact plug 106. The electrode 227 is electrically connected to the n-type semiconductor layer 223 in the opening 225 via the contact plug 106.

An insulating layer 107 is formed to cover the electrode 226 and the electrode 227. The insulating layer 107 can be formed using a material and a method that are similar to those of the insulating layer 105. Furthermore, the surface of the insulating layer 107 may be subjected to CMP treatment. By the CMP treatment, unevenness of the surfaces can be reduced, and coverage with an insulating layer or a conductive layer to be formed later can be increased.

The electrode 226 and the electrode 227 can be formed with a single-layer structure or a stacked-layer structure using any of metals such as aluminum, titanium, chromium, nickel, copper, yttrium, zirconium, molybdenum, manganese, silver, tantalum, and tungsten, or an alloy containing any of these metals as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a tungsten film, a copper film, and a tungsten film are stacked in this order; and the like can be given. Alternatively, an alloy film or a nitride film which contains aluminum and one or more elements selected from titanium, tantalum, tungsten, molybdenum, chromium, neodymium, and scandium may be used.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The photoelectric conversion element 220 senses the light 660 incident on the insulating layer 102 side.

The transistor included in the pixel 111 may be provided to overlap with the photoelectric conversion element. In FIG. 23, the transistor 241 and a transistor 246 are provided above the photoelectric conversion element 220. Specifically, the transistor 241 and the transistor 246 are formed over the insulating layer 107 with an insulating layer 108 and an insulating layer 109 interposed therebetween.

In this embodiment, the transistor 241, the transistor 246 and a transistor 289 are each a top-gate transistor; however, a bottom-gate transistor may be employed.

As the above transistors, an inverted staggered transistor or a forward staggered transistor can also be used. It is also possible to use a dual-gate transistor, in which a semiconductor layer in which a channel is formed is interposed between two gate electrodes. Further, the transistor is not limited to a transistor having a single-gate structure; a multi-gate transistor having a plurality of channel formation regions, such as a double-gate transistor may be used.

As the transistors, a transistor with any of a variety of structures such as a planar type, a FIN-type, and a Tri-Gate type can be used.

The transistors may have the same structure or different structures. Note that the size (e.g., channel length and channel width) or the like of each transistor may be adjusted as appropriate.

In the case where all of the plurality of transistors in the imaging device 100 have the same structure, the transistors can be formed concurrently in the same process.

The transistor 241 includes an electrode 243 that can function as a gate electrode an electrode 244 that can function as one of a source electrode and a drain electrode, an electrode 245 that can function as the other of the source electrode and the drain electrode, an insulating layer 117 that can function as a gate insulating layer, and a semiconductor layer 242 (see FIG. 24).

Note that in FIG. 23, both of the electrode that function as the other of the source electrode and the drain electrode of the transistor 241 and the electrode that can function as one of the source electrode and the drain electrode of the transistor 246 are formed using the electrode 245. Note that one embodiment of the present invention is not limited thereto. The electrode that function as the other of the source electrode and the drain electrode of the transistor 241 and the electrode that can function as one of the source electrode and the drain electrode of the transistor 246 may be formed using different electrodes.

The insulating layer 108 is preferably formed using an insulating film that has a function of preventing diffusion of impurities such as oxygen, hydrogen, water, an alkali metal, or an alkaline earth metal. Examples of the insulating film include silicon oxide, silicon oxynitride, silicon nitride, silicon nitride oxide, gallium oxide, hafnium oxide, yttrium oxide, aluminum oxide, aluminum oxynitride, and the like. When the insulating film is formed using silicon nitride, gallium oxide, hafnium oxide, yttrium oxide, aluminum oxide, or the like, diffusion of impurities from the photoelectric conversion element 220 side to the semiconductor layer 242 can be reduced. Note that the insulating layer 108 can be formed by a sputtering method, a CVD method, an evaporation method, a thermal oxidation method, or the like. The insulating layer 108 can be formed with a single-layer structure or a stacked-layer structure of any of these materials.

The insulating layer 109 can be formed using a material and a method similar to those of the insulating layer 102. In the case where an oxide semiconductor is used for the semiconductor layer 242, an insulating layer containing oxygen in excess of the stoichiometric composition is preferably used for the insulating layer 108. From the insulating layer containing oxygen more than that in the stoichiometric composition, part of oxygen is released by heating. The insulating layer containing oxygen more than that in the stoichiometric composition is an insulating layer in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

The insulating layer containing oxygen more than that in the stoichiometric composition can be formed through a treatment in which oxygen is added to an insulating layer. The treatment for adding oxygen can be performed by heat treatment in an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

Each semiconductor layer in the transistor 241, the transistor 246, the transistor 289, and the like can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon, microcrystalline germanium, or the like can be used. Alternatively, a compound semiconductor such as silicon carbide, gallium arsenide, an oxide semiconductor, or a nitride semiconductor, an organic semiconductor, or the like can be used.

In this embodiment, an example in which an oxide semiconductor is used for the semiconductor layer 242 is described. Furthermore, in this embodiment, a case where the semiconductor layer 242 is a stacked layer including a semiconductor layer 242a, a semiconductor layer 242b, and a semiconductor layer 242c is described.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of elements selected from Al, Ti, Ga, Y, Zr, La, Ce, Nd, and Hf and corresponds to a metal element whose strength of bonding with oxygen is higher than that of In).

The semiconductor layer 242a and the semiconductor layer 242c are preferably formed using a material containing one or more kinds of metal elements contained in the semiconductor layer 242b. With use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

Each of the thicknesses of the semiconductor layer 242a and the semiconductor layer 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, further preferably greater than or equal to 3 nm and less than or equal to 50 nm.

In the case where the semiconductor layer 242b is an In-M-Zn oxide and the semiconductor layer 242a and the semiconductor layer 242c are each an In-M-Zn oxide, the semiconductor layer 242a and the semiconductor layer 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layer 242a, the semiconductor layer 242c, and the semiconductor layer 242b are determined so that $y_1/x_1$ is large than $y_2/x_2$. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. At this time, $y_1$ is preferably greater than or equal to $x_1$ in the semiconductor layer 242b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than that in the semiconductor layer 242b.

In the case where the semiconductor layer 242a and the semiconductor layer 242c are each an In-M-Zn oxide, the percentages of contained In and an element M, not taking Zn and O into consideration, is preferably as follows: the content percentage of In is lower than 50 atomic % and the percentage of M is higher than or equal to 50 atomic %. The content percentages of In and M are further preferably as follows: the content percentage of In is lower than 25 atomic % and the content percentage of M is higher than or equal to 75 atomic %. In the case of using an In-M-Zn oxide for semiconductor layer 242b, the content percentages of In and element M, not taking Zn and O into consideration, are preferably such that the percentage of In is higher than or equal to 25 atomic % and the percentage of M is lower than 75 atomic %. The content percentages In and element M are further preferably such that the percentage of In is higher than or equal to 34 atomic % and the percentage of M is lower than 66 atomic %.

For example, an In—Ga—Zn oxide which is formed using a target having an atomic ratio of In:Ga:Zn=1:3:2, 1:3:4, 1:3:6, 1:6:4, or 1:9:6 or an In—Ga oxide which is formed using a target having an atomic ratio of In:Ga=1:9 can be used for each of the semiconductor layer 242a and the semiconductor layer 242c containing In or Ga. Furthermore, an In—Ga—Zn oxide which is formed using a target having an atomic ratio of In:Ga:Zn=3:1:2, 1:1:1, 5:5:6, or 4:2:4.1 can be used for the semiconductor layer 242b. Note that the atomic ratio of each of the semiconductor layer 242a and the semiconductor layer 242b may vary within a range of ±20% of any of the above-described atomic ratios as an error.

In order to give stable electrical characteristics to the transistor including the semiconductor layer 242b, it is preferable that impurities and oxygen vacancies in the semiconductor layer 242b be reduced to obtained a highly purified semiconductor layer; accordingly, the semiconductor layer 242b can be regarded as an intrinsic or substantially intrinsic semiconductor layer. Furthermore, it is preferable that at least the channel formation region of the semiconductor layer 242b be regarded as an intrinsic or substantially intrinsic semiconductor layer.

Note that the substantially intrinsic oxide semiconductor layer refers to an oxide semiconductor layer in which the carrier density is lower than $1\times10^{17}/cm^3$, lower than $1\times10^{15}/cm^3$, or lower than $1\times10^{13}/cm^3$.

[Energy Band Structure of Oxide Semiconductor]

Figure 25:
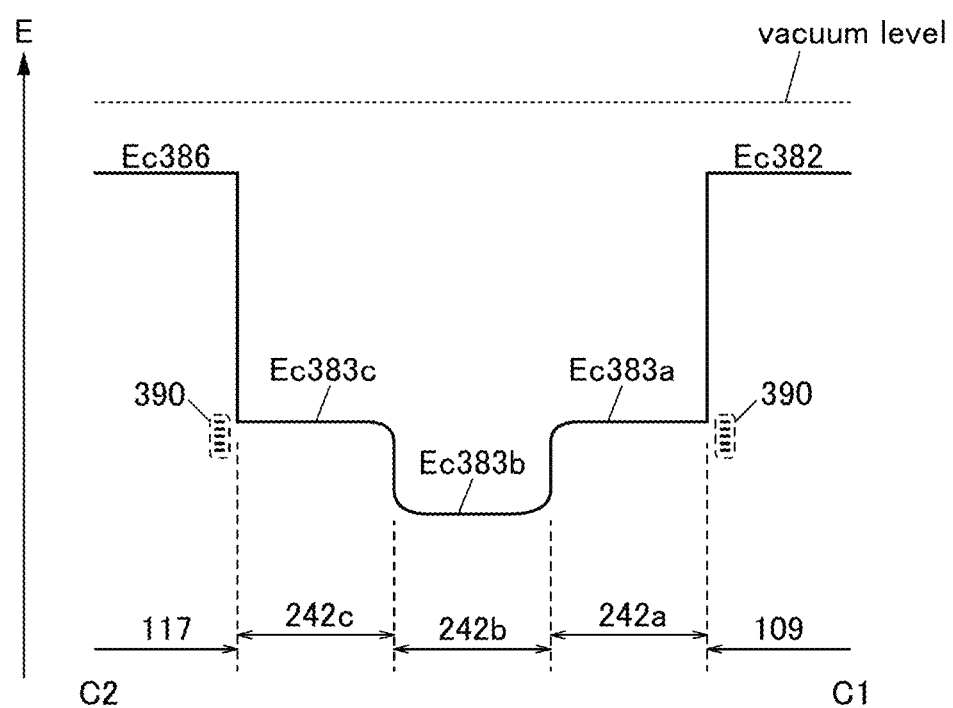
FIG. 25 shows an energy band structure.
Figure 26A:
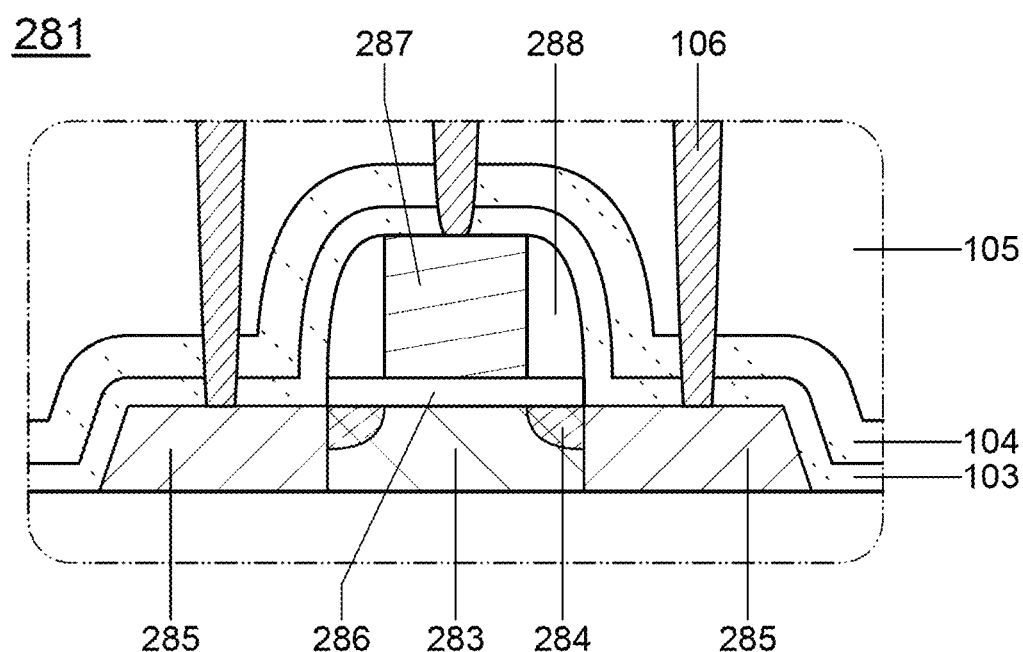
FIGS. 26A and 26B each illustrate an example of a transistor.
Figure 26B:
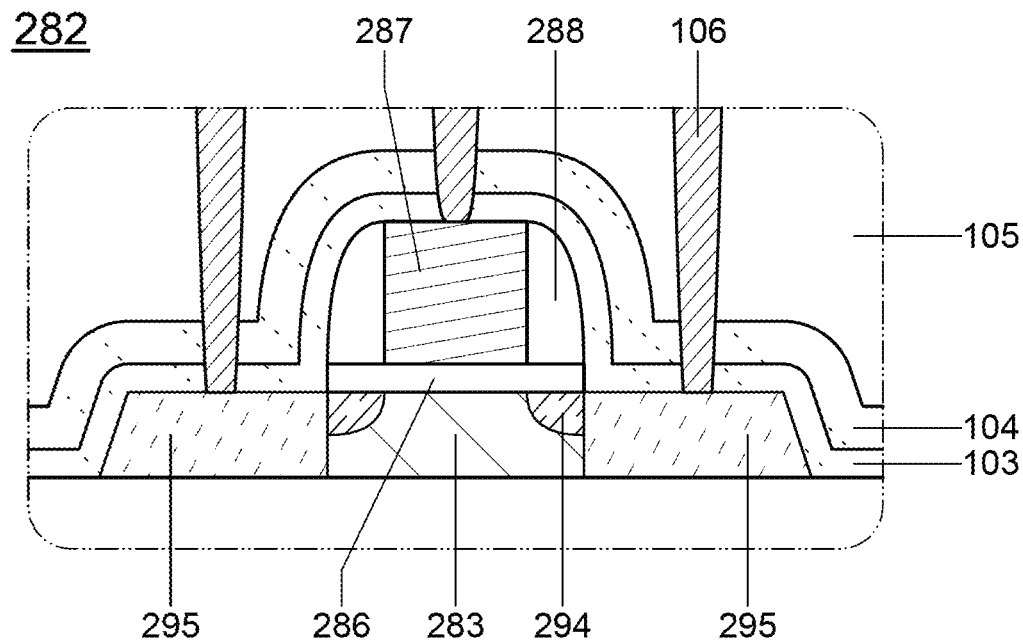

The function and effect of the semiconductor layer 242 that is a stacked layer including the semiconductor layer 242a, the semiconductor layer 242b, and the semiconductor layer 242c is described with an energy band structure diagram shown in FIG. 25. FIG. 25 is the energy band structure diagram showing a portion along dashed-dotted line C1-C2 in FIG. 24. Thus, FIG. 25 shows the energy band structure of a channel formation region of the transistor 241.

In FIG. 25, Ec382, Ec383a, Ec383b, Ec383c, and Ec386 are the energies of bottoms of the conduction band in the insulating layer 109, the semiconductor layer 242a, the semiconductor layer 242b, the semiconductor layer 242c, and the insulating layer 117, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 109 and the insulating layer 117 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the semiconductor layer 242a and the semiconductor layer 242b and the vicinity of the interface between the semiconductor layer 242b and the semiconductor layer 242c, mixed regions are formed; thus, the energy of the bottom of the conduction band continuously changes. In other words, no state or few states exist at these interfaces.

Accordingly, electrons transfer mainly through the semiconductor layer 242b in the stacked-layer structure having the above energy band structure. Therefore, even when an interface state exists at an interface between the semiconductor layer 242a and the insulating layer 107 or an interface between the semiconductor layer 242c and the insulating layer 117, the interface state hardly influences the transfer of the electrons. In addition, the interface state does not exist or hardly exists at an interface between the semiconductor layer 242a and the semiconductor layer 242b and at an interface between the semiconductor layer 242c and the semiconductor layer 242b; thus, transfer of electrons are not prohibited in the region. Consequently, the transistor 241 having the above stacked oxide semiconductors can have high field-effect mobility.

Note that although trap states 390 due to impurities or defects might be formed in the vicinity of the interface between the semiconductor layer 242a and the insulating layer 109 and in the vicinity of the interface between the semiconductor layer 242c and the insulating layer 117 as shown in FIG. 24, the semiconductor layer 242b can be separated from the trap states owing to the existence of the semiconductor layer 242a and the semiconductor layer 242c.

In particular, in the transistor 241 described in this embodiment, an upper surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layer 242a and the semiconductor layer 242c, whereby the influence of the trap state can be further reduced.

However, in the case where an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be greater than or equal to 0.1 eV, further preferably greater than or equal to 0.15 eV, in which case a change in the threshold voltage of the transistor can be reduced and the transistor can have favorable electrical characteristics.

Each of the band gaps of the semiconductor layer 242a and the semiconductor layer 242c is preferably larger than that of the semiconductor layer 242b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more, therefore, a transistor including an oxide semiconductor in a semiconductor layer in which a channel is formed has an extremely small amount of off-state current. Specifically, the off-state current per micrometer of channel width at room temperature can be less than $1 \times 10^{-20}$ A, preferably less than $1 \times 10^{-22}$ A, further preferably less than $1 \times 10^{-24}$ A. That is, the on/off ratio of the transistor can be greater than or equal to 20 digits and less than or equal to 150 digits.

With one embodiment of the present invention, a transistor with low power consumption can be provided. Accordingly, a semiconductor device or an imaging device with low power consumption can be provided.

Since the oxide semiconductor has a large band gap, the temperature range of environment where the semiconductor device including an oxide semiconductor can be used is wide. With one embodiment of the present invention, an imaging device or a semiconductor device with a wide temperature range can be provided.

Note that the above-described three-layer structure is an example. For example, a two-layer structure without either one of the semiconductor layer 242a and the semiconductor layer 242c may be employed.

[Oxide Semiconductor]

An oxide semiconductor applicable to the semiconductor layer 242 is described in detail.

In the case of using an oxide semiconductor for the semiconductor layer, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

From the results of the high-resolution cross-sectional TEM image and the high-resolution plan TEM image, alignment is found in the crystal parts in the CAAC-OS film.

In the CAAC-OS film having c-axis alignment, while the directions of a-axes and b-axes are irregularly orientated between crystal parts, the c-axes are aligned in a direction parallel to a normal vector of a formation surface or a normal vector of a top surface.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has small variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With use of the CAAC-OS film in a transistor, variation in the electrical characteristics of the transistor due to irradiation with visible light or ultraviolet light is small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 am, or greater than or equal to 5 am and less than or equal to 50 am in the high-resolution TEM image, for example. Moreover, in the high-resolution TEM image of the polycrystalline oxide semiconductor film, a boundary between crystals may be observed.

The polycrystalline oxide semiconductor film may include a plurality of crystal grains, and alignment of crystals may be different in the plurality of crystal grains.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be used for a transistor which needs to be normally on. Since the amorphous oxide semiconductor film has a high density of defect states, carrier traps might be increased. Consequently, a transistor including the amorphous oxide semiconductor film has larger variation in electric characteristics and lower reliability than a transistor including the CAAC-OS or the nc-OS.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm is regarded to correspond to the a-b plane of the $InGaZnO_4$ crystal, focusing on the lattice fringes in the high-resolution TEM image. Let the maximum length in the region in which the lattice fringes are observed be the size of crystal part of the amorphous-like OS film and the nc-OS film. Note that the crystal part whose size is 0.8 nm or larger is selectively evaluated.

Note that an oxide semiconductor film may be a stacked film including two or more kinds of an amorphous oxide semiconductor film, a microcrystalline oxide semiconductor film, and a CAAC-OS film, for example.

Even when the oxide semiconductor film is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region other than that of the CAAC region is referred to as the proportion of non-CAAC.

As an example of an oxide semiconductor that can be used for the semiconductor layer 242a, the semiconductor layer 242b, and the semiconductor layer 242c, an oxide containing indium can be given. An oxide can have a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element that can increase the energy gap of the oxide, for example. Further, the oxide semiconductor preferably contains zinc. When the oxide contains zinc, the oxide is easily to be crystallized, for example.

Note that the oxide semiconductor is not limited to the oxide containing indium. The oxide semiconductor may be, for example, zinc tin oxide, gallium tin oxide, or gallium, oxide.

For the oxide semiconductor, an oxide with a wide energy gap is used. For example, the energy gap of the oxide semiconductor is greater than or equal to 2.5 eV and less than or equal to 4.2 eV preferably greater than or equal to 2.8 eV and less than or equal to 3.8 eV, further preferably greater than or equal to 3 eV and less than or equal to 3.5 eV.

Influence of impurities in the oxide semiconductor is described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is set to be lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. The concentration of silicon in the oxide semiconductor, which is measured by secondary ion mass spectrometry (SIMS), is preferably lower than $1\times10^{19}$ atoms/cm$^3$, further preferably lower than $5\times10^{18}$ atoms/cm$^3$, still further preferably lower than $2\times10^{18}$ atoms/cm$^3$.

Furthermore, when hydrogen is contained in the oxide semiconductor, the carrier density is increased in some cases. Thus, the concentration of hydrogen in the oxide semiconductor, which is measured by SIMS, can be set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. When nitrogen is contained in the oxide semiconductor, the carrier density is increased in some cases. The concentration of nitrogen in the oxide semiconductor measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In order to reduce the hydrogen concentration in the oxide semiconductor, the hydrogen concentrations in the insulating layer 109 and the insulating layer 117 that are in contact with the semiconductor layer 242 are preferably reduced. The hydrogen concentration in the insulating layer 109 and the insulating layer 117 measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. In order to reduce the nitrogen concentration in the oxide semiconductor, the nitrogen concentrations in the insulating layer 109 and the insulating layer 117 are preferably reduced. The nitrogen concentration in the insulating layer 109 and the insulating layer 117 measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In this embodiment, first, the semiconductor layer 242a is formed over the insulating layer 109, and the semiconductor layer 242b is formed over the semiconductor layer 242a.

Note that the oxide semiconductor layers are each preferably formed by a sputtering method. As a sputtering method, an RF sputtering method, a DC sputtering method, an AC sputtering method, or the like can be used. In some cases, the DC sputtering method and the AC sputtering method enable a uniform film to be formed, as compared with the RF sputtering method.

In this embodiment, as the semiconductor layer 242a, 20-nm-thick In—Ga—Zn oxide is deposited by a sputtering method using an In—Ga—Zn oxide target (In:Ga:Zn=1:3:2). Note that the constituent elements and compositions applicable to the semiconductor layer 242a are not limited thereto.

The oxygen doping treatment may be performed after the formation of the semiconductor layer 242a.

Next, the semiconductor layer 242b is formed over the semiconductor layer 242a. In this embodiment, as the semiconductor layer 242b, 30-nm-thick In—Ga—Zn oxide is deposited by a sputtering method using an In—Ga—Zn oxide target (In:Ga:Zn=1:1:1). Note that the constituent elements and compositions applicable to the semiconductor layer 242b are not limited thereto.

The oxygen doping treatment may be performed after the formation of the semiconductor layer 242b.

Next, heat treatment may be performed to further reduce the impurities such as moisture or hydrogen contained in the semiconductor layer 242a and the semiconductor layer 242b, so that the semiconductor layer 242a and the semiconductor layer 242b are highly purified.

For example, the semiconductor layer 242a and the semiconductor layer 242b are subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

By heat treatment, oxygen included in the insulating layer 109 can be diffused into the semiconductor layer 242a and the semiconductor layer 242b, concurrently with the release of impurities, so that oxygen vacancies in the semiconductor layer 242a and the semiconductor layer 242b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the semiconductor layer 242b is formed. For example, the heat treatment may be performed after the semiconductor layer 242b is selectively etched.

The first heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Next, a resist mask is formed over the semiconductor layer 242b, and with use of the resist mask, the semiconductor layer 242a and the semiconductor layer 242b are partly etched selectively. In this step, part of the insulating layer 109 may be etched, so that the insulating layer 109 may have a projected portion.

Either of a dry etching method or a wet etching method may be used for etching of the semiconductor layer 242a and the semiconductor layer 242b, or both of them may be used. After the etching, the resist mask is removed.

In the transistor 241, the electrode 244 and the electrode 245 that are in contact with the semiconductor layer 242b are provided over the semiconductor layer 242b. The electrode 244 and the electrode 245 (including another electrode or wiring formed from the same layer of these electrodes) can be formed using a material and method similar to those of the electrode 226.

In addition, the transistor 241 includes the semiconductor layer 242c over the semiconductor layer 242b, the electrode 244, and the electrode 245. The semiconductor layer 242c is partly contact with each of the semiconductor layer 242b, the electrode 244, and the electrode 245.

In this embodiment, the semiconductor layer 242c is formed using an In—Ga—Zn oxide target (In:Ga:Zn=1:3:2). Note that the constituent elements and compositions applicable to the semiconductor layer 242c are not limited thereto. For example, oxide gallium may be used for the semiconductor layer 242c. Furthermore, oxygen doping treatment may be performed on the semiconductor layer 242c.

Furthermore, in the transistor 241, the insulating layer 117 is provided over the semiconductor layer 242c. The insulating layer 117 can function as a gate insulating layer. The insulating layer 117 can be formed using a material and a method similar to those of the insulating layer 102. The oxygen doping treatment may be performed on the insulating layer 117.

After the semiconductor layer 242c and the insulating layer 117 are formed, a mask is formed over the insulating layer 117, and parts of the semiconductor layer 242c and the insulating layer 117 are selectively etched, so that the semiconductor layer 242c and the insulating layer 117 may be formed into island shapes.

Moreover in the transistor 241, the electrode 243 is provided over the insulating layer 117. The electrode 243 (including another electrode or wiring formed from the same layer as the electrode) can be formed using a material and method similar to those of the electrode 226.

In this embodiment, the electrode 243 has a stacked structure including an electrode 243a and an electrode 243b. For example, the electrode 243a is formed using tantalum nitride, and the electrode 243b is formed using copper. The electrode 243a serves as a barrier layer; accordingly, diffusion of a copper element can be prevented. Thus, a semiconductor device with a high reliability can be obtained.

Moreover, the transistor 241 includes an insulating layer 118 covering the electrode 243. The insulating layer 118 can be formed using a material and a method similar to those of the insulating layer 102. The insulating layer 118 may be subjected to oxygen doping treatment. Furthermore, a surface of the insulating layer 118 may be subjected to CMP treatment.

In addition, an insulating layer 113 is formed over the insulating layer 118. The insulating layer 113 can be formed using a material and a method that are similar to those of the insulating layer 105. Further, a surface of the insulating layer 113 may be subjected to CMP treatment. By the CMP treatment, unevenness of the surfaces can be reduced, and coverage with an insulating layer or a conductive layer to be formed later can be increased. In addition, an opening is formed in parts of the insulating layer 113 and the insulating layer 118. A contact plug 114 is formed in the opening.

Over the insulating layer 113, a wiring 261, a wiring 265, and a wiring 267 (including another electrode or wiring formed from the same layer as the wirings) are formed. The wiring 267 is electrically connected to an electrode 249 in the opening formed in the insulating layer 113 and the insulating layer 118, via the contact plug 114. The wiring 265 is electrically connected to the electrode 244 formed in the opening formed in the insulating layer 113 and the insulating layer 118, via the contact plug 114.

The imaging device 100 includes an insulating layer 115 to cover the wiring 261, the wiring 265, and the wiring 267 (including another electrode or wiring formed from the same layer as the wirings). The insulating layer 115 can be formed using a material and a method that are similar to those of the insulating layer 105. The surface of the insulating layer 115 may be subjected to CMP treatment. By the CMP treatment, unevenness of the surfaces can be reduced, and coverage with an insulating layer or a conductive layer to be formed later can be increased. In addition, an opening is formed in part of the insulating layer 115.

Furthermore, over the insulating layer 115, a wiring 263 and a wiring 266 (including another electrode or wiring formed from the same layer as the wirings) are formed.

Each of the wiring 263 and the wiring 266 (including another electrode or wiring formed from the same layer as the wirings) can be electrically connected to another wiring or another electrode through an opening and a contact plug formed in the insulating layer.

Moreover, an insulating layer 116 is provided to cover the wiring 263 and the wiring 266. The insulating layer 116 can be formed using a material and a method that are similar to those of the insulating layer 105. Furthermore, the surface of the insulating layer 116 may be subjected to CMP treatment.

The transistor 241 illustrated in FIG. 23 corresponds to the transistor 121. When a transistor included in a pixel is provided over the photoelectric conversion element 220, an area occupied by the photoelectric conversion element 220 can be increased in a plan view. Thus, the photosensitivity of the imaging device 100 can be increased. Further, the imaging device 100 whose photosensitivity is less likely to be lowered even with high resolution can be achieved.

FIG. 26A is an enlarged cross-sectional view of the transistor 281 illustrated in FIG. 23 as an example of a transistor included in a peripheral circuit. FIG. 26B is an enlarged cross-sectional view of the transistor 282 illustrated in FIG. 23. In this embodiment, the transistor 281 is a p-channel transistor, and the transistor 282 is an n-channel transistor, for example.

The p-channel transistor 281 includes an i-type semiconductor layer 283 in which a channel is formed, a p-type semiconductor layer 285, an insulating layer 286, an electrode 287, and a side wall 288. At a region overlapping with the side wall 288 in the i-type semiconductor layer 283, low-concentration p-type impurity regions 284 are provided.

The i-type semiconductor layer 283 included in the p-channel transistor 281 can be formed in a step of forming the i-type semiconductor layer 222 in the photoelectric conversion element 220 at the same time. The p-type semiconductor layer 285 included in the p-channel transistor 281 can be formed in a step of forming the p-type semiconductor layer 221 in the photoelectric conversion element 220 at the same time.

The insulating layer 286 can have a function of a gate insulating layer. The electrode 287 can function as a gate electrode. The low-concentration p-type impurity regions 284 can be formed in such a manner that an impurity element is added with use of the electrode 287 as a mask after formation of the electrode 287 and before the formation of the side wall 288. In other words, the low-concentration p-type impurity regions 284 can be formed in a self-aligned manner. The low-concentration p-type impurity regions 284 have the same conductivity as that of the p-type semiconductor layer 285, and lower concentration of impurities imparting conductivity than the p-type semiconductor layer 285.

The n-channel transistor 282 has a structure similar to that of the p-channel transistor 281; however, there is a difference in that low-concentration n-type impurity regions 294 and an n-type semiconductor layer 295 are provided, instead of the low-concentration p-type impurity regions 284 and the p-type semiconductor layer 285.

The n-type semiconductor layer 295 included in the n-channel transistor 282 can be formed in a step of forming the n-type semiconductor layer 223 in the photoelectric conversion element 220 at the same time. As in the case of the p-channel transistor 281, the low-concentration n-type impurity regions 294 can be formed in a self-aligned manner. The low-concentration n-type impurity regions 294 have the same conductivity as the n-type semiconductor layer 295 and have lower concentration of impurities imparting the conductivity than the n-type semiconductor layer 295.

Although the variety of films such as the metal film, the semiconductor film, the inorganic insulating film which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute field effect transistor (FET).

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing a solvent containing liquid and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are alternately introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are alternately introduced to form a GaO layer, and then a $Zn(CH_3)_2$ gas and an $O_3$ gas are alternately introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be implemented in an appropriate combination with any of the structures described in the other embodiments.

Embodiment 5

The peripheral circuit and the pixel circuit can be provided with, as appropriate, a logic circuit such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

In this embodiment, an example of a CMOS circuit that can be used for the peripheral circuit and the pixel circuit, or the like is described with reference to FIGS. 27A to 27E. In the circuit diagrams in FIGS. 27A to 27E, "OS" is written beside a transistor in order to clearly demonstrate that the transistor includes an oxide semiconductor.

Figure 27A:
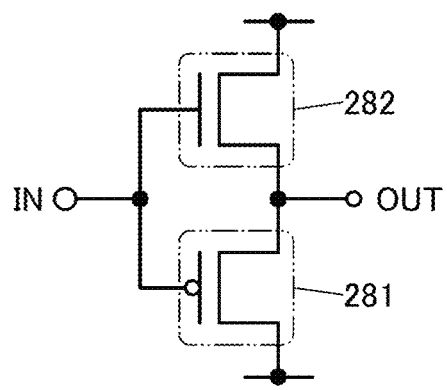
FIGS. 27A to 27E each illustrate an example of a circuit configuration.

The CMOS circuit shown in FIG. 27A has a configuration of what is called an inverter circuit in which the p-channel transistor 281 and the n-channel transistor 282 are connected to each other in series and in which gates of the transistors are connected to each other.

Figure 27B:
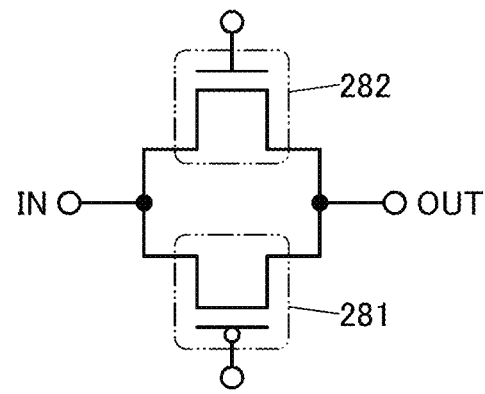

The CMOS circuit shown in FIG. 27B has a configuration of what is called an analog switch circuit in which the p-channel transistor 281 and the n-channel transistor 282 are connected to each other.

Figure 27C:
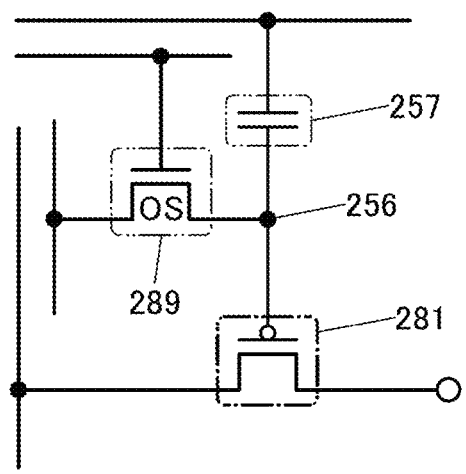

The circuit shown in FIG. 27C has a configuration of which is called a memory element in which one of a source and a drain of the n-channel transistor 289 is connected to a gate of the p-channel transistor and one electrode of a capacitor 257. The circuit shown in FIG. 27D has a configuration of what is called a memory element in which one of a source and a drain of the n-channel transistor 289 is connected to one electrode of the capacitor 257.

Figure 27D:
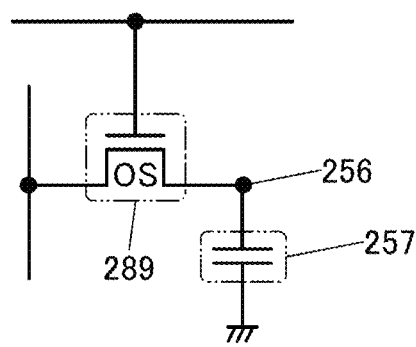

In each of the circuits shown in FIGS. 27C and 27D, charge injected from the other of the source and the drain of the transistor 289 can be stored in a node 256. The transistor 289 is a transistor including an oxide semiconductor, which enables charge to be stored in the node 256 for a long period. The p-channel transistor 281 may be a transistor that includes an oxide semiconductor in a semiconductor layer in which a channel is formed.

Figure 27E:
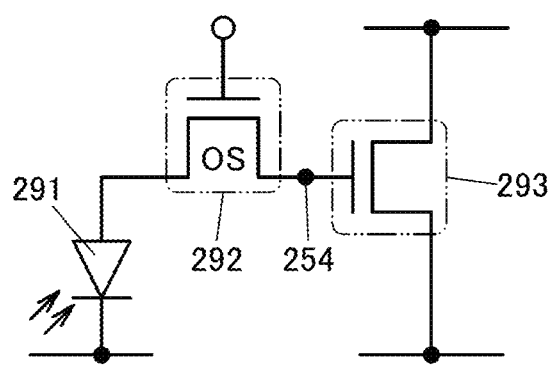

The circuit shown in FIG. 27E has a configuration of an optical sensor. In FIG. 27E, one of a source and a drain of the transistor 292 using an oxide semiconductor for a semiconductor layer in which a channel is formed is electrically connected to a photodiode 291, and the other of the source and the drain of the transistor 292 is electrically connected to a gate of the transistor 293 through a node 254. The transistor 292 using an oxide semiconductor for a semiconductor layer in which a channel is formed has the extremely small amount of off-state current; thus, the potential of the node 254 that is determined depending on the amount of received light hardly changes. Therefore, an imaging device that is hardly influenced by noise can be provided. Furthermore, an imaging device with high linearity can be provided.

Figure 28A:
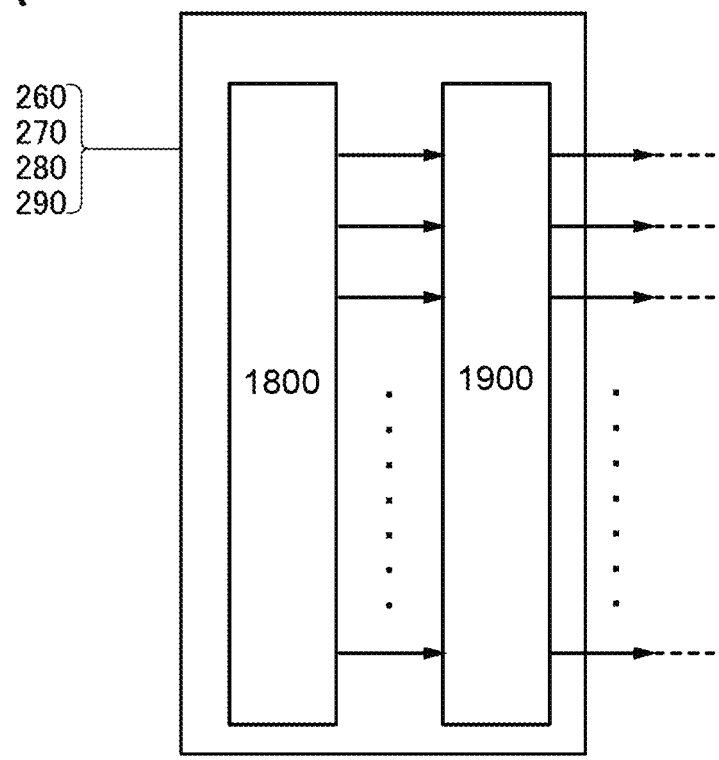
FIGS. 28A and 28B each illustrate an example of a circuit configuration.
Figure 28B:
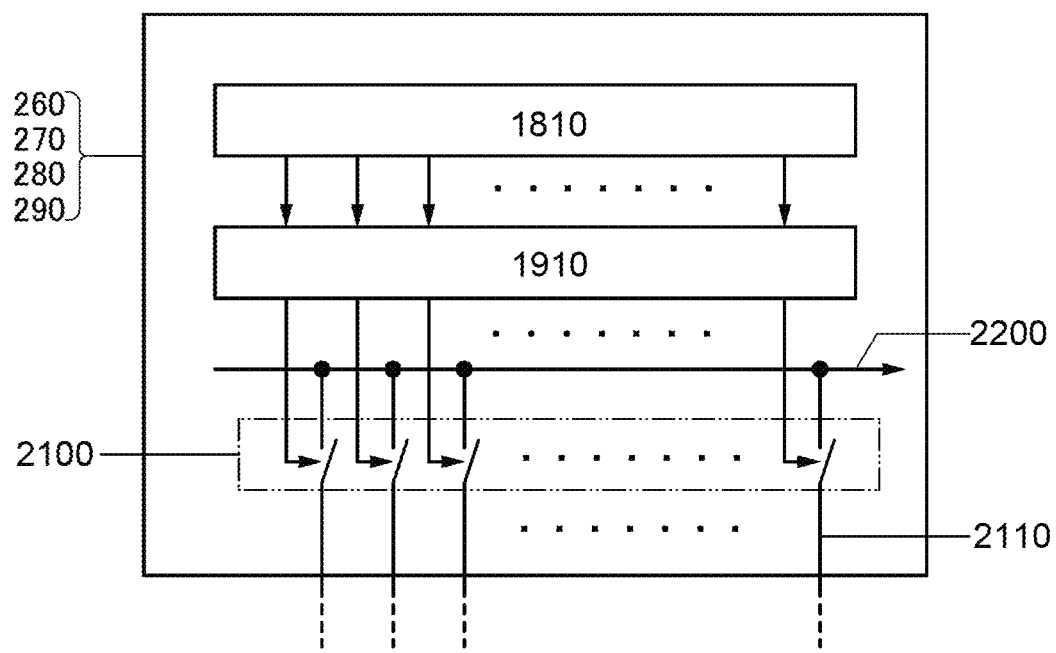

For the peripheral circuit, a circuit in which a shift register circuit 1800 and a buffer circuit 1900 are combined, shown in FIG. 28A, may be provided. Alternatively, for the peripheral circuit, a circuit in which a shift register circuit 1810, a buffer circuit 1910, and an analog switch circuit 2100 are combined, as shown in FIG. 28B, may be provided. The vertical output lines 2110 are selected by the analog switch circuit 2100, and output signals are output to an output line 2200. The analog switch circuit 2100 can be sequentially selected by the shift register circuit 1810 and the buffer circuit 1910.

Figure 29A:
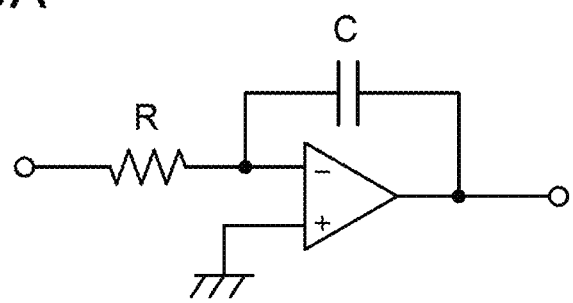
FIGS. 29A to 29C each illustrate an example of a circuit configuration.
Figure 29B:
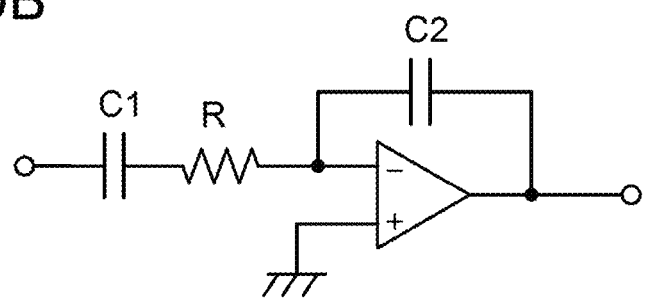
Figure 29C:
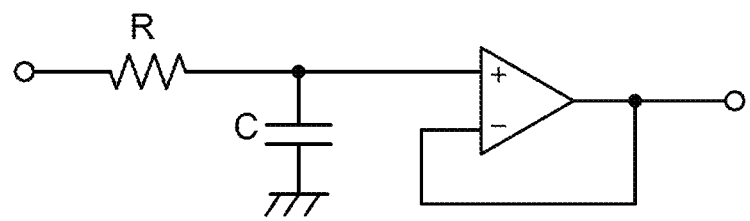

In the circuit diagram shown in the above embodiment, any of integrator circuits shown in FIGS. 29A, 29B, and 29C may be connected to the wiring 137 (OUT). In such a circuit, an S/N ratio of a reading signal can be increased to sense weaker light; that is, the sensitivity of the imaging device can be increased.

FIG. 29A shows an integrator circuit including an operational amplifier circuit (also referred to as an op-amp). An inverting input terminal of the operational amplifier circuit is connected to the wiring 137 through a resistor R. A non-inverting input terminal of the operational amplifier circuit is grounded. An output terminal of the operational amplifier circuit is connected to the inverting input terminal of the operational amplifier circuit through a capacitor C.

FIG. 29B shows an integrator circuit using an operational amplifier circuit having a structure different from that in FIG. 29A. An inverting input terminal of the operational amplifier circuit is connected to the wiring 137 (OUT) through the resistor R and a capacitor C1. A non-inverting input terminal of the operational amplifier circuit is grounded. An output terminal of the operational amplifier circuit is connected to the inverting input terminal of the operational amplifier circuit through a capacitor C2.

FIG. 29C shows an integrator circuit including an operational amplifier circuit having a structure different from those in FIGS. 29A and 29B. A non-inverting input terminal of the operational amplifier circuit is connected to the wiring 137 (OUT) through the resistor R. An inverting input terminal of the operational amplifier circuit is connected to an output terminal of the operational amplifier circuit. The resistor R and the capacitor C constitute a CR integrator circuit. The operational amplifier circuit is a unity gain buffer.

This embodiment can be implemented in an appropriate combination with any of the structures described in the other embodiments.

Embodiment 6

In this embodiment, structure examples of a transistor that can be used for the transistor described in the above embodiment will be described with reference to FIGS. 30A1, 30A2, 30B1, and 30B1, FIGS. 31A1, 31A2, 31A3, 31B1, and 31B2, FIGS. 32A to 32C, FIGS. 33A to 33C.

[Bottom Gate Transistor]

A transistor 410 illustrated in FIG. 30A1 as an example is a channel-protective transistor that is a type of bottom-gate transistor. The transistor 410 includes an insulating layer 209 that can function as a channel protective layer over a channel formation region in the semiconductor layer 242. The insulating layer 209 can be formed using a material and a method that are similar to those of the insulating layer 117. Part of the electrode 244 and part of the electrode 245 are formed over the insulating layer 209.

With the insulating layer 209 provided over the channel formation region, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245. According to one embodiment of the present invention, a transistor with favorable electrical characteristics can be provided.

A transistor 411 illustrated in FIG. 30A2 is different from the transistor 410 in that an electrode 213 that can function as a back gate electrode is provided over the insulating layer 118. The electrode 213 can be formed using a material and a method that are similar to those of the electrode 243.

In general the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrode 243 and the electrode 213 can both function as a gate electrode. Thus, the insulating layers 117, 209, and 118 can all function as a gate insulating layer.

In the case where one of the electrode 243 and the electrode 213 is simply referred to as a "gate electrode", the other is referred to as a "back gate electrode" in some cases. For example, in the transistor 411, in the case where the electrode 213 is referred to as a "gate electrode", the electrode 243 is referred to as a "back gate electrode". In the case where the electrode 213 is used as a "gate electrode", the transistor 411 is a kind of bottom-gate transistor. Furthermore, one of the electrode 243 and the electrode 213 may be referred to as a "first gate electrode", and the other may be referred to as a "second gate electrode".

By providing the electrode 243 and the electrode 213 with the semiconductor layer 242 provided therebetween and setting the potentials of the electrode 243 and the electrode 213 to be the same, a region of the semiconductor layer 242 through which carriers flow is enlarged in the film thickness direction; thus, the number of transferred carriers is increased. As a result, the on-state current and the field-effect mobility of the transistor 411 are increased.

Therefore, the transistor 411 has a large amount of on-state current for the area occupied thereby. That is, the area occupied by the transistor 411 can be small for the required amount of on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 243 and the electrode 213 each have a function of blocking an electric field generated outside, charges of charged particles and the like generated on the insulating layer 109 side or above the electrode 213 do not influence the channel formation region in the semiconductor layer 242. Therefore, degradation in a stress test (e.g., a negative gate bias temperature (−GBT) stress test in which negative charges are applied to a gate) can be reduced, and changes in the rising voltages of on-state current at different drain voltages can be reduced. Note that this effect is caused when the electrodes 243 and 213 have the same potential or different potentials.

The BT stress test is one kind of accelerated test and can evaluate, in a short time, a change by long-term use (i.e., a change over time) in characteristics of transistors. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

By providing the electrode 243 and the electrode 213 and setting the potentials of the electrode 243 and the electrode 213 to be the same, the amount of change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

A transistor 420 shown in FIG. 30B1 as an example is a channel-protective transistor that is a type of bottom-gate transistor. The transistor 420 has substantially the same structure as the transistor 410 but is different from the transistor 410 in that the insulating layer 209 covers the semiconductor layer 242. Furthermore, the semiconductor layer 242 is electrically connected to the electrode 244 in the opening which is formed by selectively removing part of the insulating layer 209 overlapping with the semiconductor layer 242. The semiconductor layer 242 is electrically connected to the electrode 245 in an opening which is formed by selectively removing part of the insulating layer 209 overlapping with the semiconductor layer 242. A region of the insulating layer 209 which overlaps with the channel formation region can function as a channel protective layer.

A transistor 421 illustrated in FIG. 30B2 is different from the transistor 420 in that the electrode 213 that can function as a back gate electrode is provided over the insulating layer 118.

With the insulating layer 209, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245.

The length between the electrode 244 and the electrode 243 and the length between the electrode 245 and the electrode 243 in the transistors 420 and 421 get longer than those in the transistors 410 and 411. Thus, the parasitic capacitance generated between the electrode 244 and the electrode 243 can be reduced. Moreover, the parasitic capacitance generated between the electrode 245 and the electrode 243 can be reduced. According to one embodiment of the present invention, a transistor with favorable electrical characteristics can be provided.

[Top Gate Transistor]

A transistor 430 illustrated in FIG. 31A1 as an example is a type of top-gate transistor. The transistor 430 includes the semiconductor layer 242 over the insulating layer 109; the electrode 244 in contact with part of the semiconductor layer 242 and the electrode 249 in contact with part of the semiconductor layer 242, over the semiconductor layer 242 and the insulating layer 109; the insulating layer 117 over the semiconductor layer 242, the electrode 244, and the electrode 245; and the electrode 243 over the insulating layer 117.

Since, in the transistor 430, the electrode 243 overlaps with neither the electrode 244 nor the electrode 245, the parasitic capacitance generated between the electrode 243 and the electrode 244 and the parasitic capacitance generated between the electrode 243 and the electrode 245 can be reduced. After the formation of the electrode 243, an impurity element 255 is introduced into the semiconductor layer 242 using the electrode 243 as a mask, so that an impurity region can be formed in the semiconductor layer 242 in a self-aligned manner (see FIG. 31A3). According to one embodiment of the present invention, a transistor with favorable electrical characteristics can be provided.

The introduction of the impurity element 255 can be performed with an ion implantation apparatus, an ion doping apparatus, or a plasma treatment apparatus.

As the impurity element 255, for example, at least one element of a Group 13 element and a Group 15 element can be used. In the case where an oxide semiconductor is used for the semiconductor layer 242, it is possible to use at least one kind of element of a rare gas, hydrogen, and nitrogen as the impurity element 255.

A transistor 431 illustrated in FIG. 31A2 is different from the transistor 430 in that the electrode 213 and an insulating layer 217 are included. The transistor 431 includes the electrode 213 formed over the insulating layer 109 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has a large amount of on-state current for the area occupied thereby. That is, the area occupied by the transistor 431 can be small for the required amount of on-state current. With one embodiment of the present invention, the area occupied by a transistor can be reduced. Therefore, with one embodiment of the present invention, a semiconductor device having a high degree of integration can be provided.

A transistor 440 illustrated in FIG. 31B1 as an example is a type of top-gate transistor. The transistor 440 is different from the transistor 430 in that the semiconductor layer 242 is formed after the formation of the electrode 244 and the electrode 249. A transistor 441 illustrated in FIG. 31B2 is different from the transistor 440 in that the electrode 213 and the insulating layer 217 are included. Thus, in the transistors 440 and 441, part of the semiconductor layer 242 is formed over the electrode 244 and another part of the semiconductor layer 242 is formed over the electrode 245.

Like the transistor 411, the transistor 441 has a large amount of on-state current for the area occupied thereby. That is, the area occupied by the transistor 441 can be small for the required amount of on-state current. With one embodiment of the present invention, the area occupied by a transistor can be reduced. Therefore, with one embodiment of the present invention, a semiconductor device having a high degree of integration can be provided.

Also in the transistors 440 and 441, after the formation of the electrode 243, the impurity element 255 is introduced into the semiconductor layer 242 using the electrode 243 as a mask, so that an impurity region can be formed in the semiconductor layer 242 in a self-aligned manner. According to one embodiment of the present invention, a transistor with favorable electrical characteristics can be provided. Therefore, according to one embodiment of the present invention, a semiconductor device having a high degree of integration can be provided.

[S-Channel Transistor]

A transistor 450 illustrated in FIGS. 32A to 32C has a structure in which a top surface and side surface of the semiconductor layer 242b are covered with the semiconductor layer 242a. FIG. 32A is a top view of the transistor 450. FIG. 32B is a cross-sectional view (in the channel length direction) taken along dashed-dotted line X1-X2 in FIG. 32A. FIG. 32C is a cross-sectional view (in the channel width direction) taken along dashed-dotted line Y1-Y2 in FIG. 32A.

With the semiconductor layer 242 provided on the projection of the insulating layer 109, the side surface of the semiconductor layer 242b can be covered with the electrode 243. Thus, the transistor 450 has a structure in which the semiconductor layer 242b can be electrically surrounded by electric field of the electrode 243. The structure in which a semiconductor is electrically surrounded by the electric field of a conductive film as the above is called a surrounded channel (s-channel) structure. A transistor with an s-channel structure is called an "s-channel transistor" or an "s-channel transistor".

In the transistor with an s-channel structure, a channel is formed in the whole (bulk) of the semiconductor layer 242b in some cases. In the s-channel structure, the drain current of the transistor is increased, so that a larger amount of on-state current can be obtained. Furthermore, the entire channel formation region of the semiconductor layer 242b can be depleted by the electric field of the electrode 243. Accordingly, the amount of off-state current of the transistor with an s-channel structure can be further reduced.

When the projection of the insulating layer 109 is increased in height, and the channel width is shortened, the effects of the s-channel structure to increase the on-state current and reduce the off-state current can be enhanced. A part of the semiconductor layer 242a exposed in the formation of the semiconductor layer 242b may be removed. In this case, the side surfaces of the semiconductor layer 242a and the semiconductor layer 242b are aligned to each other in some cases.

Figure 33C:
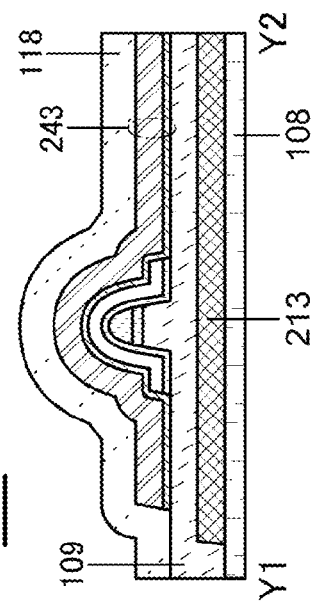
FIGS. 33A to 33C illustrate one embodiment of a transistor.
Figure 33A:
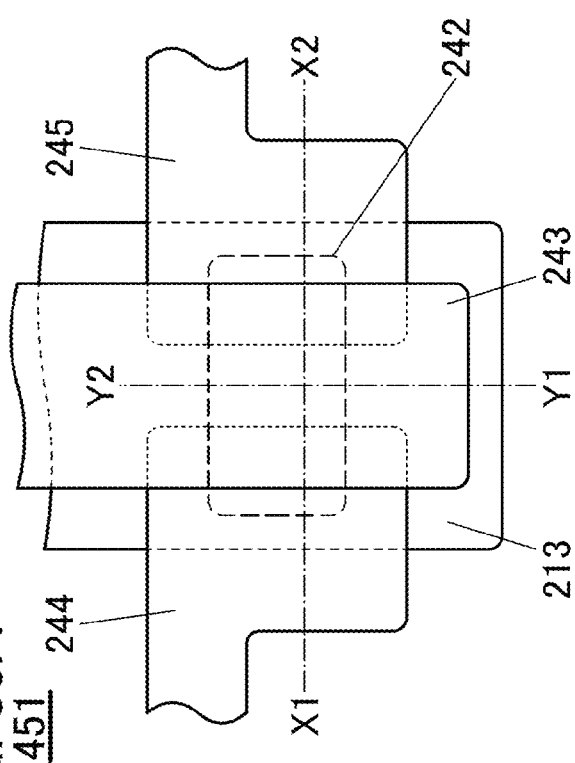
Figure 33B:
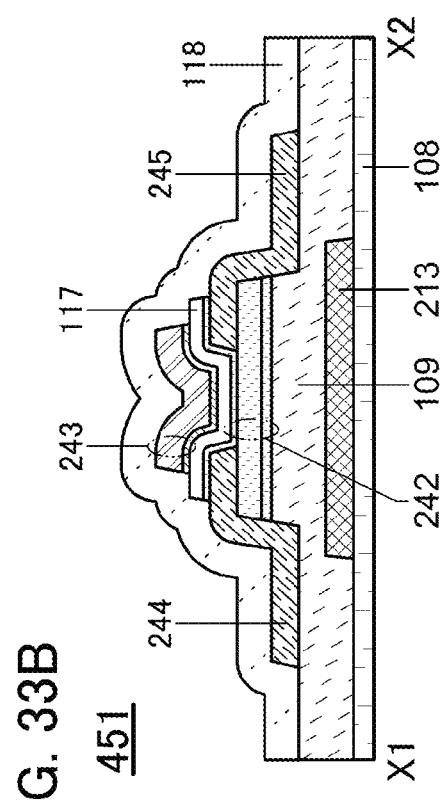

Furthermore, as a transistor 451 illustrated in FIGS. 33A to 33C, the electrode 213 may be provided below the semiconductor layer 242 with an insulating layer interposed therebetween. FIG. 33A is a top view of the transistor 451. FIG. 33B is a cross-sectional view taken along dashed-dotted line X1-X2 in FIG. 33A. FIG. 33C is a cross-sectional view taken along dashed-dotted line Y1-Y2 in FIG. 33A.

This embodiment can be implemented in an appropriate combination with any of the structures described in the other embodiments.

Embodiment 7

In this embodiment, examples of electronic devices using an imaging device of one embodiment of the present invention will be described.

Specific examples of electronic devices each using the imaging device of one embodiment of the present invention are as follows: display devices of televisions, monitors, and the like, lighting devices, desktop personal computers and laptop personal computers, word processors, image reproduction devices which reproduce still images and moving images stored in recording media such as digital versatile discs (DVDs), portable CD players, portable radios, tape recorders, headphone stereos, stereos, table clocks, wall clocks, cordless phone handsets, transceivers, mobile phones, car phones, portable game machines, tablet information terminal, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from non-aqueous secondary batteries are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 34A:
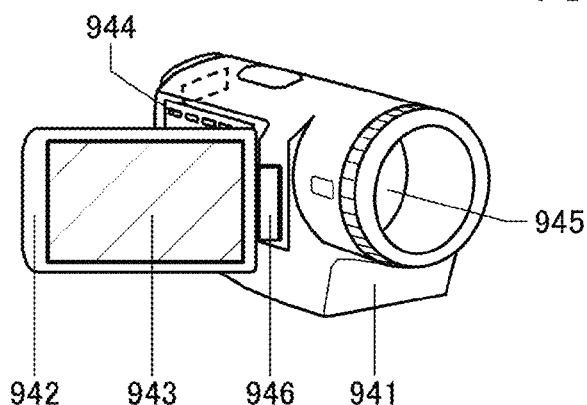
FIGS. 34A to 34F each illustrate an electronic device of one embodiment of the present invention.

FIG. 34A illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. The imaging device of one embodiment of the present invention can be provided in a focus position of the lens 945.

Figure 34B:
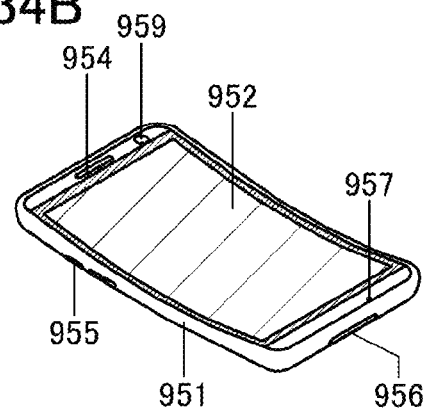

FIG. 34B illustrates a mobile phone, which includes a housing 951 provided with a display portion 952, a microphone 957, a speaker 954, a camera 959, an input-output terminal 956, operation buttons 955, and the like. For the camera 959, the imaging device of one embodiment of the present invention can be used.

Figure 34C:
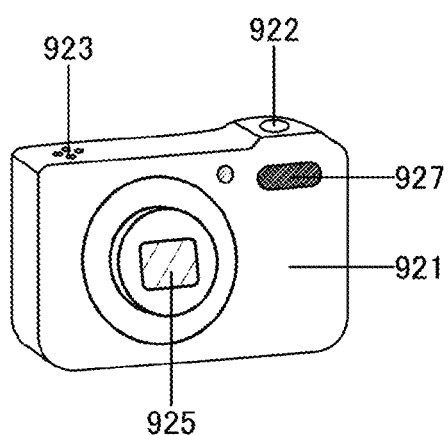

FIG. 34C illustrates a digital camera, which includes a housing 921, a shutter button 922, a microphone 923, a light-emitting portion 927, a lens 925, and the like. The imaging device of one embodiment of the present invention can be provided in a focus position of the lens 925.

Figure 34D:
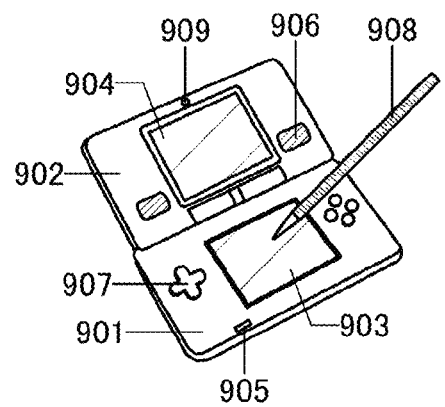

FIG. 34D illustrates a portable game machine, which includes a housing 901, a housing 902, a display portion 903, a display portion 904, a microphone 905, a speaker 906, an operation key 907, a stylus 908, a camera 909, and the like. Although the portable game machine in FIG. 34A has the two display portions 903 and 904, the number of display portions included in a portable game machine is not limited to this. For the camera 909, the imaging device of one embodiment of the present invention can be used.

Figure 34E:
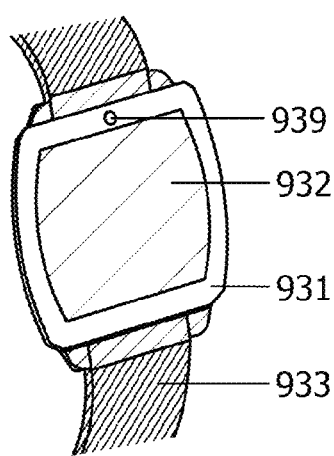

FIG. 34E illustrates a wrist-watch-type information terminal, which includes a housing 931, a display portion 932, a wristband 933, a camera 939, and the like. The display portion 932 may be a touch panel. For the camera 909, the imaging device of one embodiment of the present invention can be used.

Figure 34F:
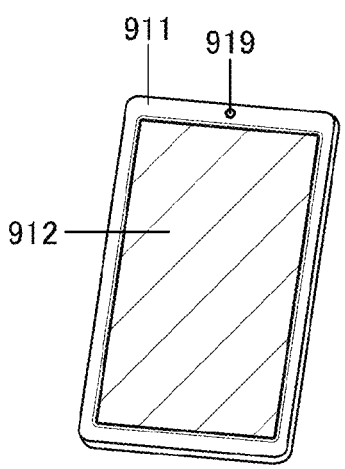

FIG. 34F illustrates a portable data terminal, which includes a first housing 911, a display portion 912, a camera 919, and the like. A touch panel function of the display portion 912 enables input and output of information. For the camera 909, the imaging device of one embodiment of the present invention can be used.

Note that it is needless to say that one embodiment of the present invention is not limited to the electronic device described above as long as the imaging device of one embodiment of the present invention is included.

This embodiment can be implemented in an appropriate combination with any of the structures described in the other embodiments.

EXAMPLE

Hereinafter, examples relating to the above embodiments will be described.

Example 1

Figure 35A:
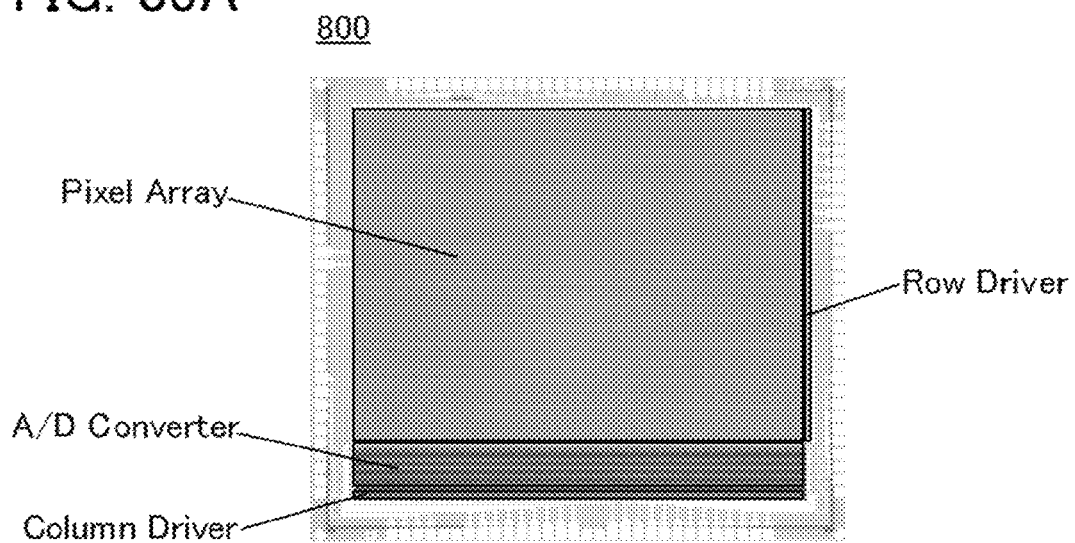
FIGS. 35A and 35B are a photograph and a block diagram of a solid-state image sensor according to examples.
Figure 35B:
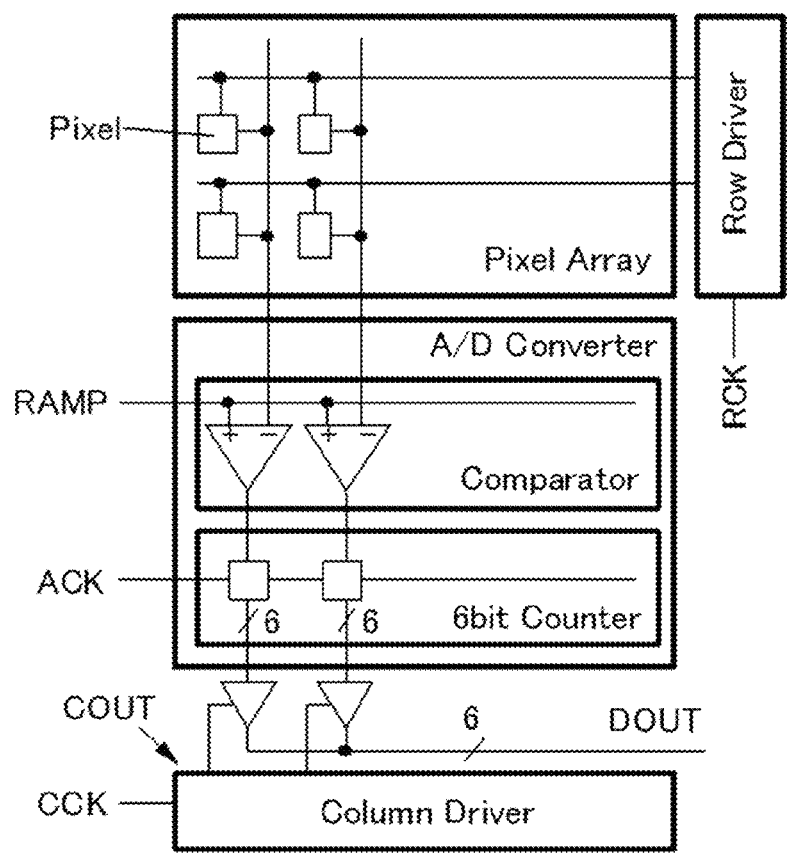

A solid-state imaging device 800 described in the above embodiment was fabricated, and imaging data was obtained. FIG. 35A is a photograph of external appearance of the fabricated solid-state imaging device. The fabricated solid-state imaging device includes a plurality of pixels arranged in matrix in a pixel region (pixel array). In addition, peripheral circuits (row driver and column driver) supplying signals to each pixel are provided outside the pixel array. The column driver includes an A/D converter that converts analog data to digital data. FIG. 35B is a block diagram showing a structure of the solid-state imaging device 800. The specifications of the solid-state imaging device 800 are shown in a center column in FIG. 36.

Figure 37:
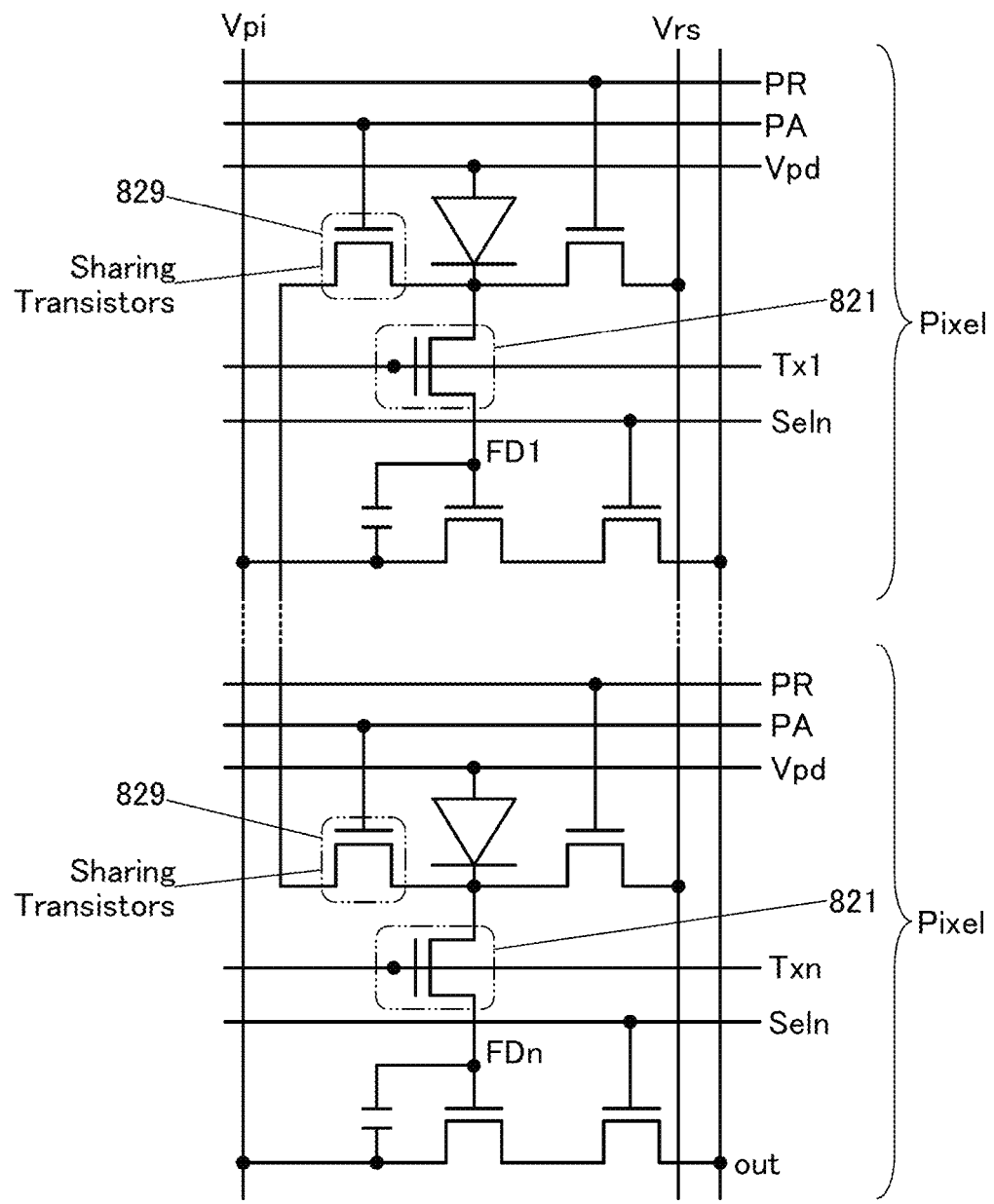
FIG. 37 is a circuit diagram of a pixel included in a solid-state image sensor according to examples.

FIG. 37 shows a circuit diagram of the pixels included in the solid-state imaging device 800. The pixel in the solid-state imaging device 800 has a circuit configuration similar to that of the pixel described in the above embodiment. Each pixel in the solid-state imaging device 800 includes a transistor 829 functioning as a sharing transistor. The transistor 829 corresponds to the transistor 129 described in the above embodiment. A transistor 821 in FIG. 37 corresponds to the transistor 121 or the transistor 125 described in the above embodiment. The transistor 821 functions as a transfer transistor.

In this example, the transistor 829 and the transistor 821 were each formed using an oxide semiconductor.

Figure 38:
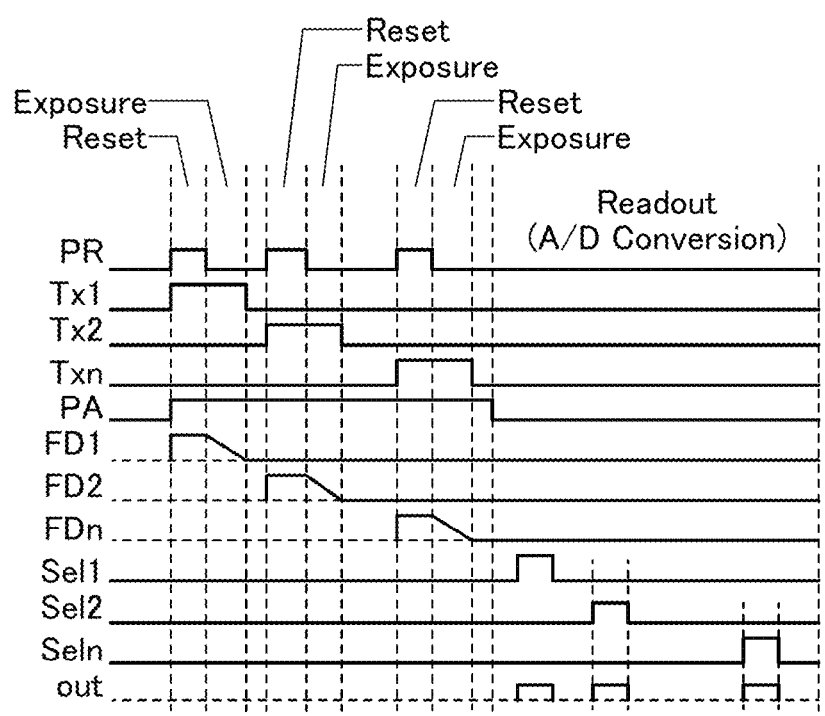
FIG. 38 is a timing chart showing image-capturing operation of a solid-state image sensor according to examples.

FIG. 38 is a timing chart showing the capturing operation of the solid-state imaging device 800. As shown in FIG. 38, pixels corresponding to Tx1 to Txn are sequentially reset and exposed. Then, data is sequentially read out from pixels in every row and converted into digital data by the A/D converter.

Figure 39:
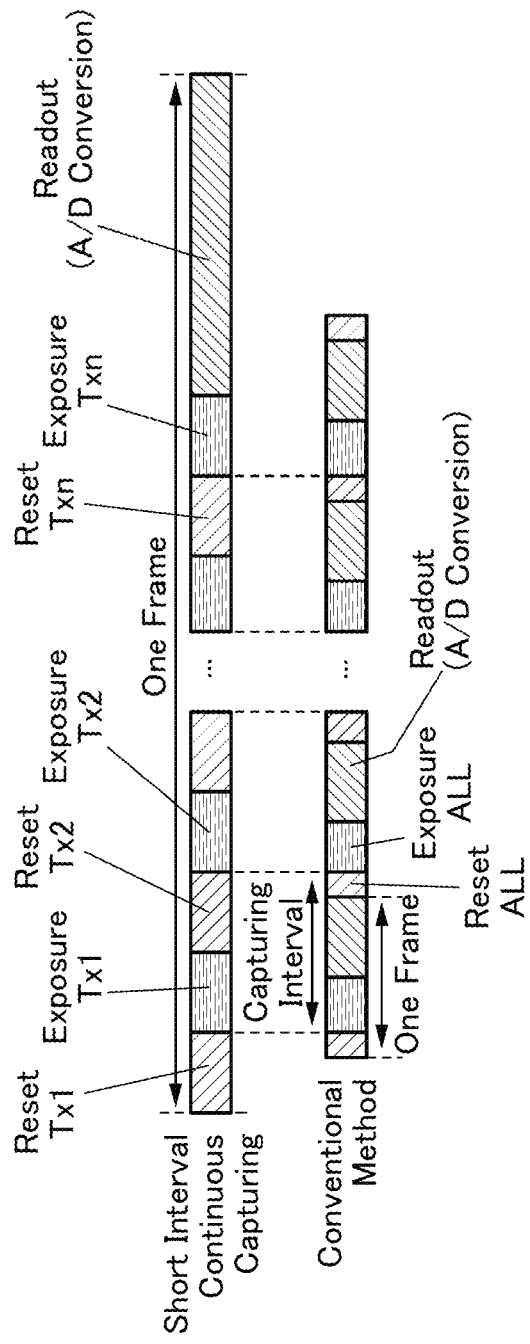
FIG. 39 shows a capturing operation of a solid-state image sensor according to examples.

As shown in FIG. 39, the transistors 821 are assigned to Tx1 to Txn and sequentially turned on, whereby exposure can be performed in succession at short intervals (this operation is called "short interval continuous capturing"). The image data is sequentially read out after the continuous capturing, and then A/D conversion is performed. In other words, high-speed continuous capturing can be performed with short time capturing/slow read out, and high-speed performance is not additionally required for the A/D converter. Thus, the area occupied by the peripheral circuits can be small. Furthermore, power consumption of the peripheral circuits can be reduced.

By this capturing method, time from exposure to reading differs between pixel rows, however, with use of FETs including an oxide semiconductor for the transistors 821, the amount of charge leakage from the node FD can be extremely small. In addition, a plurality of photodiodes can be used in common through the transistors 829, and a plurality of nodes FD can be individually charged. Thus, the image degradation caused by a reduction in an exposure time period can be compensated.

Figure 40A:
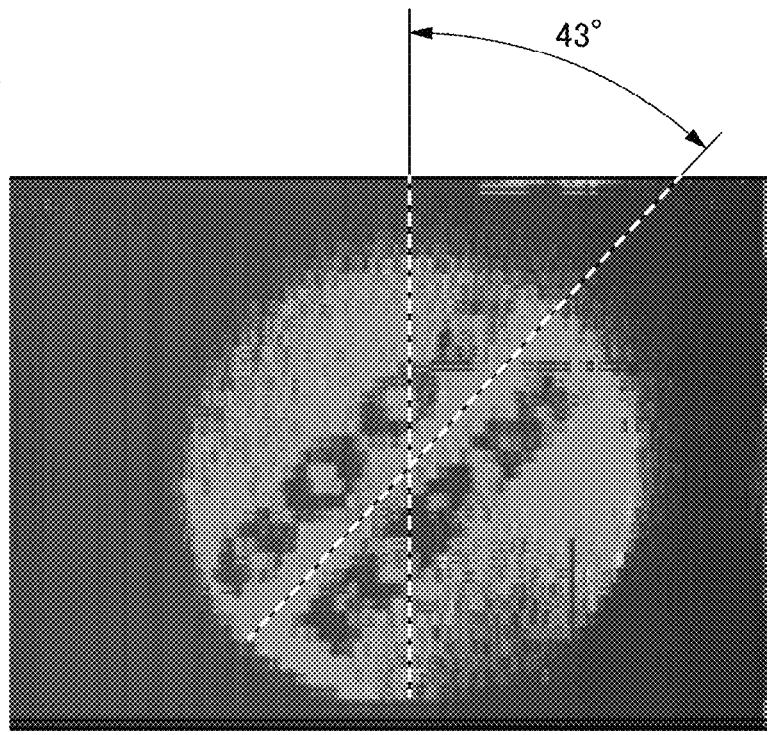
FIGS. 40A and 40B are photographs of an object whose image is captured with a solid-state image sensor according to examples.
Figure 40B:
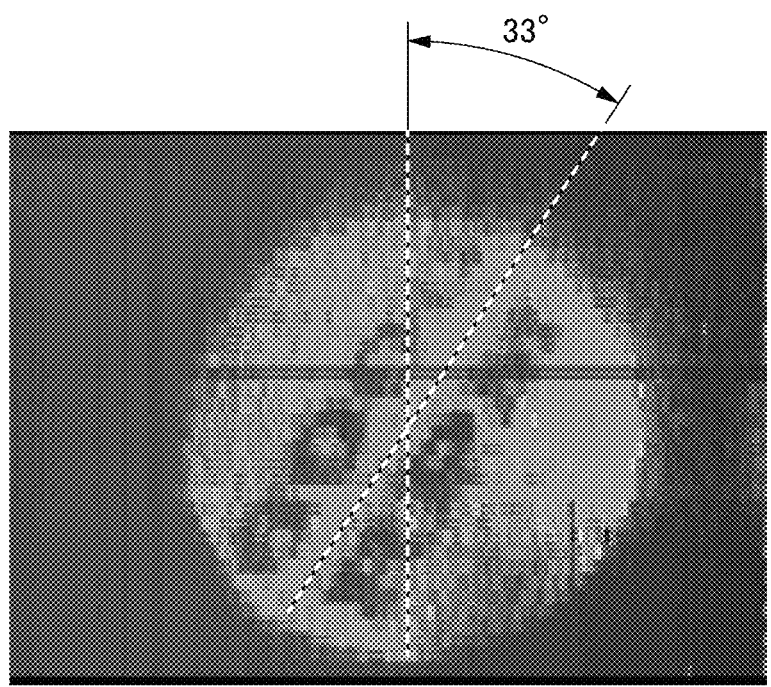

FIGS. 40A and 40B show images of an object spinning at approx. 6000 rpm captured with the solid-state imaging device 800. In this case, the time interval between the starting of Exposure Tx1 and the starting of Exposure Tx2 is 300 μs. As compared to the captured image on the pixel corresponding to Tx1 (FIG. 40A) and the captured image on the pixel corresponding to Tx2 (FIG. 40B), the difference by approx. 10° that is caused by the time interval of 300 μs is shown. In other words, it is found that images can be captured in succession at short durations with the proposed capturing operation. Furthermore, with this capturing operation, extra-high-speed performance is not required for the peripheral circuits.

Example 2

Figure 41A:
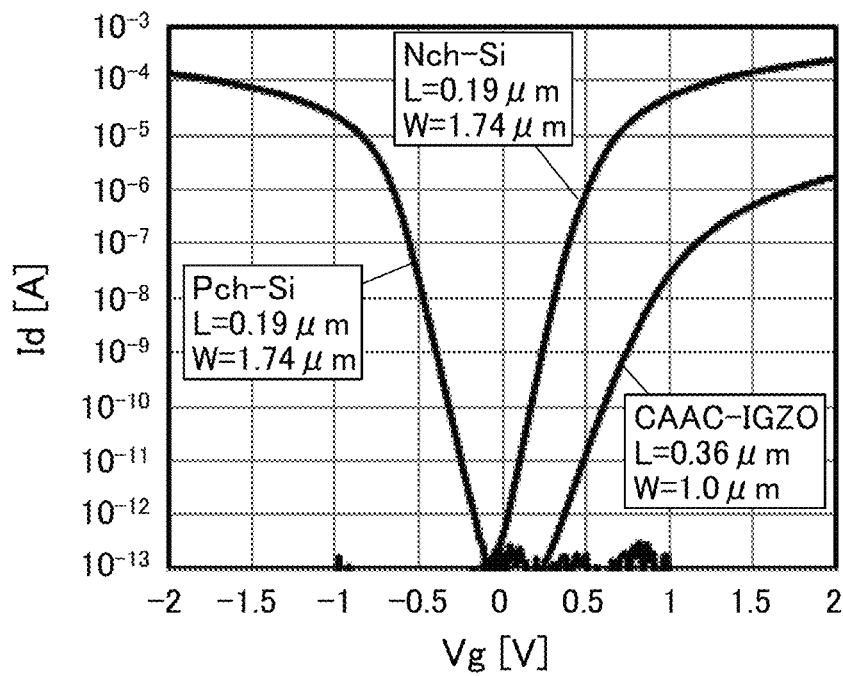
FIGS. 41A and 41B show $V_g$-$I_d$ characteristics and noise characteristics of FETs.

An n-channel FET using silicon (Nch-Si), a p-channel FET using silicon (Pch-Si), and a CAAC-OS-FET using an In—Ga—Zn oxide (CAAC-IGZO-FET) were fabricated. FIG. 41A shows $V_g$-$I_d$ characteristics of these FETs. In FIG. 41A, the horizontal axis indicates the voltage between a gate and a source, and the vertical axis indicates the value of current flowing through a drain. Note that in the p-channel FET, the current flowing through a drain is in a direction opposite to those in the other FETs, and thus, the represented value is a value multiplied by −1. The voltage between a source and a drain was 1.9 V (−1.9 V in the p-channel FET).

Figure 41B:
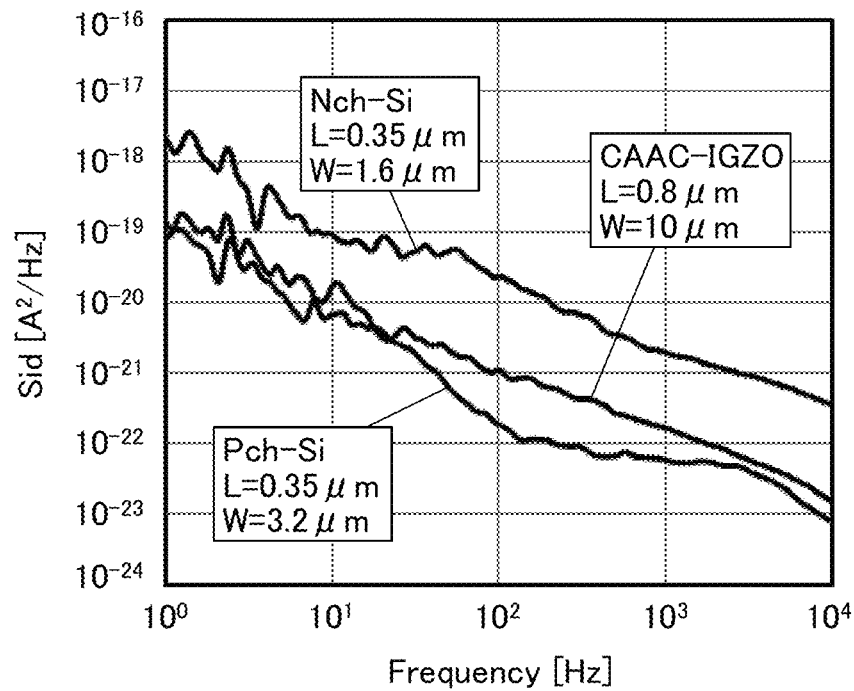

FIG. 41B shows noise characteristics of the FETs.

According to FIG. 41A and FIG. 41B, the CAAC-IGZO-FET has an improved driving performance caused by miniaturization and has a superiority in noise over the Nch-Si-FET. Thus, the validity of a solid-state image sensor without an Nch-Si-FET can be expected. A prototype of a solid-state image sensor was fabricated to have a structure in which all of the pixel transistors are CAAC-IGZO-FETs and the peripheral circuits such as drivers and an A/D converter circuit are formed using CMOS including a Pch-Si-FET and a CAAC-IGZO-FET (the CMOS is also referred to as "hybrid CMOS"). The availability of operation of the peripheral circuits was examined. The specifications of the prototyped solid-state image sensor are shown in the right column in FIG. 36.

Figure 42:
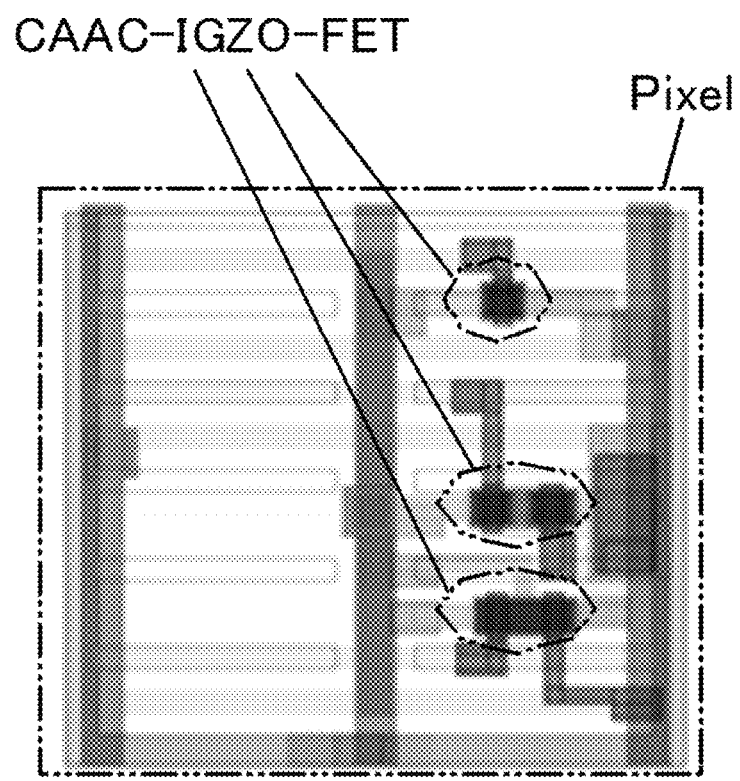
FIG. 42 is a pixel layout diagram of a solid-state image sensor according to Example.

FIG. 42 shows a layout of a pixel. The prototyped solid-state image sensor employs a front side illumination structure and has a fill factor of 31%. When the solid-state image sensor employs a back side illumination structure, the fill factor can be 100%.

Figure 43:
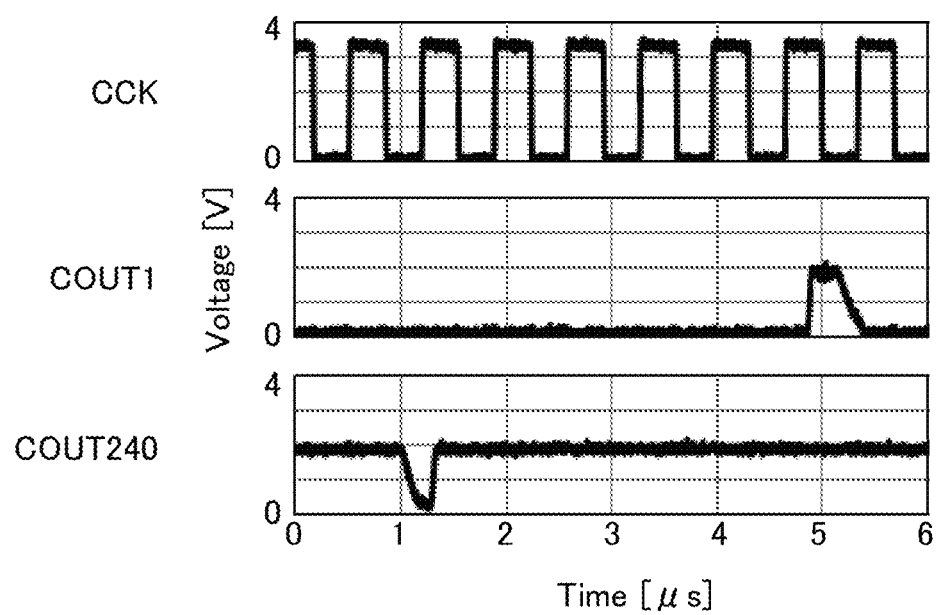
FIG. 43 shows a measurement result of a peripheral circuit according to examples.

FIG. 43 shows measurement results of the peripheral circuits. As shown in the measurement results, a column driver outputs an image data output enable signal (COUT) in synchronization with a clock (CCK). From the above, the actual operation of the peripheral circuits of the solid-state image sensor including CAAC-IGZO-FET/Pch-Si-FET hybrid CMOS can be demonstrated.

Example 3

Figure 44A:
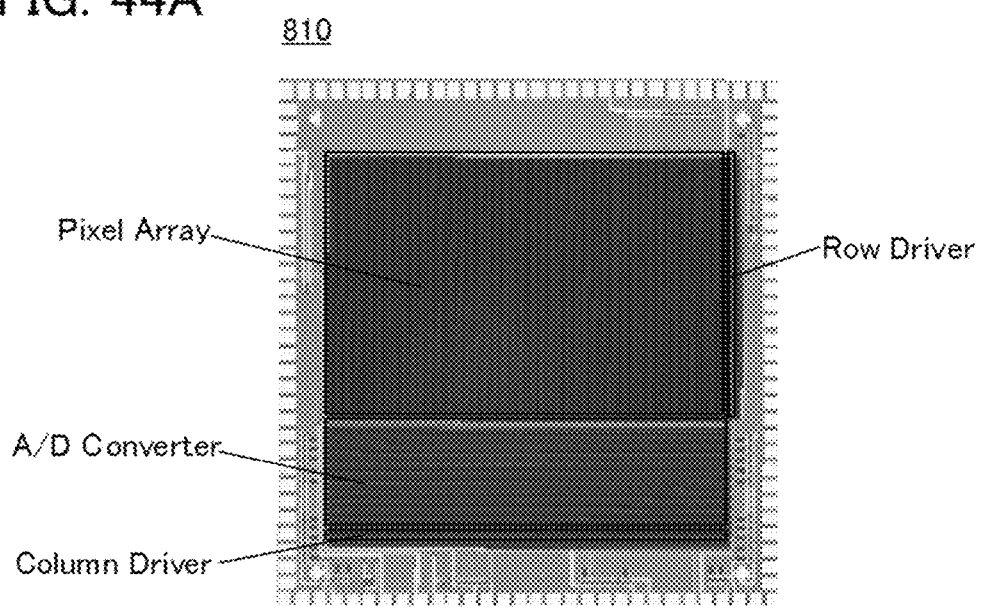
FIG. 44A is a photograph of an external appearance of a solid-state imaging device.
Figure 44B:
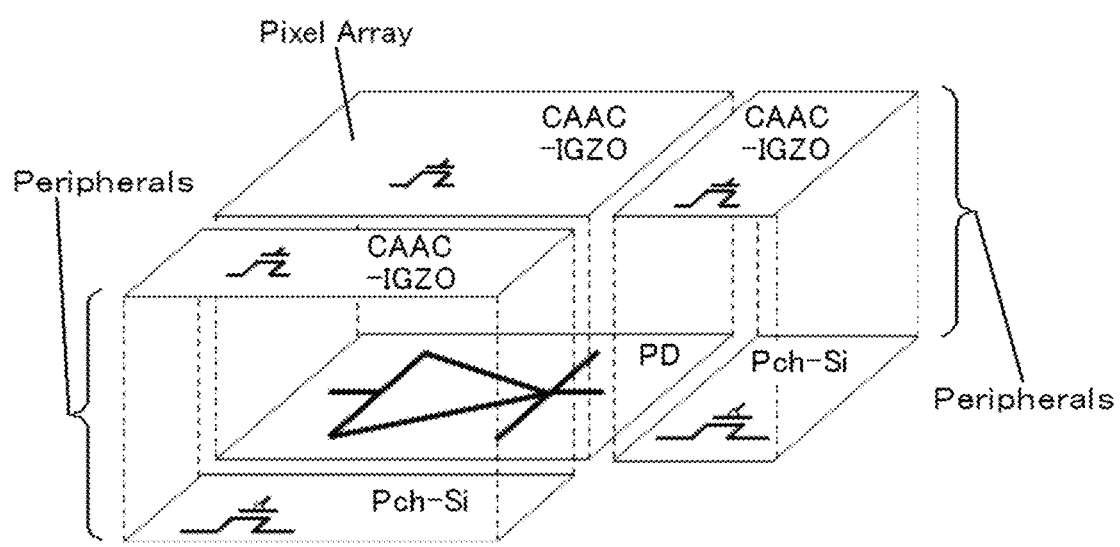
FIG. 44B shows a stacked structure of a solid-state imaging device.
Figure 45:
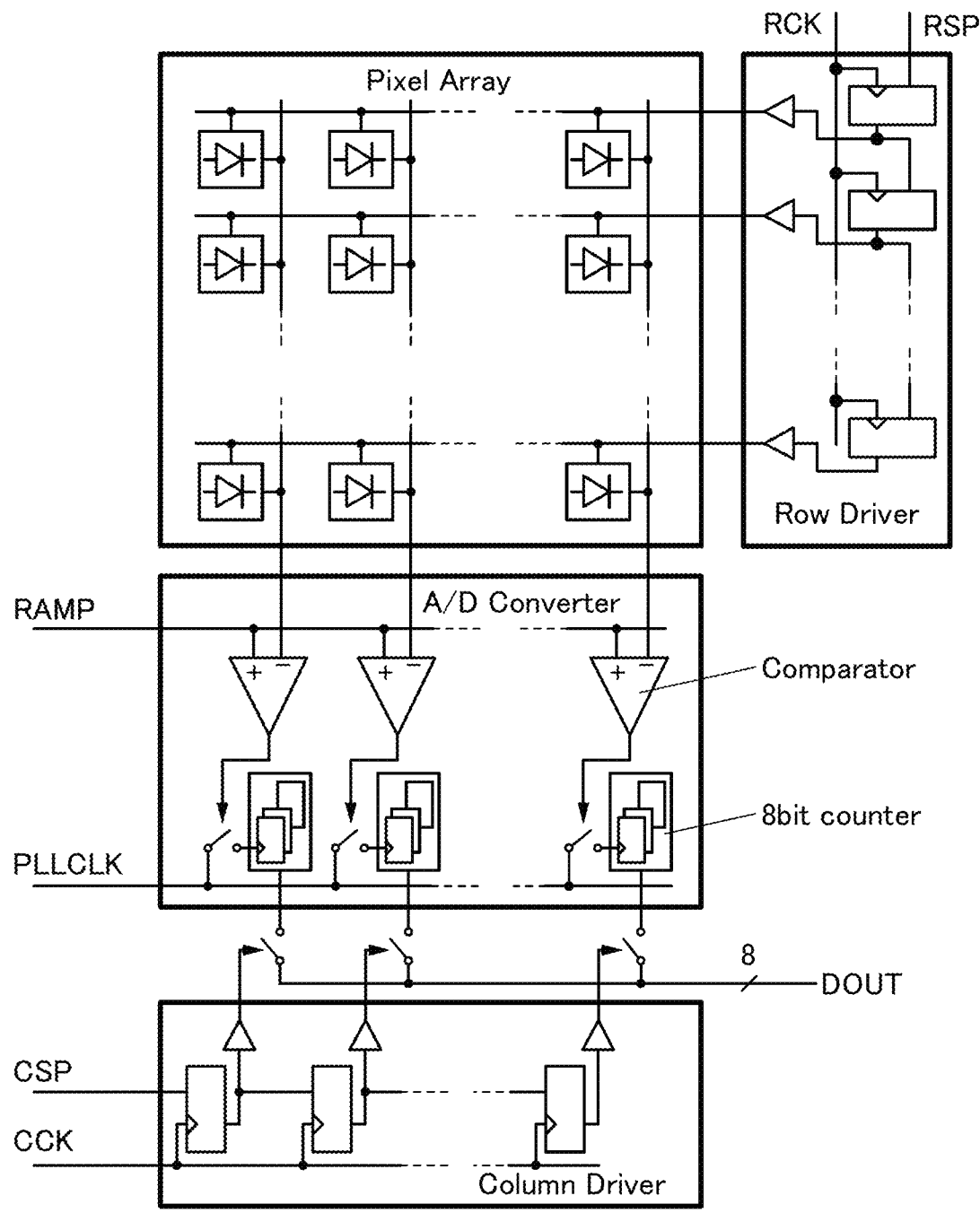
FIG. 45 is a block diagram showing a circuit configuration of a solid-state imaging device.

A solid-state imaging device 810 was fabricated as a display device relating to the above embodiment, and image data was obtained. FIG. 44A is a photograph of an external appearance of the fabricated solid-state imaging device 810. FIG. 44B is a schematic view showing a stacked structure of the solid-state imaging device 810. FIG. 45 is a block diagram showing a circuit configuration of the solid-state imaging device 810. The specifications of the fabricated solid-state imaging device 810 are shown in FIG. 46.

The solid-state imaging device 810 includes a plurality of pixels arranged in matrix in a pixel region (pixel array). In addition, the solid-state imaging device 810 is provided with peripheral circuits such as a row driver, a column driver, and an A/D converter outside the pixel array.

The row driver has a function of selecting a pixel from which an image data obtained by image capturing is read. The A/D converter has a function of converting the read image data from an analog data into a digital data. The column driver has a function of sequentially selecting the image data (digital data) transferred to the outside of the solid-state imaging device 810.

All of the transistors included in the pixel region are CAAC-IGZO-FETs. Thus, it is not necessary to provide a pixel transistor over a silicon substrate, and the size of a photodiode over the silicon substrate can be increased to the size of the subpixel. Therefore, an enhancement in photosensitivity of the solid-state imaging device 810 can be expected. Note that the solid-state imaging device 810 employs a front side illumination structure in which light is obtained from a top surface of a chip, and the fill factor is 31% due to the influence of an upper wiring. When a back side illumination structure can be employed, the fill factor can be 100%.

Figure 47:
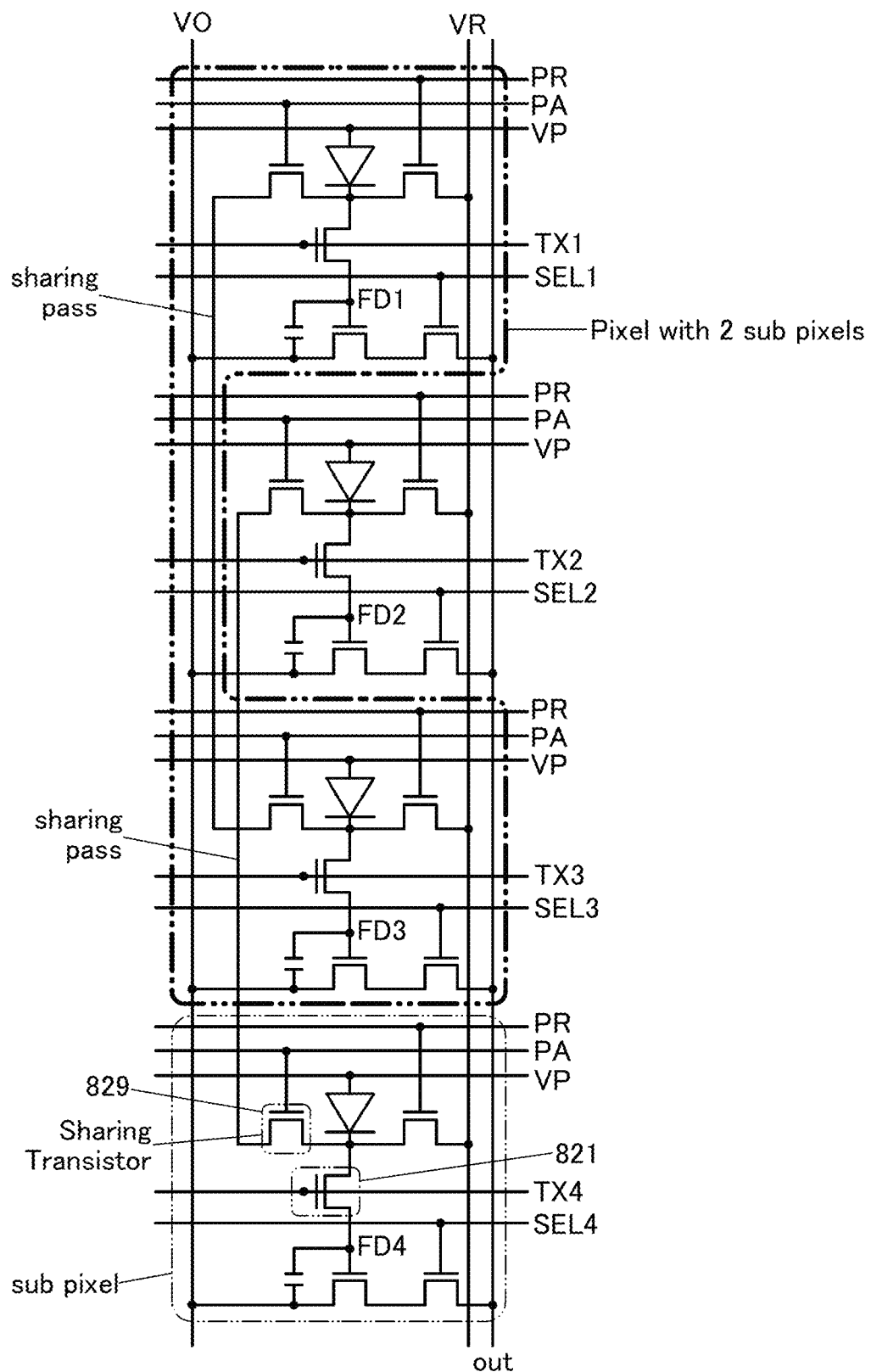
FIG. 47 shows a circuit configuration of a pixel.

The solid-state imaging device 810 was fabricated by a hybrid process using a Pch-Si-FET whose technology size was 0.18 μm and a CAAC-IGZO-FET whose technology size was 0.35 μm. The die size was 6.5 mm×6.0 mm. In the solid-state imaging device 810, one pixel is constituted by two subpixels. In order to adopt the Bayer pattern in consideration of capturing color images, between two subpixels, a subpixel belonging to another pixel is sandwiched (see FIG. 47).

The solid-state imaging device 810 relating to the above embodiments can employ a capturing method in which photodiodes PD are shared between subpixels (the method is also referred to as "continuous sharing capturing method") and a capturing method in which photodiodes PD are not shared between subpixels, i.e., photodiodes are independently used for each subpixel (the method is also referred to as "continuous non-sharing capturing method"). Besides, a capturing method in which a subpixel is provided as an individual pixel (the method is also referred to as "normal capturing method") or the like can be employed depending on an object or a purpose for image capturing.

<Capturing Method>

Hereinafter, each capturing method will be described.

[Continuous Sharing Capturing Method]

First, a continuous sharing capturing method is described. In this method, the transistors 829 that are sharing transistors are set in an on state, and subpixels are connected to be one pixel. The photodiodes PD in the subpixels are bonded to each other, whereby a high sensitive pixel can be obtained. In the driving method of pixels, subpixels corresponding to respective pixels, TX1 to TXn, are sequentially reset and exposed. Then, data is sequentially read out from subpixels in every row, and the data is converted into digital data by the A/D converter. Without high-speed A/D conversion, continuous capturing can be performed.

The reset operation is performed in the following manner: a reset transistor, the transistor 821 that is a transfer transistor, and the transistor 829 are set in an on state, and the photodiode PD in the corresponding subpixel and a sharing path (a wiring connecting the transistors 829 in two pixels) are charged at a reset potential VR. The exposure operation is performed in the following manner: the transistor 821 and the transistor 829 are set in an on state, and the photocurrent on n photodiodes PD flows in the photodiodes PD in the corresponding subpixels. The reading operation is performed in the following manner: a selection transistor is set in an on state, and a source follower output from an amplifier transistor is converted into a digital data by the A/D converter connected to an OUT wiring.

[Continuous Non-Sharing Capturing Method]

Next, a continuous non-sharing capturing method is described. In this method, the sharing transistor is turned off, and each subpixel is regarded as an individual pixel. In the driving method of pixels, the subpixels corresponding to respective pixels (all pixels). TX1 to TXn, are sequentially reset and exposed. Then, data is sequentially read out from subpixels in every row, and the data is converted into a digital data by the A/D converter. Thus, a continuous capturing method can be performed. In this method, the photodiodes are not shared between the subpixels, and the sensitivity is lowered compared with that in the continuous sharing capturing method; however, there is an advantage in noise because there is no contribution of sharing path that serves as a noise source.

[Normal Capturing Method]

Then, a normal capturing method is described. In this method, the transistor 829 is set in an off state, and each subpixel is regarded as an individual pixel. As the driving method of pixels, the subpixels corresponding to respective pixels (all pixels), TX1 to TXn, are concurrently reset and exposed. Then, data is sequentially read out from the subpixels in every row, and data is converted into a digital data by the A/D converter. Thus, the image capturing can be performed in a manner similar to that of a normal image sensor.

<Image-Capturing Result>

In order to verify that the continuous sharing capturing method, the continuous non-sharing capturing method, and the normal capturing method are applicable to image capturing, images were captured by the above capturing methods under a condition where uniform light from a steady light source is incident on the solid-state imaging device 810.

Specifically, images of a light source with uniform brightness were captured under the following seven conditions: capturing with a continuous sharing capturing method (hereinafter, referred to as "Method A"); capturing of only a subpixel corresponding to TX1 with use of a continuous sharing capturing method (hereinafter, referred to as "Method B"); capturing of only a subpixel corresponding to TX2 with use of a continuous sharing capturing method (hereinafter, referred to as "Method C"); capturing with a continuous non-sharing capturing method (hereinafter, referred to as "Method D"); capturing of only a subpixel corresponding to TX1 with use of a continuous non-sharing capturing method (hereinafter, referred to as "Method E"); capturing of only a subpixel corresponding to TX2 with use of a continuous non-sharing capturing method (hereinafter, referred to as "Method F"); and capturing with a normal capturing method (hereinafter, referred to as "Method G"). As the light source, a metal halide lamp LA-180Me-R4 manufactured by HAYASHI WATCH-WORKS CO., LTD was used. The reset time for image capturing was 90 μs, and the exposure time for image capturing was 180 μs.

Figure 49A:
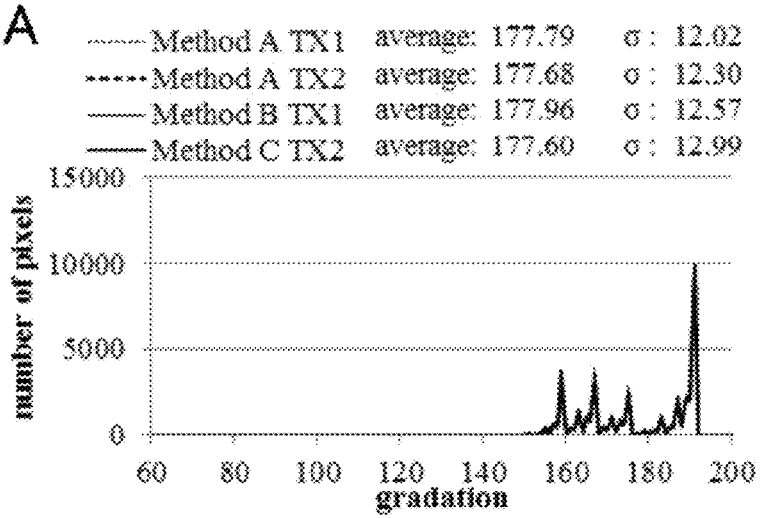
FIGS. 49A to 49C show histograms of gray scales of captured images.
Figure 49B:
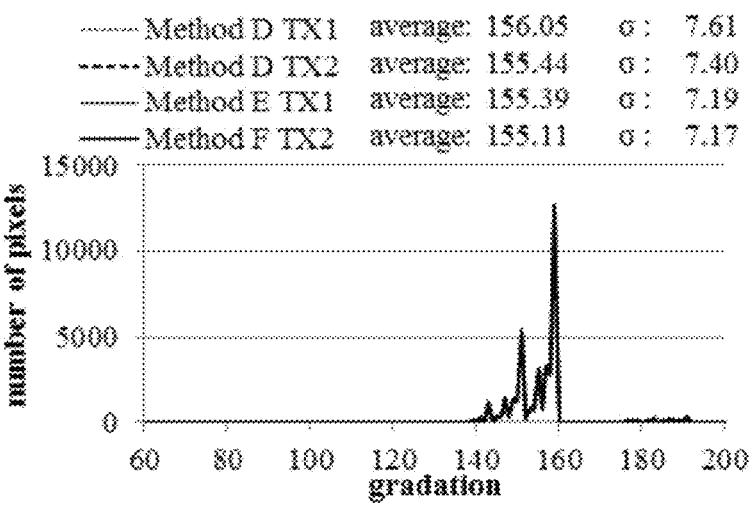
Figure 49C:
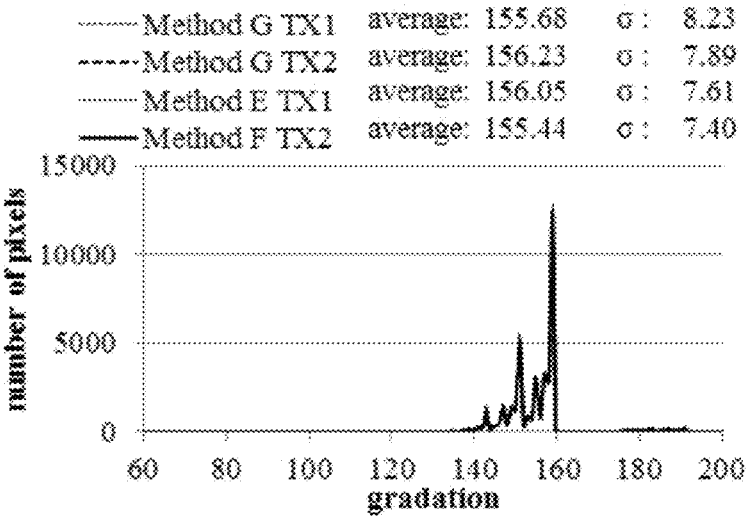

FIG. 48 shows captured images. FIGS. 49A to 49C each show gradation histograms of the captured images. FIGS. 50A to 50F and FIGS. 51A to 51C show histograms showing a difference in gradations per pixel by different capturing methods. FIG. 52 shows standard deviations of a gradation difference between two frames of five frames. Note that "gradation" in the graphs is an output digital value after the A/D conversion of the captured images, which corresponds to luminance. As the value is larger, the luminance is increased. As the value is smaller, the luminance is lowered. In order to compare raw noises including the contribution of sharing path and the like, which were generated through the capturing methods, raw image data that was not subjected to correlated double sampling (CDS) is shown as the captured images. Thus, noise that can be canceled by CDS is included.

[Result Obtained by Continuous Sharing Capturing Method]

First, a continuous sharing capturing method was examined. Specifically, in order to evaluate the effect on images on subpixels corresponding to TX1 and TX2 captured continuously in a short period, a TX1 image and a TX2 image obtained by Method A; a TX1 image obtained by Method A and a TX1 image obtained by Method B; and a TX2 image obtained by Method A and a TX2 image obtained by Method C were compared. Note that these captured images should be accorded with each other intrinsically.

According to the histograms shown in FIG. 49A, differences of average values of gradation between the TX1 image and the TX2 image by Method A, between the TX1 image by Method A and the TX1 image by Method B, and between the TX2 image by Method C and the TX2 image by Method C are respectively, 0.11, 0.15, and 0.08, which means that the histograms have almost the same pattern.

Figure 50A:
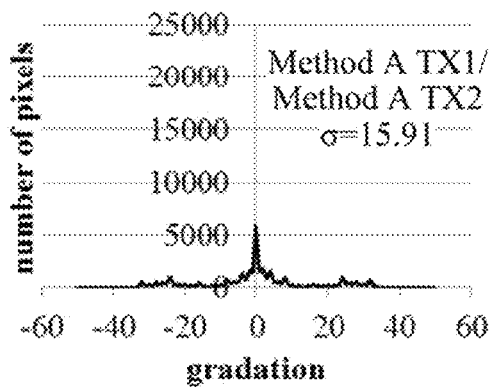
FIGS. 50A to 50F show histograms of a difference in gray scale per pixel in accordance with different capturing methods.
Figure 50B:
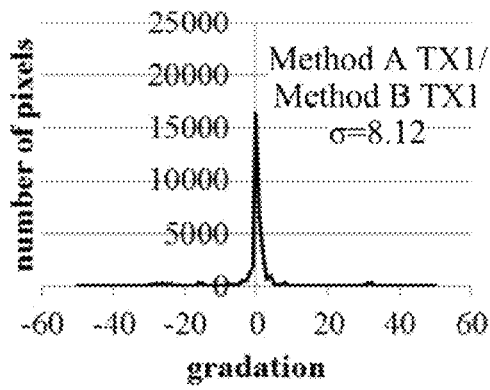
Figure 50C:
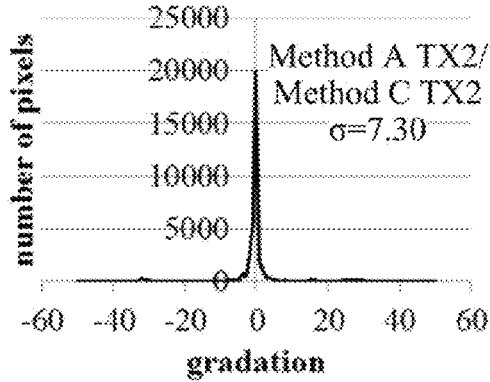

According to the histograms in FIGS. 50A, 50B, and 50C, for gradation differences between the TX1 image and the TX2 image by Method A, between the TX1 image by Method A and the TX1 image by Method B, and between the TX2 image by Method A and the TX2 image by Method C, the standard deviations are respectively 15.91, 8.12, and 7.30. The gradation difference between the TX1 image and the TX2 image by Method A is within the standard deviation, $(12.02^2+12.30^2)^{1/2}=17.20$, that is estimated from the standard deviations, 12.02 and 12.30, of the histograms in FIG. 49A. Thus, it is found that the difference in gradation is distributed within a range estimated from the in-plane variation of pixels.

The differences in gradations between the TX1 image by Method A and the TX1 image by Method B and between the TX2 image by Method A and the TX2 image by Method C are the substantially same as the standard deviations, 5.19 to 8.35 and 5.50 to 8.08, shown in FIG. 52. Thus, it is found that each difference in gradation has a distribution estimated from a variation between frames.

According to the above, by the continuous sharing capturing method, images can be captured independently on the subpixels corresponding to TX1 and TX2 with use of the same photodiode.

[Result Obtained by Continuous Non-Sharing Capturing Method]

Next, the continuous non-sharing capturing method was examined. Specifically, in order to evaluate the effect on images captured continuously in a short period on subpixels corresponding to TX1 and TX2, a TX1 image and a TX2 image obtained by Method D; a TX1 image by Method D and a TX1 image by Method E; and a TX2 image by Method D and a TX2 image by the F method were compared. Note that these images should be accorded with each other except for the range of deviation of light intensity caused by a difference in positions of the subpixels corresponding to TX1 and TX2.

According to the histograms shown in FIG. 49B, differences of average values of gradation between the TX1 image and the TX2 image by Method D, between the TX1 image by Method D and the TX1 image by Method E, and between the TX2 image by Method D and the TX2 image by the F method are respectively 0.61, 0.66, and 0.33. Thus, it is found that the histograms have almost the same pattern.

Figure 50D:
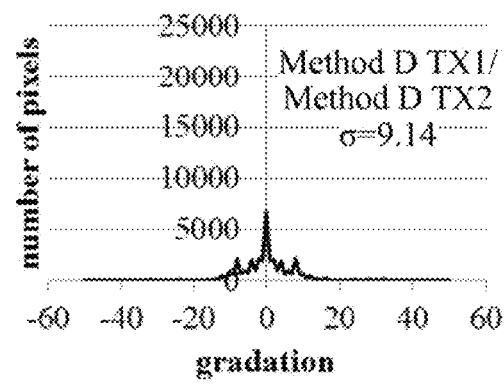
Figure 50E:
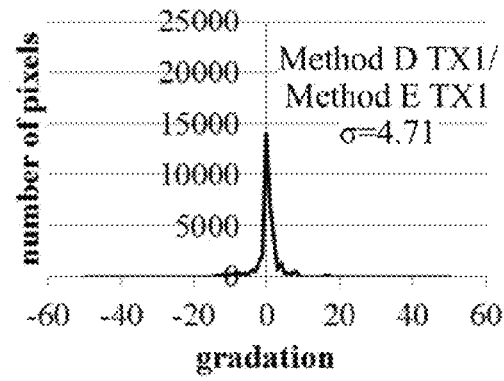
Figure 50F:
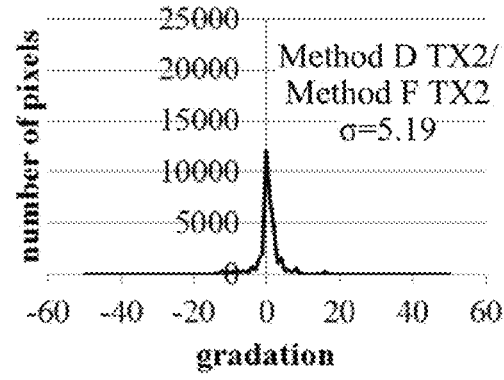

According to the histograms in FIG. 50D, FIG. 50E, and FIG. 50F, for gradation differences between the TX1 image and the TX2 image by Method D, between the TX1 image by Method D and the TX1 image by Method E, and between the TX2 image by Method D and the TX2 image by the F method, the standard deviations are respectively 9.14, 4.71, and 5.19. The difference in gradation between the TX1 image and the TX2 image by Method D is within the range of the standard deviation, $(7.61^2+7.40^2)^{1/2}=10.61$, estimated from the standard deviations of the histograms in FIG. 49B, 7.61 and 7.40. Thus, it is found that the difference in gradation is distributed within the range estimated from the in-plane variation of pixels.

The differences in gradations between the TX1 image by Method D and the TX1 image by Method E, and between the TX2 image by Method D and the TX2 image by the F method, are substantially equal to standard deviations, 2.75 to 3.68 and 3.22 to 3.89, shown in FIG. 52. Thus, it is found that each difference has a distribution estimated from a variation between frames.

According to the above, by the continuous non-sharing capturing method, images can be captured individually on the subpixels corresponding to TX1 and TX2.

[Result Obtained by Normal Capturing Method]

Next, the normal capturing method was examined. Specifically, in order to evaluate the effect on images captured concurrently or independently on subpixels corresponding to TX1 and TX2, a TX1 image and a TX2 image by Method G; a TX1 image by Method E and a TX1 image by Method G; and a TX2 image by F method and a TX2 image by Method G were compared. Note that these captured images should be accorded with each other except for the range of deviation of light intensity caused by a difference in positions of the subpixels corresponding to TX1 and TX2.

According to the histograms in FIG. 49C, differences of average values of gradations between the TX1 image and the TX2 image by Method G, between the TX1 image by Method E and the TX1 image by Method G, and between the TX2 image by the F method and the TX2 image by Method G are respectively 0.55, 0.37, and 0.79. Thus, it is found that the histograms have almost the same pattern.

Figure 51A:
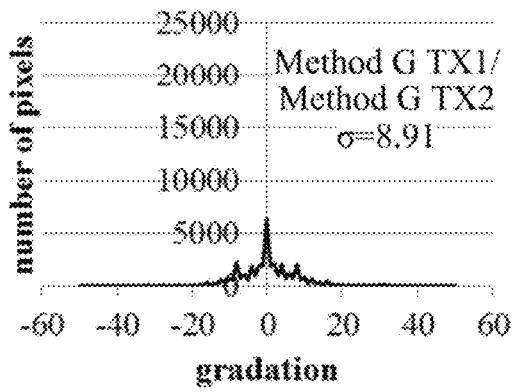
FIGS. 51A to 51C show histograms of a difference in gray scale per pixel in accordance with different capturing methods.
Figure 51B:
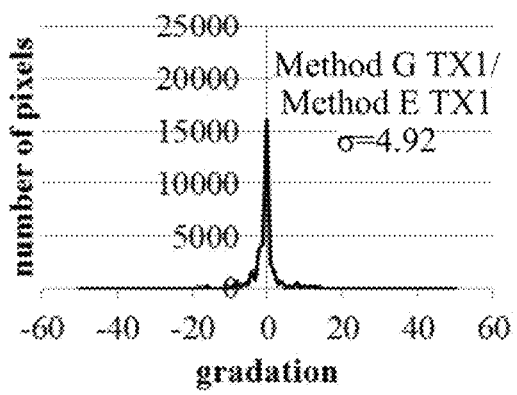
Figure 51C:
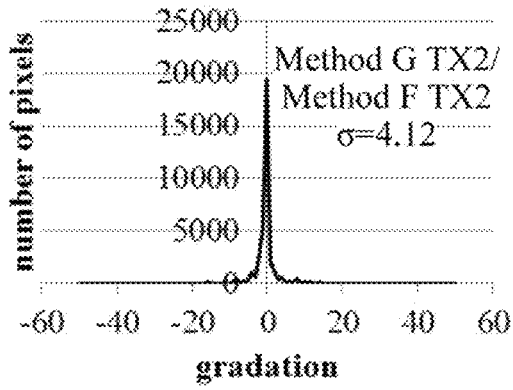

According to the histograms in FIG. 51A, FIG. 51B, and FIG. 51C, for differences in gradations between the TX1 image and the TX2 image by Method G, between the TX1 image by Method E and the TX1 image by Method G, and between the TX2 image by the F method and the TX2 image by Method G, the standard deviations are respectively 8.91, 4.92, and 4.12. The difference in gradation between the TX1 image and the TX2 image by Method G is within the standard deviation, $(8.23^2+7.89^2)^{1/2}=11.40$, estimated from the standard deviation of the histograms in FIG. 49C, 8.23 and 7.89. Thus, it is found that the difference in gradation is distributed in the range estimated from the in-plane variation of pixels.

The differences in gradations between the TX1 image by Method G and the TX1 image by Method E and between the TX2 image by Method G and the TX2 image by the F method are substantially equal to standard deviations, 2.75 to 4.86 and 2.93 to 3.95, shown in FIG. 52. Thus, it is found that each difference has a distribution estimated from a variation between frames.

According to the above, in both cases of using the normal capturing method and the continuous sharing capturing method, images captured on the subpixels corresponding to TX1 and TX2 can be almost equal to each other.

[Sensitivity Comparison Between Continuous Sharing Capturing Method and Continuous Non-Sharing Capturing Method]

Next, the sensitivity of the continuous sharing capturing method and the sensitivity of the continuous non-sharing capturing method are compared, so that the sensitivity-enhancing effects proposed by turning a sharing transistor on is verified. Through the both methods, the images were captured under the condition of irradiation with uniform light whose intensity was changed, from the metal halide lamp LA-180Me-R4 manufactured by HAYASHI WATCH-WORKS CO., LTD. Note that the reset time was 90 µs, and the exposure time was 180 µs. The captured images were subjected to CDS treatment in the software with use of a reset image obtained by each capturing method, and then the relation between the amount of light (irradiation intensity× irradiation time) and the output digital value (gray level) after the A/D conversion was examined for each capturing method.

From the relation between the input voltage of the A/D converter circuit (corresponding to the source follower output voltage of the pixel) and the gray level, the relation between the gray level and the source follower voltage of pixel was clarified, so that the sensitivity was calculated. As a result, the sensitivity of the continuous sharing capturing method and the sensitivity of the continuous non-sharing capturing method were respectively 0.224 V/(lx·s) and 0.196 V/(lx·s) as shown in FIG. 46.

The above results indicate that the sensitivity of approx. 14% was increased by turning the sharing transistor on. With the optimization of the sharing path, further enhancement of sensitivity can be expected.

Figure 53A:
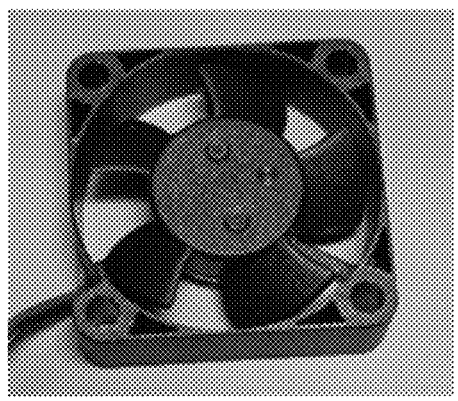
FIGS. 53A to 53C are a photograph of an external appearance of a fan and photographs of a fan spun at high speed.
Figure 53B:
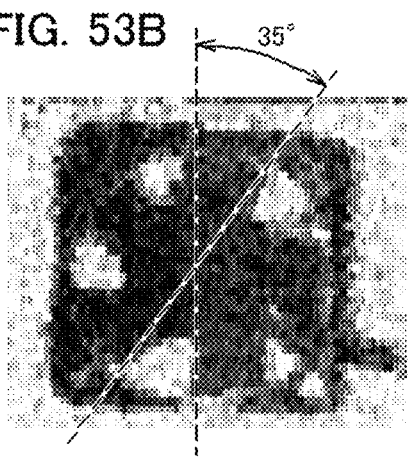
Figure 53C:
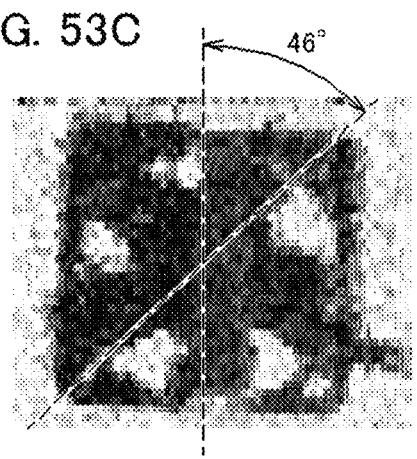

In order to verify that the continuous capturing in a short period can be performed by the above capturing method, an image of a fan (see FIG. 53A) spinning at high speed was captured with the solid-state imaging device 810. The imaging was performed in a condition where the solid-state imaging device 810 is positioned in front of a planar light source. Thus, a shadow of the fan was actually captured. Note that the spin rate of the fan was 6000 rpm, and the image-capturing duration was 300 µs. The images captured on the subpixels corresponding to TX1 and TX2 are shown in FIGS. 53B and 53C. The images were subjected to a process in which a reset image and an all-white image that had been captured in advance were set at gray scale levels of 0 and 255 with use of software, so that the contrast was adjusted. By comparison of the images captured on the subpixels corresponding to TX1 and TX2 in FIG. 53B and FIG. 53C, a difference of approx. 11° corresponding to an angle caused by a spin at 6000 rpm in a period of 300 µs is observed. In other words, the continuous capturing in a short period can be performed by the above capturing method.

[Short Interval Continuous Capturing]

Next, power consumption of the solid-state imaging device 810 whose image-capturing duration is 300 µs was measured. The measurement results of power consumption is shown in FIG. 54A. FIG. 54A shows power consumed at each part in the solid-state imaging device 810. Note that the total power consumption of the solid-state imaging device 810 was 809 µW.

Next, the power consumption of the conventional solid-state imaging device (image sensor for high-speed camera disclosed in Non-Patent Document 1) and the power consumption of the solid-state imaging device 810 were compared. The comparison between the conventional solid-state imaging device and the solid-state imaging device 810 is shown in FIG. 54B. In FIG. 54B, FOM (figure of merit) is defined as FOM=power consumption÷(number of pixels× frame rate×resolution of A/D converter). With the solid-state imaging device 810, the image capturing duration can be 300 µs, i.e., image capturing with 3333 fps is possible, and the FOM is 1.58 pW/(pixel×fps×bit). In the conventional solid-state imaging device, the resolution of image is 514× 530, the resolution of A/D converter is 12 bit, and the power consumption at 3500 fps is 1 W; FOM is 87.40 pW/(pixel× fps×bit). In comparison of the FOM of the two capturing methods, the power consumption of the solid-state imaging device 810 is approximately $\frac{1}{55}$ of the power consumption of conventional solid-state imaging device. Thus, the solid-state imaging device 810 is superior to the conventional solid-state imaging device in terms of power consumption.

For the solid-state imaging device of one embodiment of the present invention, a high-speed A/D conversion circuit is not needed; accordingly, low power consumption can be achieved. With one embodiment of the present invention, peripheral circuits such as an A/D conversion circuit, a row driver, and a column driver can be constituted by Pch-Si-FETs and CAAC-IGZO-FETs. A pixel circuit can be constituted by CAAC-IGZO-FETs and photodiodes. Thus, with one embodiment of the present invention, a stacked CMOS including a Pch-Si-FET and a CAAC-IGZO-FET can be achieved. In other words, a CMOS without an Nch-Si-FET can be achieved.

Example 4

Figure 55A:
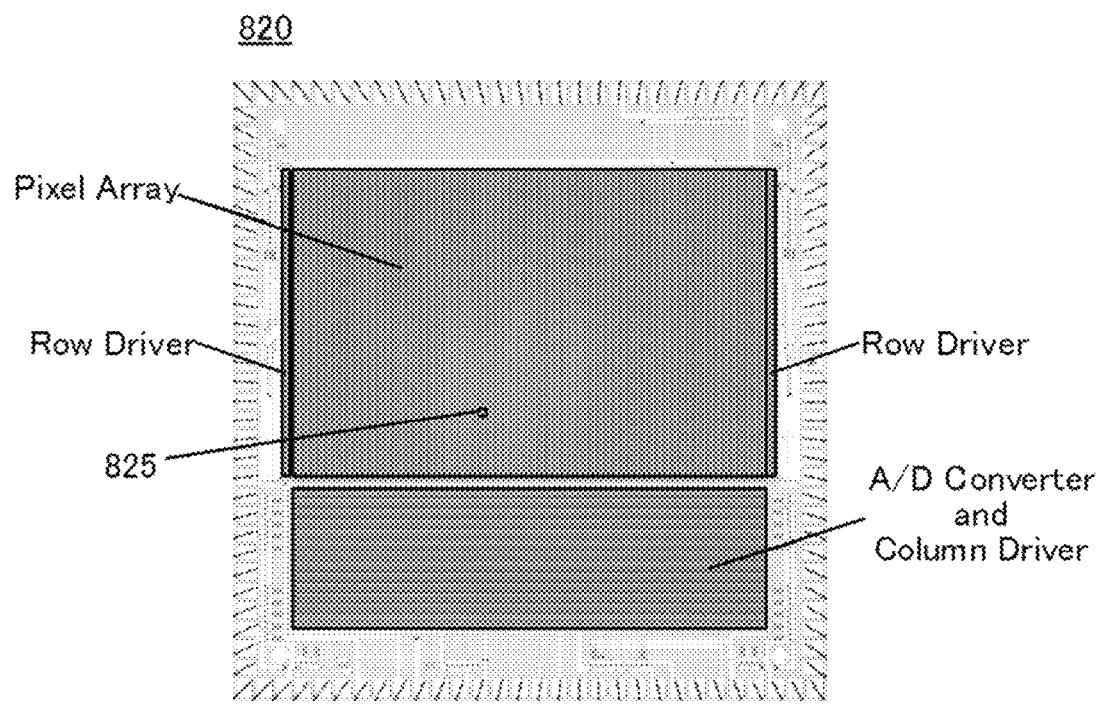
FIGS. 55A and 55B are a photograph of an external appearance of a solid-state imaging device and an enlarged photograph of a pixel included in a solid-state imaging device.

A solid-state imaging device 820 was fabricated as a display device relating to the above embodiment. FIG. 55A is a photograph showing an external appearance of the fabricated solid-state imaging device 820.

The solid-state imaging device 820 includes a plurality of pixels arranged in matrix in a pixel region (pixel array). The solid-state imaging device 820 is provided with peripheral circuits (row driver, column driver, A/D converter, and the like) outside the pixel array.

The row driver has a function of selecting a pixel from which image data obtained by image capturing is read. The A/D converter has a function of converting the read image data from an analog data into a digital data. The column driver has a function of sequentially selecting an image data (digital data) transferring to the outside of the solid-state imaging device 820.

Figure 55B:
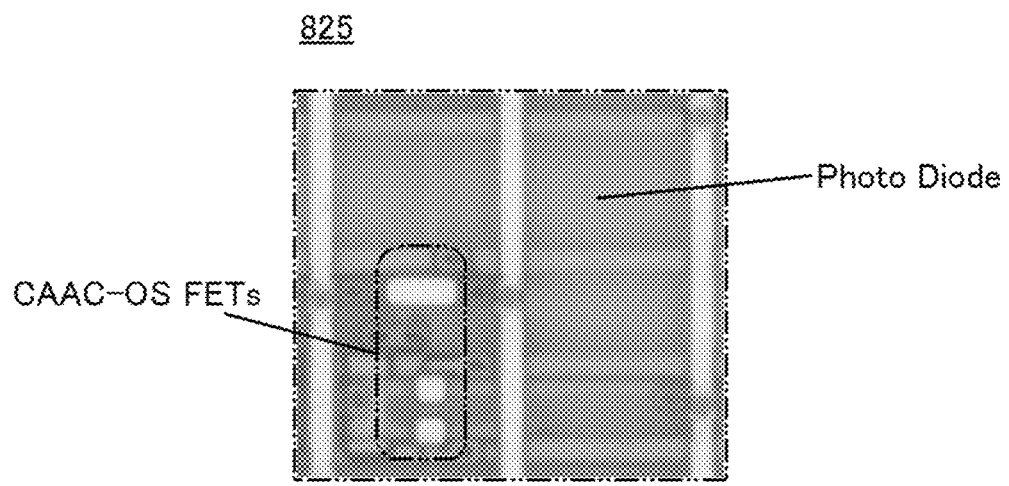

FIG. 55B is a photograph showing an enlarged pixel 825 that is shown in FIG. 55A. The pixel includes a photodiode and a plurality of transistors. All of the transistors included in the pixel region are CAAC-IGZO-FETs. Thus, it is not necessary to provide a pixel transistor over a silicon substrate, and the size of photodiode provided over the silicon substrate can be increased. An enhancement in photosensitivity of the solid-state imaging device 820 can be expected. The solid-state imaging device 820 employs a front side illumination structure in which irradiation light is obtained from a top surface of a chip and has a fill factor of 30%. When a back side illumination structure can be employed, the fill factor can be 100%.

The specifications of the solid-state imaging device 820 are shown in FIG. 56. The solid-state imaging device 820 was fabricated with a hybrid process using a Si-FET with a technology size (channel length) of 0.18 µm and a CAAC-IGZO-FET with a technology size (channel length) of 0.35 µm. The die size is 6.5 mm×6.0 mm.

An image of an object spinning at approx. 400 rpm that was captured with the solid-state imaging device 820 is shown in FIG. 57A2. FIG. 57A1 shows a captured image of the object in a rest state. The images shown in FIG. 57A1 and FIG. 57A2 are captured by a global shutter system. An image of an object spinning at approx. 400 rpm that was captured with a camera mounted on a smartphone (commercial product) is shown in FIG. 57B2. FIG. 57B1 shows a captured image of the object in a rest state. The images shown in FIG. 57B1 and FIG. 57B2 are captured by a rolling shutter system.

According to FIG. 57B2, the image of the spinning object with a rolling shutter system is distorted. In contrast, according to FIG. 57A2, by shooting of the spinning object with a global shutter system, an image of the object, which is hardly distorted, can be obtained.

Example 5

In the optical flow system including a DSP and an image sensor (imaging device), high-speed image capturing is required for accurately obtaining optical flow; however, all images are not necessary for calculation of the optical flow. Thus, the conventional image sensor with a high frame rate is not always effective because unnecessary images are often captured and the power consumption is high.

Thus, a solid-state imaging device 830 relating to the above embodiment is fabricated, and an optical flow system 880 using the solid-state imaging device 830 is proposed. The solid-state imaging device 830 relating to the above embodiment can perform continuous capturing with a duration of 100 μs, that is equal to 10000 fps, and can read data at 1 fps. Thus, with use of the solid-state imaging device 830, image data that is sufficient for calculating the optical flow can be obtained at low power consumption.

Figure 58A:
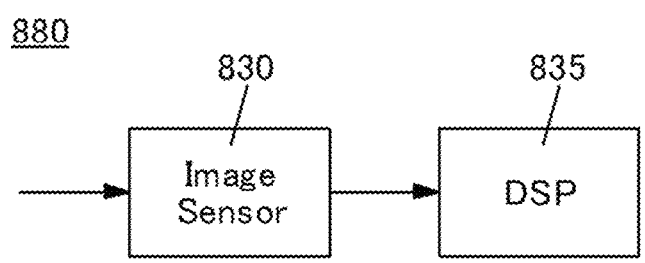
FIGS. 58A and 58B is a block diagram of optical flow system and a photograph showing an external appearance of a solid-state imaging device.
Figure 58B:
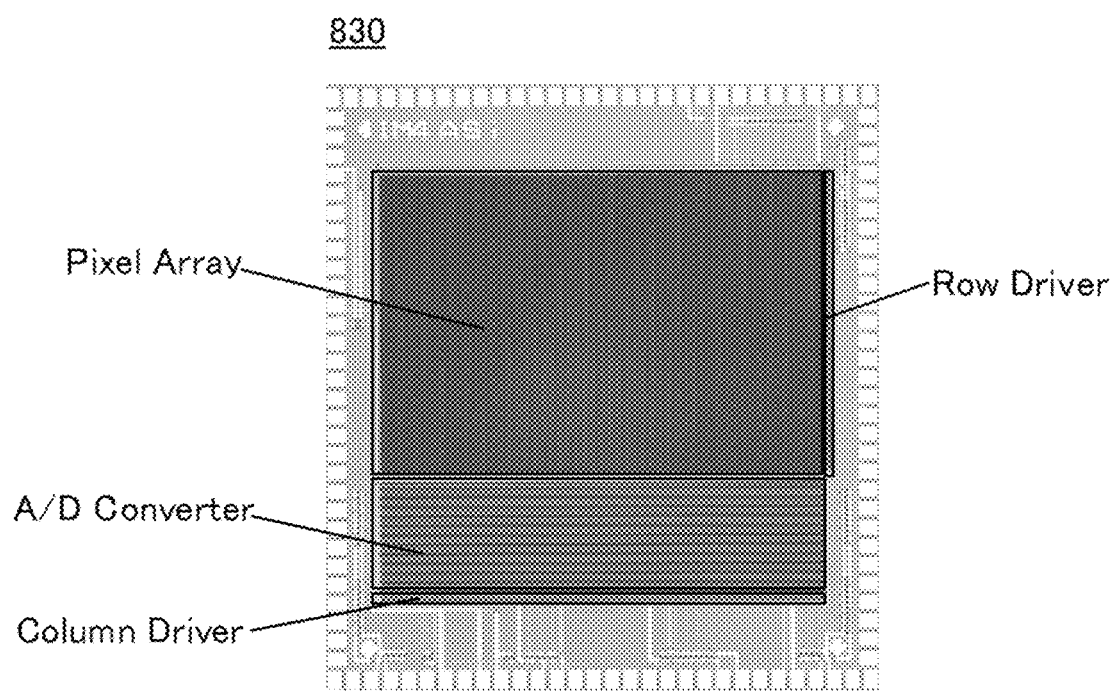

FIG. 58A is a block diagram of the optical flow system 880. FIG. 58B is a photograph showing an external appearance of the fabricated solid-state imaging device 830. In the optical flow system 880, in order to reduce instantaneous power in consideration of a reduction in load for a power supply system, the solid-state imaging device 830 captures two images at high speed and reads the captured image data at low speed by the start of calculation of optical flow by a DSP block 835.

Figure 59:
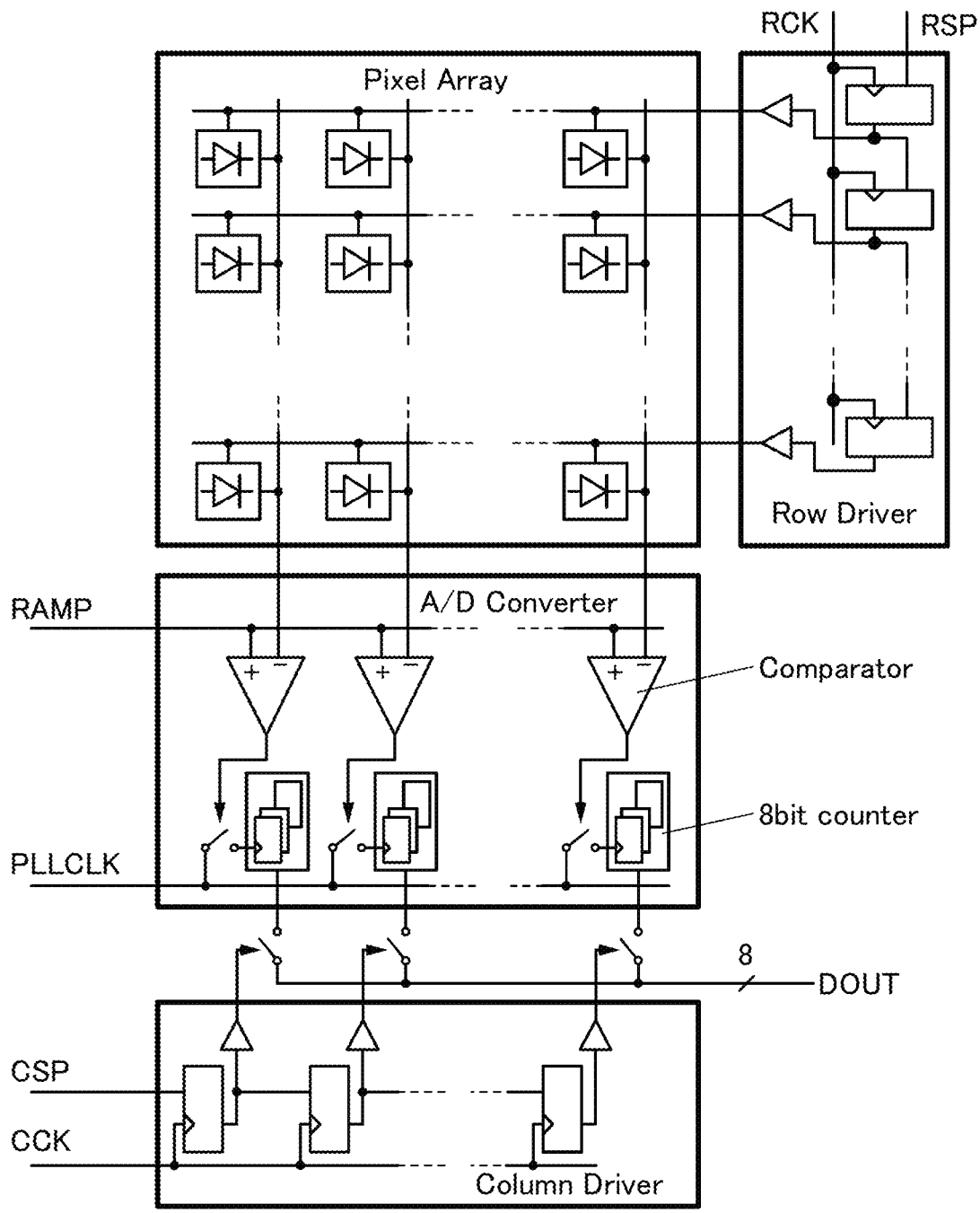
FIG. 59 is a block diagram showing a circuit configuration of a solid-state imaging device.

The solid-state imaging device 830 includes a plurality of pixels arranged in matrix in a pixel region (pixel array). The solid-state imaging device 830 is provided with peripheral circuits (row driver, column driver, A/D converter, and the like) outside the pixel region. FIG. 59 is a block diagram of the entire of solid-state imaging device 830.

The row driver has a function of selecting a pixel from which image data obtained by image capturing is obtained. The A/D converter has a function of converting the read image data from an analog data into a digital data. The column driver has a function of sequentially selecting an image data (digital data) transferring to the outside of the solid-state imaging device 830.

The pixel includes a photodiode and a plurality of transistors. All of the transistors in the pixel region are CAAC-IGZO-FETs. Thus, it is not necessary to provide a pixel transistor over a silicon substrate, and the size of a photodiode over the silicon substrate can be increased.

The specifications of the solid-state imaging device 830 are shown in FIG. 60. The solid-state imaging device 830 was fabricated with a hybrid process using a Si-FET with a technology size (channel length) of 0.18 μm and a CAAC-IGZO-FET with a technology size (channel length) of 0.35 μm.

The solid-state imaging device 830 can perform short interval continuous capturing and low-speed reading. The solid-state imaging device 830 can capture two images at a short interval and read the image data at a low frame rate.

Figure 61:
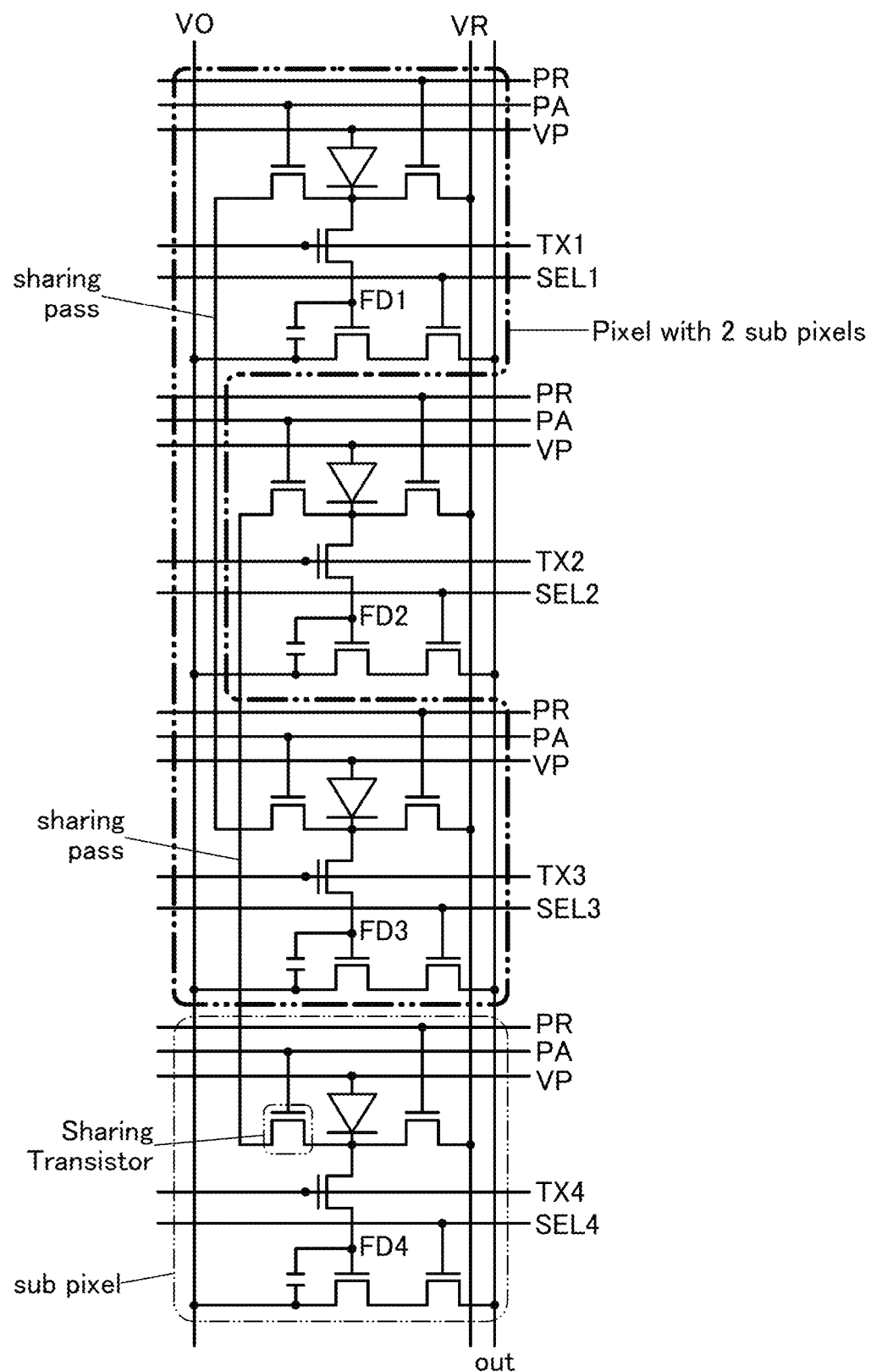
FIG. 61 shows a circuit configuration of a pixel.

The DSP block 835 makes an optical flow from the two images. A circuit diagram of pixels in the solid-state imaging device 830 is shown in FIG. 61. One pixel includes two subpixels. Each subpixel includes four transistors, one photodiode, and one sharing transistor. The photodiodes can be shared between the two subpixels in the pixel through the sharing transistors. In addition, in order to adopt the Bayer pattern in consideration of capturing color images, between the two subpixels, a subpixel belonging to another pixel is sandwiched. When the pixel transistor is formed with a CAAC-IGZO-FET, the charge retention characteristics at an FD can be improved, and data with less deterioration of image can be read at low speed.

Figure 62:
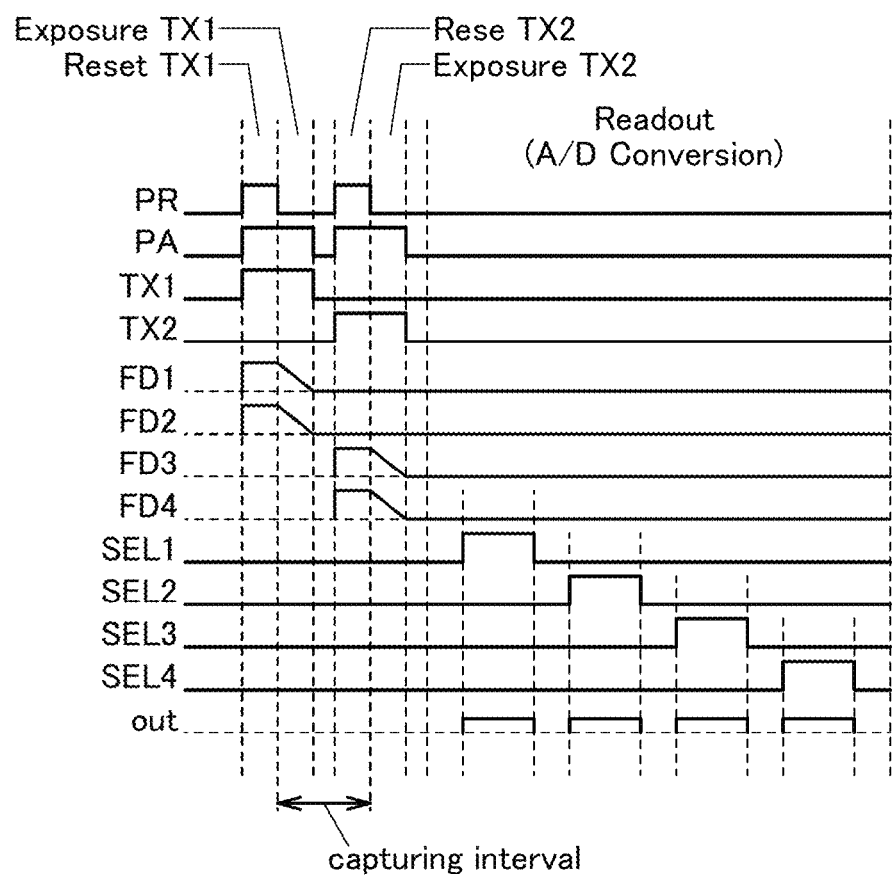
FIG. 62 is a timing chart showing capturing operation of a solid-state imaging device according to examples.

As shown in a timing chart in FIG. 62, in the solid-state imaging device 830, TX1 and TX2 are sequentially activated, whereby exposure can be continuously performed at a short interval. After the continuous exposure, the imaging data is sequentially read every row and subjected to A/D conversion. In other words, the high-speed continuous capturing with short time capturing/slow read out can be performed, and high-speed performance is not additionally required for the A/D converter; thus, low power consumption can be expected.

Figure 63:
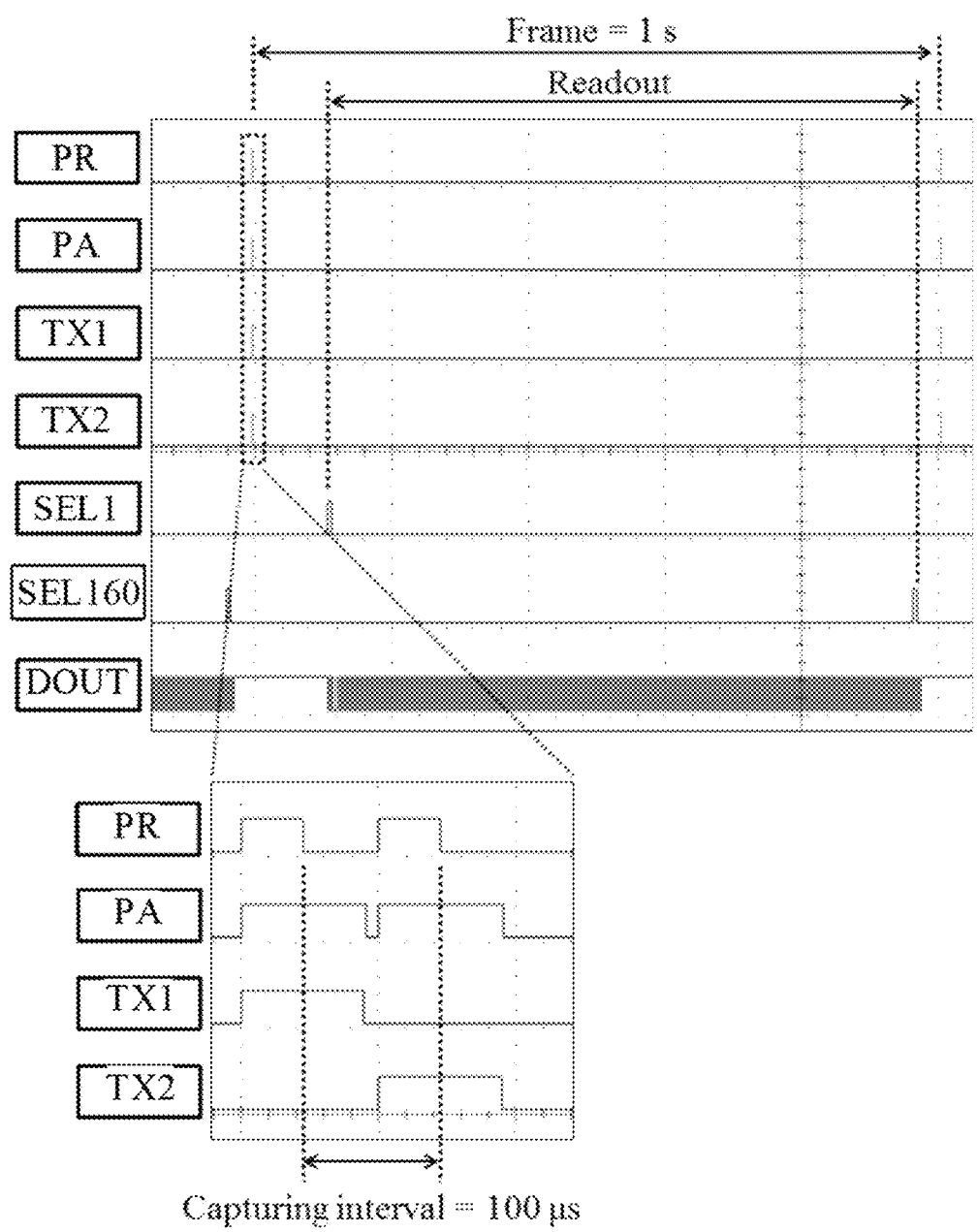
FIG. 63 shows measurement wavelengths.

A fan A spinning at 6500 rpm and a fan B spinning at 10000 rpm were shot with the solid-state imaging device 830, and the optical flow was calculated from the captured images. The optical flows of when the capturing interval was 100 μs and 1000 μs were calculated at a frame rate of 1 fps. As an example, the measurement waveforms when the capturing interval was 100 μs are shown in FIG. 63.

Figure 64A:
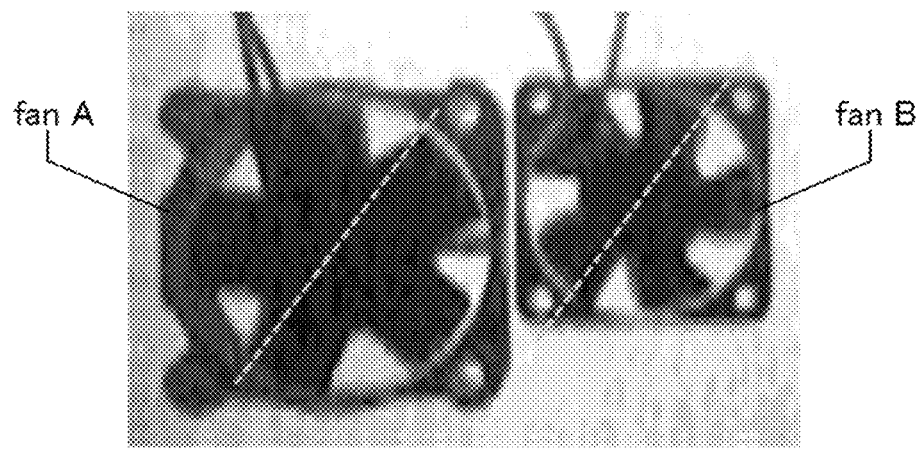
FIGS. 64A to 64C are photographs captured with a solid-state imaging device.
Figure 64B:
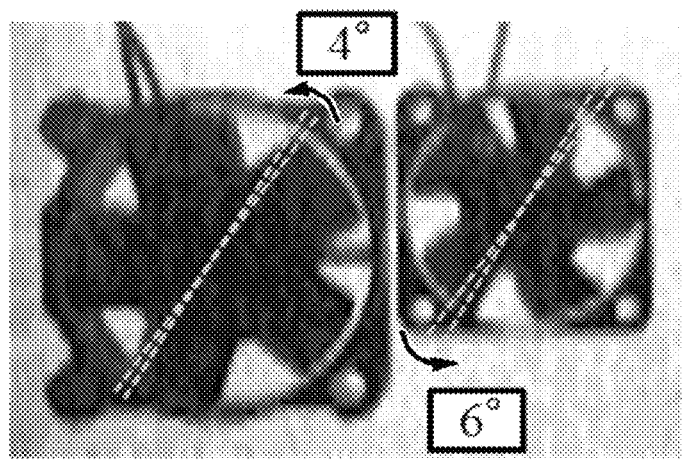
Figure 64C:
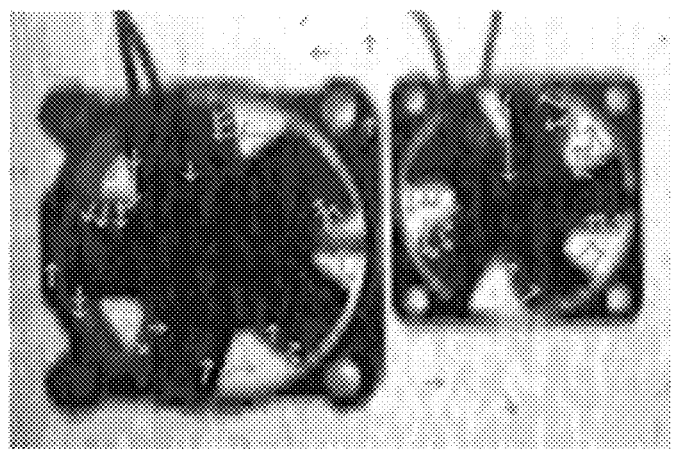
Figure 65A:
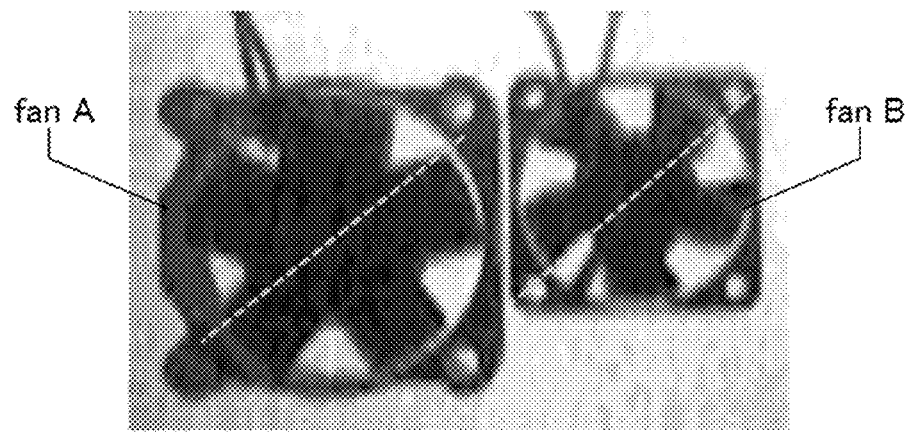
FIGS. 65A to 65C are photographs captured with a solid-state imaging device.
Figure 65B:
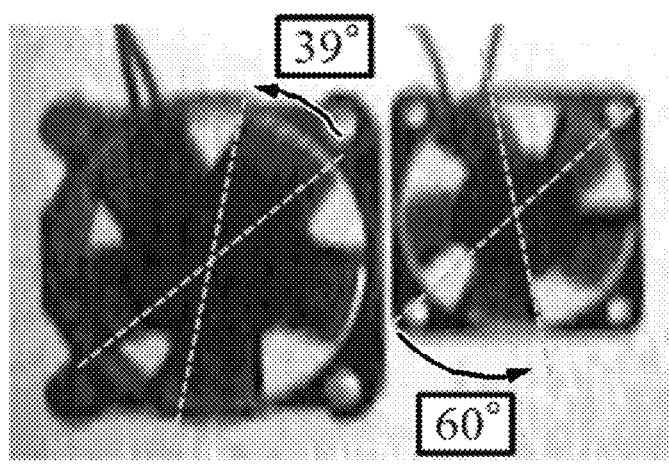
Figure 65C:
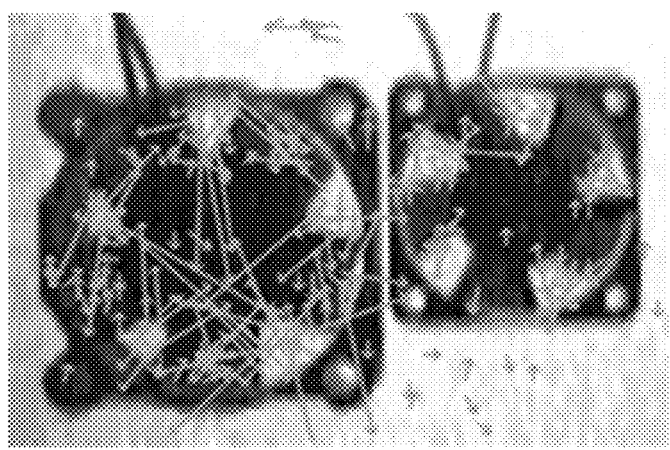

FIGS. 64A to 64C each show an image when the capturing interval is 100 μs. FIG. 64A is a TX1 image, and FIG. 64B is a TX2 image. FIG. 64C shows optical flows calculated by Lucas-Kaneda method. FIGS. 65A to 65C each show an image when the capturing interval is 1000 μs. FIG. 65A is a TX1 image, and FIG. 65B is a TX2 image. FIG. 65C shows optical flows calculated by Lucas-Kaneda method.

From FIGS. 64A and 64B and FIGS. 65A and 65B, angular differences made by spinning of the fans in the capturing interval can be shown. FIG. 64C shows accurate optical flows of the two fans when the capturing interval is 100 μs. In FIG. 65C showing the case where the capturing interval is 1000 μs, the directions of flows of the fan A are random, and the flows of the fan B indicate as if the fan B spun inversely. The above results indicate that the optical flow can be accurately obtained from the images obtained by high-speed continuous capturing with the solid-state imaging device 830.

Figure 66A:
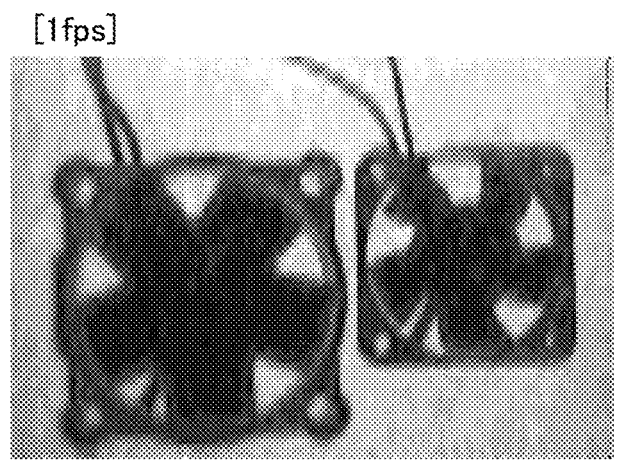
FIGS. 66A and 66B are photographs captured with a solid-state imaging device.
Figure 66B:
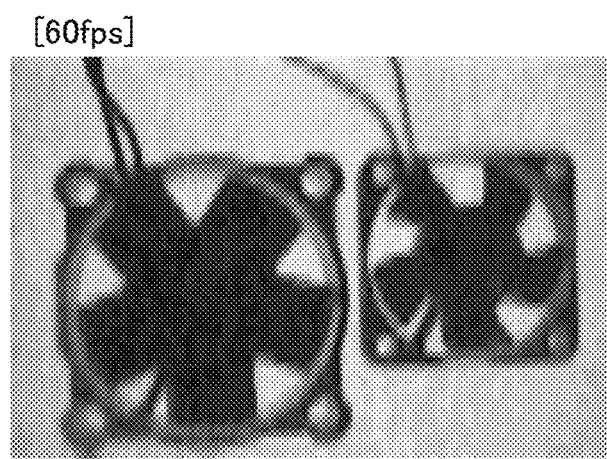

Next, in order to demonstrate that image quality hardly deteriorates even by low-speed reading, an image of a fan in a rest state was captured in the following conditions: the frame rate was 1 fps; and the frame rate was 60 fps. FIG. 66A is an image captured at a frame rate of 1 fps. FIG. 66B is an image captured at a frame rate of 60 fps. At either frame rate, the image of the fan can be captured normally.

In both cases where the frame rate was 1 fps and where the frame rate was 60 fps, image capturing of a uniform planar light source was performed, and a difference in gray scale between the first row and the last row in reading was estimated. The estimation results were that the difference in gray scale at a frame rate of 1 fps was 0.16 and the difference in gray scale at a frame rate of 60 fps was 0.064. It was confirmed that image quality hardly deteriorated even at a low frame rate, owing to low leakage characteristics of a CAAC-IGZO-FET.

Figures 67A, 67B:
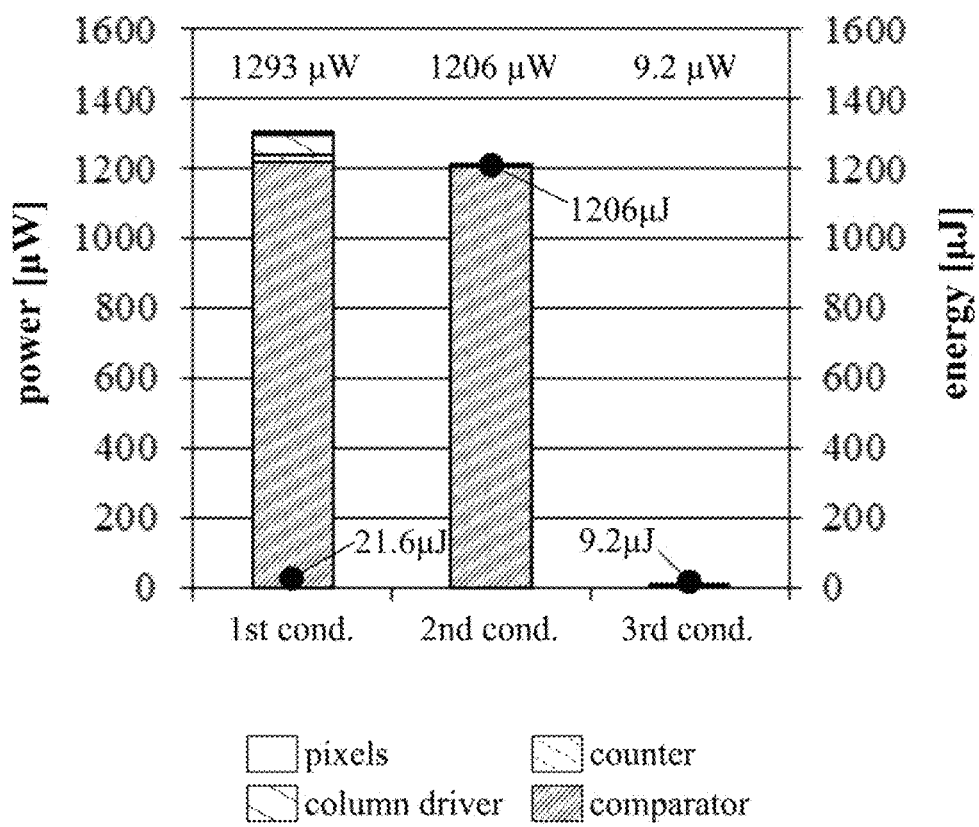
FIGS. 67A and 67B show power consumption of a solid state imaging device and measurement results of consumption energy.

In order to evaluate the effect of a reduction in power consumption of the solid-state imaging device 830, the power consumption and the consumption energy per frame under three conditions shown in FIG. 67A were measured. FIG. 67B shows measurement results. When a first condition (Condition 1) is regarded as a reference, the power under a second condition (Condition 2) in which only the frequency is reduced was 92.3% under that of Condition 1, and the power under a third condition (Condition 3) in which the frequency and the voltage are reduced was 0.71% of that under Condition 1. In addition, the results show that the consumption energy per frame under Condition 3 is lower than that under Condition 1. Since the voltage as well as frequency can be reduced under the low frame rate conditions, the saving-energy effect at such a level that the consumption energy per frame can be lowered was observed.

For example, the following case is considered: an image with 8-bit gray scale is captured at 10000 fps with use of the solid-state imaging device 830 (the number of pixels is 128×128), and the optical flows are calculated at 1 fps. The power of the solid-state imaging device 830 can be estimated as 7.9 µW (=9.2 µW/(240×80)×(128×128)) from Condition 3 in FIG. 67B. With use of the solid-state imaging device 830 relating to the above embodiment, an optical flow system with high accuracy and low instantaneous power can be achieved.

EXPLANATION OF REFERENCE

103: insulating layer, 104: insulating layer, 105: insulating layer, 106: contact plug, 107: insulating layer, 108: insulating layer, 109: insulating layer, 110: pixel portion, 111: pixel, 112: subpixel, 113: insulating layer, 114: contact plug, 115: insulating layer, 116: insulating layer, 117: insulating layer, 118: insulating layer, 121: transistor, 122: transistor, 123: transistor, 124: transistor, 125: transistor, 126: transistor, 127: transistor, 128: transistor, 129: transistor, 131: wiring, 132: wiring, 133: wiring, 134: wiring, 135: wiring, 136: wiring, 137: wiring, 141: wiring, 142: wiring, 143: wiring, 144: wiring, 146: wiring. 151: capacitor, 152: transistor, 153: transistor, 154: transistor, 155: transistor, 161: wiring, 201: switch, 202: switch, 203: switch, 205: insulating layer, 207: photodiode, 209: insulating layer, 213: electrode, 217: insulating layer, 220: photoelectric conversion element, 221: p-type semiconductor layer, 222: i-type semiconductor layer, 223: n-type semiconductor layer. 224: opening, 225: opening, 226: electrode, 227: electrode, 230: pixel circuit, 235: electrode, 241: transistor, 242: semiconductor layer 243: electrode, 244: electrode, 245: electrode, 246: transistor. 249: electrode, 251: pixel region, 252: peripheral circuit region, 254: node, 255: impurity element, 256: node, 257: capacitor, 260: peripheral circuit, 261: wiring, 263: wiring, 265: wiring. 266: wiring, 267: wiring, 270: peripheral circuit, 280: peripheral circuit, 281: transistor, 282: transistor, 283: i-type semiconductor layer, 284: low-concentration p-type impurity region, 285: p-type semiconductor layer, 286: insulating layer, 287: electrode, 288: side wall, 289: transistor, 290: peripheral circuit, 291: photodiode, 292: transistor, 293: transistor, 294: low-concentration n-type impurity region, 295: n-type semiconductor layer, 301: period, 302: period, 303: period. 311: period, 312: period, 313: period, 382: Ec, 386: Ec, 390: trap state, 410: transistor, 411: transistor, 420: transistor, 421: transistor, 430: transistor, 431: transistor, 440: transistor, 441: transistor, 450: transistor, 451: transistor, 600: lens, 602: filter. 604: wiring layer, 660: light. 800: solid-state imaging device, 810: solid-state imaging device, 820: solid-state imaging device, 821: transistor, 825: pixel, 829: transistor, 830: solid-state imaging device, 835: DSP block, 880: optical flow system, 901: housing. 902: housing, 903: display portion, 904: display portion, 905: microphone, 906: speaker, 907: operation key, 908: stylus, 909: camera, 911: housing, 912: display portion, 919: camera, 921: housing, 922: shutter button, 923: microphone, 925: lens, 927: light-emitting portion, 931: housing, 932: display portion, 933: wristband, 939: camera, 941: housing. 942: housing, 943: display portion, 944: operation key, 945: lens, 946: joint, 951: housing, 952: display portion, 954: speaker, 955: button, 956: input-output terminal, 957: microphone, 959: camera, 1100: imaging device, 1112: subpixel, 1800: shift register circuit, 1810: shift register circuit, 1900: buffer circuit, 1910: buffer circuit, 2100: analog switch circuit, 2110: vertical output line, 2200: output line, 108*c*: semiconductor layer, 112B: subpixel, 112G: subpixel, 112R: subpixel, 242*a*: semiconductor layer, 242*b*: semiconductor layer, 242*c*: semiconductor layer, 243*a*: electrode, 243*b*: electrode, 383*a*: Ec, 383*b*: Ec, 383*c*: Ec, 602B: filter, 602G: filter, 602R: filter This application is based on Japanese Patent Application serial no. 2014-082063 filed with Japan Patent Office on Apr. 11, 2014, Japanese Patent Application serial no. 2014-093786 filed with Japan Patent Office on Apr. 30, 2014, Japanese Patent Application serial no. 2014-101672 filed with Japan Patent Office on May 15, 2014, Japanese Patent Application serial no. 2014-181468 filed with Japan Patent Office on Sep. 5, 2014, Japanese Patent Application serial no. 2014-211511 filed with Japan Patent Office on Oct. 16, 2014, Japanese Patent Application serial no. 2015-010893 filed with Japan Patent Office on Jan. 23, 2015, the entire contents of which are hereby incorporated by reference.

The invention claimed is:
1. A method for driving a semiconductor device including a first circuit, a second circuit, and a sixth transistor, comprising first to fourth steps,
wherein the first circuit includes a first photoelectric conversion element, a first transistor, a second transistor, and a third transistor,
wherein the second circuit includes a second photoelectric conversion element, a fourth transistor, and a fifth transistor,
wherein the first photoelectric conversion element is electrically connected to one of a source and a drain of the first transistor,
wherein the other of the source and the drain of the first transistor is electrically connected to one of a source and a drain of the second transistor,
wherein the other of the source and the drain of the second transistor is electrically connected to a first node,
wherein a gate of the third transistor is electrically connected to the first node,
wherein the second photoelectric conversion element is electrically connected to one of a source and a drain of the fourth transistor,
wherein the other of the source and the drain of the fourth transistor is electrically connected to a second node,
wherein a gate of the fifth transistor is electrically connected to the second node,
wherein one of a source and a drain of the sixth transistor is electrically connected to the one of the source and the drain of the second transistor,
wherein the other of the source and the drain of the sixth transistor is electrically connected to the one of the source and the drain of the fourth transistor,
wherein in the first step, the first transistor and the fourth transistor are each in an off state,
wherein in the first step, the second transistor and the sixth transistor are each in an on state,
wherein in the first step, a first potential corresponding to the amount of light received by the second photoelectric conversion element is written into the first node,
wherein in the second step, the first transistor and the second transistor are each in an off state,
wherein in the second step, the fourth transistor and the sixth transistor are each in an on state, wherein in the second step, a second potential corresponding to the amount of light received by the second photoelectric conversion element is written into the second node, wherein in the third step, data corresponding to the first potential is read out through the third transistor, wherein in the fourth step, data corresponding to the second potential is read out through the fifth transistor, and wherein the third step and the fourth step are performed after the first step and the second step are completed.

2. The method for driving the semiconductor device according to claim 1, wherein the first transistor includes an oxide semiconductor.

3. The method for driving the semiconductor device according to claim 1, wherein the second transistor and the fourth transistor each include an oxide semiconductor.

4. The method for driving the semiconductor device according to claim 1, wherein the sixth transistor includes an oxide semiconductor.

5. The method for driving the semiconductor device according to claim 1, wherein the first to sixth transistors are each an n-channel transistor.

6. The method for driving the semiconductor device according to claim 1, wherein the first to sixth transistors are each a p-channel transistor.

7. The method for driving the semiconductor device according to claim 1, wherein the first photoelectric conversion element and the second photoelectric conversion element are each a pin junction.

8. A method for driving an electronic device including a lens, a display portion, and the semiconductor device, wherein the semiconductor device uses the method for driving the semiconductor device according to claim 1.

9. A semiconductor device comprising:
a first circuit;
a second circuit; and
a sixth transistor,
wherein the first circuit includes a first photoelectric conversion element, a first transistor, a second transistor, and a third transistor, wherein the second circuit includes a second photoelectric conversion element, a fourth transistor, and a fifth transistor, wherein the first photoelectric conversion element is electrically connected to one of a source and a drain of the first transistor, wherein the other of the source and the drain of the first transistor is electrically connected to one of a source and a drain of the second transistor, wherein the other of the source and the drain of the second transistor is electrically connected to a gate of the third transistor, wherein the second photoelectric conversion element is electrically connected to one of a source and a drain of the fourth transistor, wherein the other of the source and the drain of the fourth transistor is electrically connected to a gate of the fifth transistor, wherein one of a source and a drain of the sixth transistor is electrically connected to the one of the source and the drain of the second transistor, and wherein the other of the source and the drain of the fifth transistor is electrically connected to the one of the source and the drain of the fourth transistor.

10. The semiconductor device according to claim 9, wherein the first to fifth transistors each include an oxide semiconductor.

11. The semiconductor device according to claim 9, wherein the sixth transistor includes an oxide semiconductor.

12. The semiconductor device according to claim 9, wherein the first to sixth transistors are each an n-channel transistor.

13. The semiconductor device according to claim 9, wherein the first to sixth transistors are each a p-channel transistor.

14. The semiconductor device according to claim 9, wherein the first photoelectric conversion element and the second photoelectric conversion element are each a pin junction.

* * * * *